(12) United States Patent
Chaari et al.

(10) Patent No.: US 10,551,461 B2
(45) Date of Patent: Feb. 4, 2020

(54) METHOD FOR PERFORMING PARALLEL MAGNETIC RESONANCE IMAGING

(75) Inventors: Lotfi Chaari, Paris (FR); Sebastien Meriaux, Paris (FR); Philippe Ciuciu, Longpont sur Orge (FR); Jean-Christophe Pesquet, Bailly Romainvilliers (FR)

(73) Assignee: Commissariat a L'Energie Atomique et aux Energies Alternatives, Paris (FR)

( * ) Notice: Subject to any disclaimer, the term of this patent is extended or adjusted under 35 U.S.C. 154(b) by 1717 days.

(21) Appl. No.: 13/819,519

(22) PCT Filed: Aug. 29, 2011

(86) PCT No.: PCT/IB2011/002330
§ 371 (c)(1),
(2), (4) Date: Mar. 28, 2013

(87) PCT Pub. No.: WO2012/028955
PCT Pub. Date: Mar. 8, 2012

(65) Prior Publication Data
US 2013/0181711 A1 Jul. 18, 2013

Related U.S. Application Data

(60) Provisional application No. 61/379,105, filed on Sep. 1, 2010.

(30) Foreign Application Priority Data

Dec. 15, 2010 (EP) .................................... 10290657

(51) Int. Cl.
*G01R 33/561* (2006.01)
*G01R 33/563* (2006.01)

(52) U.S. Cl.
CPC ........ *G01R 33/561* (2013.01); *G01R 33/5611* (2013.01); *G01R 33/5616* (2013.01); *G01R 33/56308* (2013.01)

(58) Field of Classification Search
USPC .......................... 324/300–322; 600/407–435; 382/128–131
See application file for complete search history.

(56) References Cited

U.S. PATENT DOCUMENTS 6,771,067 B2 * 8/2004 Kellman ............ G01R 33/5611
324/307
7,423,430 B1 * 9/2008 Sharif .............. G01R 33/56325
324/309

(Continued)

OTHER PUBLICATIONS

International Search Report and Written Opinion for Application No. PCT/IB2011/002330 dated Mar. 22, 2012.
(Continued)

*Primary Examiner* — Melissa Koval
*Assistant Examiner* — Tiffany Fetzner
(74) *Attorney, Agent, or Firm* — Alston & Bird LLP

(57) ABSTRACT

A method of parallel magnetic resonance imaging of a body, comprising:—acquiring a set of elementary magnetic resonance images of said body from respective receiving antennas having known or estimated sensibility maps and noise covariance matrices, said elementary images being undersampled in k-space; and performing regularized reconstruction of a magnetic resonance image of said body; wherein said step of performing regularized reconstruction of a magnetic resonance image is unsupervised and carried out in a discrete frame space. A method of performing dynamical and parallel magnetic resonance imaging of a body, comprising:—acquiring a set of time series of elementary magnetic resonance images of said body from respective receiving antennas having known or estimated sensibility maps (Continued)

and noise covariance matrices, said elementary images being under-sampled in k-space; and performing regularized reconstruction of a time series of magnetic resonance images of said body.

27 Claims, 14 Drawing Sheets

(56) References Cited

U.S. PATENT DOCUMENTS

| | | | | |
|---|---|---|---|---|
| 8,384,383 | B2* | 2/2013 | Frahm | G01R 33/4824 324/307 |
| 8,781,197 | B2* | 7/2014 | Wang | G01R 33/54 382/131 |
| 8,823,374 | B2* | 9/2014 | Weller | G01R 33/5611 324/309 |
| 2002/0167315 | A1* | 11/2002 | Kellman | G01N 24/081 324/303 |
| 2008/0154115 | A1* | 6/2008 | Fuderer | G01R 33/5611 600/410 |
| 2009/0285463 | A1* | 11/2009 | Otazo | G06T 3/4053 382/131 |
| 2011/0044524 | A1* | 2/2011 | Wang | G01R 33/54 382/131 |
| 2011/0234222 | A1* | 9/2011 | Frahm | G01R 33/5611 324/309 |
| 2012/0081114 | A1* | 4/2012 | Weller | G01R 33/5611 324/309 |
| 2013/0181711 | A1* | 7/2013 | Chaari | G01R 33/5611 324/309 |
| 2015/0125061 | A1* | 5/2015 | Holt | G06T 5/50 382/132 |

OTHER PUBLICATIONS

Adluru, G. et al., *Temporally Constrained Reconstruction of Dynamic Cardiac Perfusion MRI*, Magnetic Resonance in Medicine, vol. 57, No. 6 (2007) 1027-1036.

Block, K. T. et al., *Undersampled Radial MRI With Multiple Coils. Iterative Image Reconstruction Using a Total Variation Constraint*, Magnetic Resonance in Medicine, vol. 57, No. 6 (2007) 1086-1098.

Bodmann, B. G. et al., *Upper and Lower Redundancy of Finite Frames*, IEEE, CISS (2010) 6 pages.

Chaari, L. et al., *A Wavelet-Based Regularized Reconstruction Algorithm for SENSE Parallel MRI With Applications to Neuroimaging*, Medical Image Analysis, vol. 15, No. 2 (2011) 185-201.

Chaari, L. et al., *An Iterative Method for Parallel MRI SENSE-Based Reconstruction in the Wavelet Domain*, Medical Image Analysis, (Sep. 2, 2009) 36 pages.

Chaari, L. et al., *Autocalibrated Regularized Parallel MRI Reconstruction in the Wavelet Domain*, IEEE, ISBI (2008) 756-759.

Chaux, C. et al., *A Variational Formulation for Frame-Based Inverse Problems*, Inverse Problems, vol. 23, No. 4 (2007) 1495-1518.

Chen, L. et al., *Reconstruction of Dynamic Contrast Enhanced Magnetic resonance Imaging of the Breast With Temporal Constraints*, Magnetic Resonance Imaging, vol. 28, No. 5 (2010) 637-645.

Combettes, P. L. et al., *A Proximal Decomposition Method for Solving Convex Variational Inverse Problems*, Inverse Problems, vol. 24, No. 6 (2008) 27 pages.

Fan, A. et al., *A Unified Variational Approach to Denoising and Bias Correction in MR*, Field Programmable Logic and Application, IPMI, LNCS, vol. 2732 (2003) 148-159.

Guerquin-Kern, M. et al., *Wavelet-Regularized Reconstruction for Rapid MRI*, IEEE, ISBI (2009) 193-196.

Hoge, W. S. et al., *A Tour of Accelerated Parallel MR Imaging from a Linear Systems Perspective*, Concepts in Magnetic Resonance Part A, vol. 27A, No. 1 (2005) 17-37.

Khalsa, K. A. et al., *Resolution Properties in Regularized Dynamic MRI Reconstruction*, IEEE, ISBI(2007) 456-459.

Lin, F. et al., *Parallel Imaging Reconstruction Using Automatic Regularization*, Magnetic Resonance in Medicine, vol. 51, No. 3 (2004) 559-567.

Liu, X. et al., *The Ill-posed Problem and Regularization in Parallel Magnetic Resonance Imaging*, IEEE, ICBBE (2009) 4 pages.

Lustig, M. et al., *SPIRiT: Iterative Self-Consistent Parallel Imaging Reconstruction From Arbitrary к-Space*, Magnetic Resonance Medicine, 64 (2010) 457-471.

Pei, S. et al., *An Introduction to Discrete Finite Frames*, Methods for Describing Vector behavior for Signal Representation, IEEE Signal Processing Magazine, vol. 14, No. 6 (Nov. 1997) 84-96.

Pruessmann, K. P. et al., *SENSE; Sensitivity Encoding for Fast MRI*, Magnetic Resonance in Medicine, vol. 42, No. 5 (1999) 952-962.

Raj, A. et al., *Bayesian Parallel Imaging With Edge-Preserving Priors*, Magnetic Resonance in Medicine, vol. 57, No. 1 (2007) 8-21.

Unser, M. et al., *The Pairing of a Wavelet Basis With a Mildly Redundant Analysis Via Subband Regression*, IEEE Transactions on Imaging Processing, vol. 17, No. 1 (Nov. 2008) 2040-2052.

Ying, L. et al., *On Tikhonov Regularization for Image Reconstruction in Parallel MRI*, Proceedings of the 26th Annual International Conference of the IEEE EMBS, vol. 3 (Sep. 2004) 1056-1059.

* cited by examiner

Anatomical slices using SENSE with Tikhonov regularization (reduction factor R=2)

Anatomical slices using SENSE with Tikhonov regularization (reduction factor R=4)

Anatomical slices using SENSE with TV regularization (reduction factor R=2 (left) and R=4 (right))

Anatomical slices using 2D- UWR-SENSE (reduction factor R=2)

Anatomical slices using 2D- UWR-SENSE (reduction factor R=4)

Anatomical slices using CWR-SENSE (reduction factor R=2)

Anatomical slices using CWR-SENSE (reduction factor R=4)

Anatomical slices using autocalibrated combined wavelet-total variation regularization, with image decomposition on a non-redundant orthonormal wavelet basis (reduction factor R=4)

Anatomical slices using autocalibrated combined wavelet-total variation regularization, with image decomposition on a redundant wavelet frame constituted by the union of two orthonormal bases (reduction factor R=4)

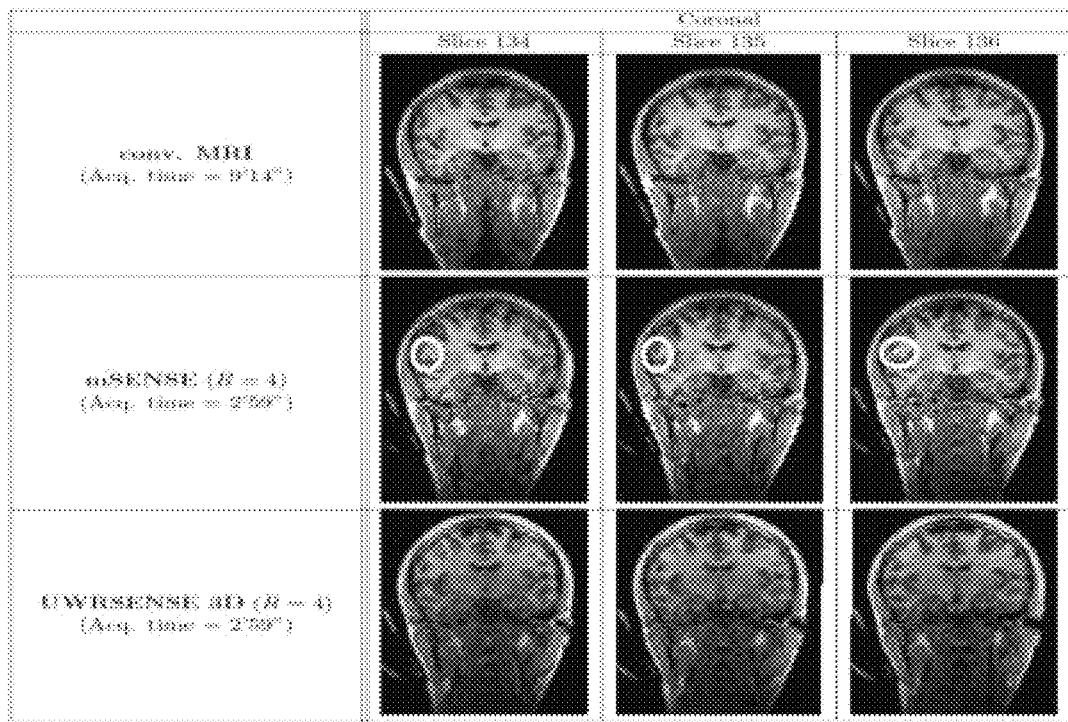

Fig. 12

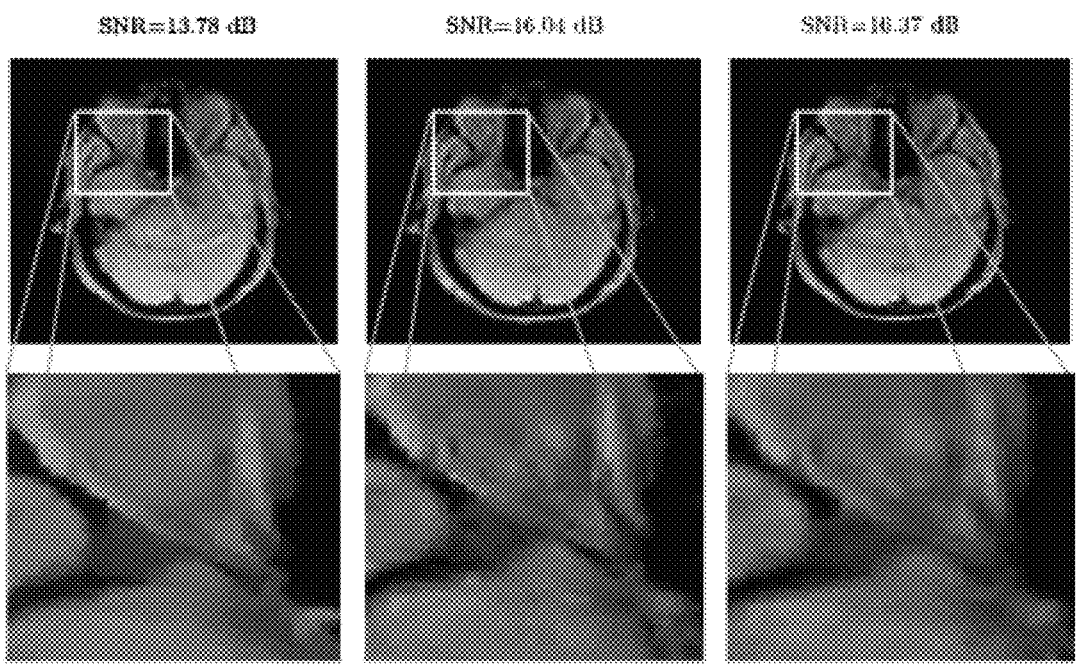

Anatomical slices (upper row) and magnified details (bottom row) using: TV regularization (left); combined wavelet-total variation regularization scheme using image decomposition on a non-redundant wavelet basis (center); and combined wavelet-total variation regularization scheme using image decomposition on a redundant wavelet frame constituted by the union of two orthonormal bases (right);

Fig. 13.

METHOD FOR PERFORMING PARALLEL MAGNETIC RESONANCE IMAGING

FIELD

The invention relates to a method for performing parallel magnetic resonance imaging (pMRI) of a body, including parallel, dynamical (time-resolved) magnetic resonance imaging, such as functional MRI (fMRI).

BACKGROUND

Reducing global acquisition time is of main interest in medical magnetic resonance imaging (MRI), and even more when dynamic imaging such as fMRI is concerned. Actually, a short acquisition time allows improving the spatial/temporal resolution of acquired fMRI data, which leads to a more efficient statistical analysis. In addition, by reducing the global imaging time, some additional artifacts caused by the patient motion can be avoided. For this reason, parallel imaging systems have been developed: multiple receiver surface coils with complementary sensitivity profiles located around the underlying object or body are employed to simultaneously collect in the frequency domain (i.e. the so-called k-space), data sampled at a rate R times lower than the Nyquist sampling rate along at least one spatial direction, i.e. the phase encoding one; R is usually called the "reduction factor". Therefore, the total acquisition time is R times shorter than with conventional non parallel imaging. A reconstruction step is then performed to build a full Field of View (FOV) image by unfolding the undersampled "elementary" images acquired by the individual receivers. This reconstruction is a challenging task because of the low Signal to Noise Ratio (SNR) in parallel MRI (pMRI) caused by aliasing artifacts related to the undersampling rate, those caused by noise during the acquisition process and also the presence of errors in the estimation of coil sensitivity maps.

The Simultaneous Acquisition of Spatial Harmonics (SMASH) [Sodickson et al., 1997] was the first reconstruction method, operating in the k-space domain. It uses a linear combination of pre-estimated coil sensitivity maps to generate the missing phase encoding steps.

Some other k-space based reconstruction techniques have also been proposed like GRAPPA (Generalized Autocalibrating Partially Parallel Acquisitions) [Griswold et al., 2002], and SENSE (Sensitivity Encoding) [Pruessmann et al., 1999]. SENSE is a two-step procedure relying first on a reconstruction of reduced FOV images and second on a spatial unfolding technique, which amounts to a weighted least squares estimation. This technique requires a precise estimation of coil sensitivity maps using a reference scan (usually a 2D Gradient-Echo (GRE)). It is presently the most frequently employed pMRI technique, applied in particular to brain and cardiac imaging.

For a general overview of reconstruction methods in pMRI see [Hoge et al., 2005].

SENSE is often supposed to achieve an exact reconstruction in the case of noiseless data and perfect coil sensitivity maps knowledge, which is also true for all above mentioned methods. However, in practice, the presence of noise in the data and inaccuracies in the estimation of coil sensitivity maps are unavoidable and make the reconstruction problem ill-conditioned.

As image reconstruction is an ill-posed inverse problem, regularization techniques are commonly applied to better estimate the full FOV image. Most of these techniques operate in the image domain; in particular, this is the case for Tikhonov regularization [Ying et al., 2004], which uses a quadratic penalty term either to promote smoothness constraints or to account for the squared difference between the reconstructed image and an a priori reference image. Despite the use of regularization, however, high reduction factors (exceeding a value of R=2) are generally considered unfeasible when low magnetic field intensities (up to 1.5 Tesla) are used, since the reconstructed images are affected by severe aliasing artifacts.

In [Chaâri et al. 2008] and [Chaâri et al. 2009] the present inventors have described a method of performing regularized image reconstruction in parallel MRI, using a wavelet-based regularization scheme, allowing to increase the reduction factor R.

The present invention aims at providing several improvements of said method, including extending it to dynamical imaging (e.g. fMRI) and making it fully or partially auto-calibrated (or "unsupervised").

SUMMARY

An object of the present invention is then a method of parallel magnetic resonance imaging of a body, comprising:
  acquiring a set of elementary magnetic resonance images of said body from respective receiving antennas having known or estimated sensibility maps and noise covariance matrices, said elementary images being undersampled in k-space; and
  performing regularized reconstruction of a magnetic resonance image of said body;
  wherein said step of performing regularized reconstruction of a magnetic resonance image is carried out in a discrete frame space by minimizing a cost function comprising:
    an error term, representative of a likelihood of a reconstructed image, given said acquired elementary images; and
    a frame penalty term, representative of a deviation between an actual statistical distribution of frame coefficients of said reconstructed image and an a priori distribution of said coefficients;
  said a priori distributions of the frame coefficients of the reconstructed image being estimated on the basis of an auxiliary magnetic resonance image of said body.
  According to different embodiments of said method:
  Said error term can be representative of a neg-log-likelihood of said reconstructed image, given said acquired elementary images.
  Said step of performing regularized reconstruction of a magnetic resonance image of said body can be carried out by maximizing, in said frame space, a full posterior distribution of a set of frame coefficients defining an image of the body, given said acquired elementary magnetic resonance images and said a priori distribution of the frame coefficients.
  Said auxiliary magnetic resonance image of said body can be reconstructed from said acquired elementary magnetic resonance images. More particularly, said auxiliary magnetic resonance image of said body can be reconstructed from said acquired elementary magnetic resonance images using a SENSitivity Encoding—SENSE—algorithm. Even more particularly, said auxiliary magnetic resonance image of said body can be reconstructed from said acquired elementary magnetic resonance images using an algorithm chosen between: an unregularized SENSE algorithm; a SENSE algorithm regularized in image space; and a SENSE algorithm regularized in k-space.

A generalized Gauss-Laplace a priori statistical distribution of said frame coefficients can assumed, and parameters of said distribution can be estimated on the basis of said auxiliary magnetic resonance image of said body, using a maximum-likelihood or a posterior mean estimator.

Said error term can be a quadratic mean error term.

Said acquired elementary images can be three-dimensional images, and said step of performing regularized reconstruction of a magnetic resonance image can be carried out in a discrete three-dimensional frame space. More particularly, said acquired three-dimensional elementary images can be obtained by stacking bi-dimensional elementary images of slices of the object to be imaged.

Said step of performing regularized reconstruction of a magnetic resonance image can be based on a redundant wavelet frame representation. Alternatively, said step of performing regularized reconstruction of a magnetic resonance can be based on a non-redundant wavelet representation.

Said cost function can also comprise at least one spatial domain penalty term chosen between: a total variation norm of the reconstructed image; and a convex constraint.

Another object of the present invention is a method of performing dynamical and parallel magnetic resonance imaging of a body, comprising:
  acquiring a set of time series of elementary magnetic resonance images of said body from respective receiving antennas having known or estimated sensibility maps and noise covariance matrices, said elementary images being under-sampled in k-space; and
  performing regularized reconstruction of a time series of magnetic resonance images of said body;
  wherein said step of performing regularized reconstruction of a time series of elementary magnetic resonance images is carried out by minimizing a cost function comprising:
    an error term, representative of a likelihood of each reconstructed image, given corresponding acquired elementary images; and
    a temporal penalty term, representative of a pixel-by-pixel or voxel-by-voxel difference between consecutive image of the series.

According to different embodiments of said method:
Said temporal penalty term can be based on an edge-preserving function, more particularly a convex edge-preserving function and even more particularly on an $L_p$ norm with p. 1 and preferably $1 \leq p < 1.5$
Said temporal penalty term can be given by the sum of a first partial temporal penalty term and a second partial temporal penalty term, wherein: the first partial temporal penalty term is representative of pixel-by-pixel or voxel-by-voxel differences between each even-numbered image of the series and a preceding odd-numbered image; and the second partial temporal penalty term is representative of pixel-by-pixel or voxel-by-voxel differences between each odd-numbered image of the series and a preceding even-numbered image; said cost function being minimized by using proximity operators for said first and second partial temporal penalty terms.
Said step of performing regularized reconstruction of a magnetic resonance image can be carried out in a discrete frame space, and said cost function can also comprise a frame penalty term, representative of a deviation between statistical distributions of frame coefficients of each reconstructed image and an a priori distributions of said coefficients; said a priori distributions of the frame coefficients of the reconstructed images being estimated on the basis of an auxiliary magnetic resonance image of said body. In this case, said elementary images can be three-dimensional images, and said discrete frame space can be a discrete three-dimensional frame space.

The method can further comprise a step of automatically determining, using a maximum-likelihood estimator; a weighting parameter of said temporal penalty term. More precisely, the method can comprise estimating said weighting parameter of the temporal penalty term for each pixel or voxel, or set of neighboring pixels or voxels, of the image to be reconstructed. Moreover, said temporal penalty term can be based on an $L_p$ norm and said weighting parameter of the temporal penalty term and the parameter p can be jointly determined using said maximum-likelihood estimator. In particular, said weighting parameter of the temporal penalty term and the parameter p can be jointly determined using said maximum-likelihood estimator under the constraint $p \geq 1$.

Said error term can depend on geometrical parameters defining a rigid transformation of each of said elementary magnetic resonance images with respect to an elementary magnetic resonance image taken as a reference, and wherein said step of performing regularized reconstruction of a time series of elementary magnetic resonance images is carried out by minimizing said function also with respect to said geometrical parameters.

Said elementary images can be acquired by echoplanar imaging.

Said elementary images can be under-sampled with a reduction factor higher or equal to 4.

BRIEF DESCRIPTION OF THE DRAWINGS

Additional features and advantages of the present invention will become apparent from the subsequent description, taken in conjunction with the accompanying drawings, which show:

FIG. 12, three anatomical sagittal slices of the same human brain obtained using: conventional non-parellel MRI (top row), mSENSE parallel MRI reconstruction with R=4 (middle row) and an autocalibrated 3D wavelet transform-based regularization scheme (3D-UWR-SENSE) according to another embodiment of the invention (bottom row);

FIG. 13, three anatomical axial slices of the same human brain (upper row) and magnified details thereof (bottom row) obtained using: TV regularization (left); combined wavelet-total variation regularization scheme according to an embodiment of the invention using image decomposition on a non-redundant wavelet basis (center) and combined wavelet-total variation regularization scheme according to an embodiment of the invention using image decomposition on a redundant wavelet frame constituted by the union of two orthonormal bases (right);

DETAILED DESCRIPTION

Figure 1:
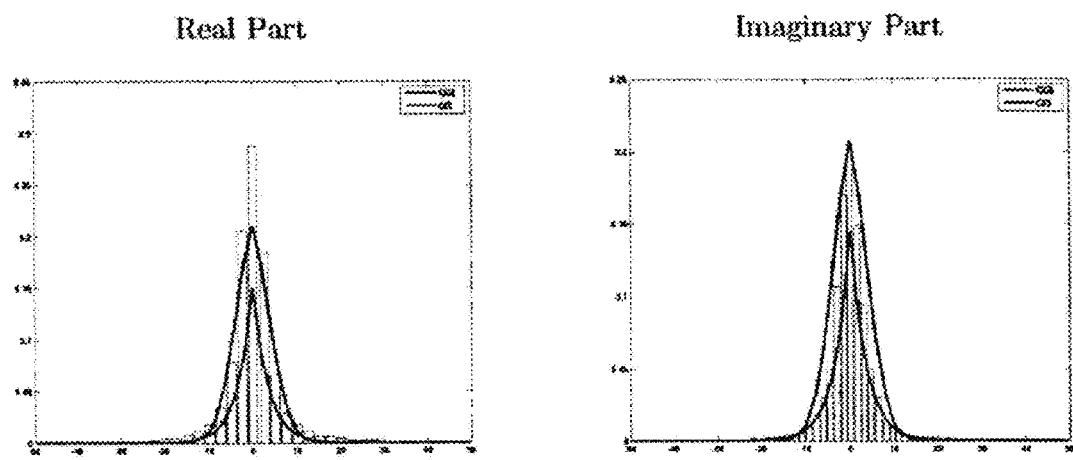
FIG. 1, empirical histograms of real and imaginary parts of wavelet coefficients of a magnetic resonance image of a human brain.

Before describing the invention in detail it will be necessary to recall some basic facts about pMRI (and, in particular, SENSE).

MRI is an imaging technique that can proceed either in 2D (two-dimensional) or directly in 3D (three-dimensional) depending on the involved RF pulse design. In the 2D case, a volume is covered using adjacent slices. PMRI may adapt to both situations since this method makes the k-space scanning faster, whatever its definition (i.e. in 2 or 3D). For the sake of simplicity, we only present the 2D case in the following.

An array of C coils is employed to measure the spin density p into the object under investigation (e.g. a brain, in the head of a patient). Image acquisition is based on specific imaging sequences; in exemplary embodiments of the invention, anatomical MRI is based on the 3D MPRAGE sequence while functional MRI involves is performed using 2D echoplanar imaging (EPI). The following description will be focused on the 2D case; then, the signal $d_c$ received by each coil l ($1 \leq c \leq C$) is the Fourier transform of the desired 2D field p weighted by the coil sensitivity profile $s_c$, evaluated at some locations $k=(k_y, k_x)^T$ in the k-space (the apex $T$ means transposition). The received signal $\tilde{d}_c$ is therefore defined by the sampling scheme:

$$\tilde{d}_c(k_r) = \int \overline{\rho}(r) s_c(r) e^{-\imath 2\pi k_r^T r} dr + \tilde{n}_c(k_r) \qquad (1)$$

where $\tilde{n}_c$ is a realization of an Additive White Gaussian Noise (AWGN) and $r=(y, x)^T$ is the spatial position in the image domain. For the sake of simplicity, a Cartesian coordinate system is generally adopted. In its simplest form, SENSE imaging amounts to solving a one-dimensional inversion problem due to the separability of the Fourier transform. Let $\Delta y = Y/R$ be the sampling period where Y is the size of the field of view (FOV) along the phase encoding direction, let y be the position in the image domain along the same direction, x the position in the image domain along the frequency encoding direction and R≤L the reduction factor. A 2D inverse Fourier transform allows recovering the measured signal in the spatial domain. By accounting for the undersampling of the k-space by R, (1) can be re-expressed in the following matrix form:

$$d(r) = S(r)\overline{\rho}(r) + n(r) \qquad (2)$$

where:

$$S(r) \triangleq \begin{bmatrix} s_1(x, y) & \cdots & s_1(x, y + (R-1)\Delta y) \\ \vdots & \vdots & \vdots \\ s_C(x, y) & \cdots & s_C(x, y + (R-1)\Delta y) \end{bmatrix} \in \mathbb{C}^{C \times R} \qquad (3)$$

$$d(r) \triangleq \begin{bmatrix} d_1(x, y) \\ d_2(x, y) \\ \vdots \\ d_C(x, y) \end{bmatrix} \in \mathbb{C}^C.$$

$$\overline{\rho}(r) \triangleq \begin{bmatrix} \overline{\rho}(x, y) \\ \overline{\rho}(x, y + \Delta y) \\ \vdots \\ \overline{\rho}(x, y + (R-1)\Delta y) \end{bmatrix} \in \mathbb{C}^R$$

and $$n(r) \triangleq \begin{bmatrix} n_1(x, y) \\ n_2(x, y) \\ \vdots \\ n_C(x, y) \end{bmatrix} \in \mathbb{C}^C..$$

In equation (2), $(n(r))_r$ is a sequence of circular zero-mean Gaussian complex-valued random vectors. These noise vectors are i.i.d. (independent, identically distributed) and spatially independent with covariance matrix $\Psi$ of size C×C. In practice, $\Psi$ is estimated by acquiring data from all coils without radio frequency pulses, and its generic entry $\Psi(c_1, c_2)$ corresponding to the covariance between the two coils $c_1$ and $c_2$ is given by:

$$\Psi(c_1, c_2) = \frac{1}{Y \times X} \sum_{(y,x)} d_{c_1}(y, x) d_{c_2}^*(y, x), \quad (4)$$

$$\forall (c_1, c_2) \in \{1, \ldots, C\}^2.$$

where $(\square)^*$ stands for the complex conjugate. Note that a statistical model can be assumed for matrix such as the statistical independence between coils or a nearest-neighbors statistical dependence model. In the first case, matrix $\Psi$ becomes diagonal and the coil-dependent variances $\sigma_{n_c}^2$ can be estimated using the Mean Absolute Deviation (MAD) technique described by [Donoho, 1995], which relies on an additive Gaussian white noise (AGWN) assumption. In the simplest case, $\Psi$ can be simply be taken equal to the identity matrix. In the presence of non-zero off-diagonal terms, the empirical covariance given in Eq (4) is used to estimate them.

Therefore, the reconstruction step consists in inverting (2) and recovering from $d(r)$ at spatial positions $r=(y, x)^T$. Note that the data $(d_c)_{1 \leq c \leq C}$ and the unknown image are complex-valued, although ∥ is only considered for visualization purposes.

A simple reconstruction method also called the SENSE approach [Pruessmann et al., 1999], is based on the minimization of the Weighted Least Squares (WLS) criterion.

The objective is to find a vector at each spatial location r such that:

$$\hat{\rho}_{WLS}(r) = \arg\min_{\rho(r)} \mathcal{J}_{WLS}(\rho(r)) \quad (5)$$

where $\mathcal{J} WLS(\rho(r)) = \|d(r) - S(r)\rho(r)\|_{\Psi^{-1}}^2$, $(\cdot)^H$ stands for the transposed complex conjugate, $(\cdot)^\#$ stands for the pseudo-inverse and defines a norm on.

As discussed above, this inverse problem is generally ill-posed and requires regularization, e.g. Tikhonov regularization. The regularization process typically consists in computing $\hat{\rho}_{PWLS}(r)$ as the minimizer of the following Penalized Weighted Least Squares (PWLS) criterion:

$$\mathcal{J}_{PWLS}(\rho(r)) = \mathcal{J}_{WLS}(\rho(r)) + \kappa \|\rho(r) - \rho_r(r)\|_{I_n}^2 \quad (6)$$

where $I_R$ is the R-dimensional identity matrix. The regularization parameter $\kappa > 0$ ensures a balance between the closeness to the data and the penalty term, which controls the deviation from a given reference vector $\rho_r(r)$. The solution $\hat{\rho}_{PWLS}(r)$ admits the following closed-form expression:

$$\hat{\rho}_{PWLS}(r) = \rho_r(r) + (S^H(r)\Psi^{-1}S(r) + \kappa I_R)^{-1} S^H(r)\Psi^{-1}(d(r) - S(r)\rho_r(r)) \quad (7).$$

Note that the accuracy of the solution depends on the reference vector and the choice of the regularization parameter κ.

Tikhonov regularization is known to introduce blurring in the image.

To overcome this limitation, "edge-preserving" penalty terms have been proposed, which are applied in the image domain and make the regularization more efficient by limiting blurring effects and preserving the image boundaries. However, the introduction of these terms may lead to a non-differentiable optimization problem which is not always easy to solve numerically.

As mentioned above, in [Chaâri et al. 2008] and [Chaâri et al. 2009] the present inventors have proposed a new regularization scheme; based on wavelet transforms (WT); which will be summarized here.

Indeed, in SENSE-based reconstructed images, well spatially-localized artifacts appear as distorted curves with either very high or very low intensity, and the WT has been recognized as a powerful tool that enables a good space and frequency localization of useful information.

A general introduction to wavelets and wavelet transforms is provided by [Pesquet-Popescu, Pesquet].

In what follows, T stands for the WT operator. It corresponds to a discrete decomposition onto a separable 2D M-band wavelet basis performed over $j_{max}$ resolution levels. The objective image $\bar{\rho}$ of size Y×X can be viewed as an element of the Euclidean space $\mathbb{C}^K$ with K=Y×X endowed with the standard inner product $\langle \cdot | \cdot \rangle$ and norm $\|\cdot\|$. Let $(e_k)_{1 \leq k \leq K}$ be the considered discrete wavelet basis of the space $\mathbb{C}^K$. The wavelet decomposition operator T is defined as the linear operator:

$$T: \mathbb{C}^K \to \mathbb{C}^K$$

$$\rho \mapsto (\langle \rho | e_k \rangle)_{1 \leq k \leq K}$$

The adjoint operator T* serving for reconstruction purposes is then defined as the bijective linear operator:

$$T^*: \mathbb{C}^K \to \mathbb{C}^K$$

$$(\zeta_k)_{1 \leq k \leq K} \mapsto \sum_{k=1}^{K} \zeta_k e_k.$$

The resulting wavelet coefficient field of a target image function ρ is defined by $\zeta = ((\zeta_{a,k})_{1 \leq k \leq K_{jmax}}, (\zeta_{o,j,k})_{1 \leq j \leq jmax, 1 \leq k \leq K_j})$ where $K_j = KM^{-2j}$ is the number of wavelet coefficients in a given subband at resolution j (by assuming that Y and X are multiple of $M^{jmax}$) and the coefficients have been reindexed in such a way that $\zeta_{a,k}$ denotes an approximation coefficient at resolution level $j_{max}$ and $\zeta_{o,j,k}$ denotes a detail coefficient at resolution level j and orientation $o \in \mathbb{O} = \{0, \ldots, M-1\}^2 \setminus \{(0,0)\}$.

In the dyadic case (M=2), there are three orientations corresponding to the horizontal, vertical or diagonal directions. When an orthonormal wavelet basis is considered, the adjoint operator T* reduces to the inverse WT operator $T^{-1}$ and the operator norm $\|T\|$ of T is equal to 1.

An estimate of the target image $\bar{\rho}$ is generated through the reconstruction wavelet operator T*. Let $\bar{\zeta}$ be the unknown wavelet coefficients such that $\bar{\rho} = T^* \bar{\zeta}$. The aim is to build an estimate $\hat{\zeta}$ of the vector of coefficients $\bar{\zeta}$ from the observations d. This is based on a Bayesian approach relying on suitable priors on the wavelet coefficients.

Given the observation model in Eq. (2.) and the assumptions regarding the noise (i.i.d. circular Gaussian with zero-mean and between-coil correlation matrix $\Psi$), the likelihood function factorizes over pixels lying in the Y×X FOV:

$$p(d \mid T^*\zeta) = \prod_{r \in \{1,\ldots,Y/R\} \times \{1,\ldots,X\}} p(d(r) \mid \rho(r)) \propto \qquad (8)$$

$$\prod_{r \in \{1,\ldots,Y/R\} \times \{1,\ldots,X\}} \exp(\mathcal{J}_{WLS}(\rho(r)))$$

where $\rho = T^*\zeta$ and $$\mathcal{J}_L(\rho) = \sum_{r \in \{1,\ldots,Y\} \times \{1,\ldots,X\}} \mathcal{J}_{WLS}(\rho(r)) \qquad (9)$$

Let $f$ be the prior probability density function (pdf) of the image in the wavelet domain. It will be assumed here that the real and imaginary parts of the wavelet coefficients are independent. It will also be assumed that the real (resp. imaginary) parts of the wavelet coefficients are independent and identically distributed (i.i.d.) in each subband. Their statistical characteristics may however vary between two distinct subbands. Furthermore, by looking at the empirical distributions of the real and imaginary parts of the considered wavelet coefficients, the present inventors have noticed that their empirical histograms are well-fitted by a "Generalized Gauss-Laplace" (GGL) distribution, which presents a single mode and whose shape varies between the Gaussian and Laplacian densities. The corresponding pdf reads:

$$\forall \xi \in \mathbb{R}. f(\xi; \alpha \cdot \beta) = \sqrt{\frac{\beta}{2\pi}} \frac{e^{-\left(\alpha|\xi| + \frac{\beta}{2}\xi^2 + \frac{\alpha^2}{2\beta}\right)}}{\mathrm{erfc}\left(\frac{\alpha}{\sqrt{2\beta}}\right)} \qquad (10)$$

where $\alpha \in \mathbb{R}_+$ and $\beta \in \mathbb{R}^*_+$ are hyper-parameters to be estimated. FIG. 1 illustrates the empirical histograms of real and imaginary parts of the horizontal detail subband at the first resolution level using the dyadic (M=2) wavelet decomposition with Daubechies filters of length 8. This figure shows also that the adopted GGL distribution better fits the empirical histogram than a Generalized Gaussian (GG) pdf.

At the coarsest resolution level $j_{max}$, the distributions of both the real and imaginary parts of the approximation coefficients can be modeled by a Gaussian distribution since they belong to a low frequency subband.

Due to its familiarity and simplicity, the MAP (Maximum A Posteriori) estimator will be used for the estimation purpose, although different choices are possible. Based on the prior and the likelihood given hereabove, the MAP estimator is computed by maximizing the full posterior distribution or minimizing its negative log-likelihood:

$$\hat{\zeta}^{MAP} = \arg\max_{\zeta \in \mathbb{C}^K} \left( \ln p(d \mid T^*\zeta) + \ln f(\zeta) \right) \qquad (11)$$

or equivalently by minimizing the following criterion:

$$\hat{\zeta}^{MAP} = \arg\min_{\zeta \in \mathbb{C}^K} \mathcal{J}_{WT}(\zeta) \qquad (12)$$

$$= \arg\min_{\zeta \in \mathbb{C}^K} \left( \mathcal{J}_L(T^*\zeta) + \mathcal{J}_P(\zeta) \right)$$

with:

$$\mathcal{J}_P(\zeta) = \sum_{k=1}^{K_{j_{max}}} \Phi_a(\zeta_{a,k}) + \sum_{o \in O} \sum_{j=1}^{j_{max}} \sum_{k=1}^{K_j} \Phi_{o,j}(\zeta_{o,j,k}) \qquad (13)$$

$$\Phi_a(\zeta_{a,k}) = \frac{(\mathrm{Re}(\zeta_{a,k}) - \mu^{Re})^2}{\left(\sqrt{2}\,\sigma^{Re}\right)^2} + \frac{(\mathrm{Im}(\zeta_{a,k}) - \mu^{Im})^2}{\left(\sqrt{2}\,\sigma^{Im}\right)^2},$$

$$\Phi_{o,j}(\zeta_{o,j,k}) = \alpha^{Re}_{o,j} |\mathrm{Re}(\zeta_{o,j,k})| +$$

$$\frac{\beta^{Re}_{o,j}}{2} |\mathrm{Re}(\zeta_{o,j,k})|^2 + \alpha^{Im}_{o,j} |\mathrm{Im}(\zeta_{o,j,k})| + \frac{\beta^{Im}_{o,j}}{2} |\mathrm{Im}(\zeta_{o,j,k})|^2 ..$$

Hereabove, $\mathrm{Re}(\cdot)$ and $\mathrm{Im}(\cdot)$ (or $\cdot^{Re}$ and $\cdot^{Im}$) stand for the real and imaginary parts, respectively. The prior parameters (hyperparameters) $\alpha_{o,j} = (\alpha_{o,j}^{Re}, \alpha_{o,j}^{Im}) \in (\mathbb{R}^*_+)^2$, $\beta_{o,j} = (\beta_{o,j}^{Re}, \beta_{o,j}^{Im}) \in (\mathbb{R}^*_+)^2$, $\mu_{o,j}(\mu_{o,j}^{Re}, \mu_{o,j}^{Im}) \in (\mathbb{R})^2$ and $\sigma_{o,j} = (\sigma_{o,j}^{Re}, \sigma_{o,j}^{Im}) \in (\mathbb{R}_+)^2$ are unknown and need to be estimated. The estimation of hyperparameters is an important part of the invention and it will be discussed extensively later.

While $J_L$ is differentiable with a Lipschitz-continuous gradient, $J_P$ is not differentiable. Therefore, although the penalty function $J_{WT}$ is convex, the optimization procedure cannot rely on conventional convex optimization techniques like the pseudo-conjugate gradient.

Optimization can be performed using a generalized form of the iterative optimization procedure developed in [Daubechies et al., 2004; Chaux et al., 2007], which is based on the Forward-Backward (FB) algorithm and on the concept of proximity operator, generalized to the case of functions of a complex variable.

For the function $$\bar{\phi}: \mathbb{C}^K \to ]-\infty, +\infty] x \mapsto \phi^{Re}(\mathrm{Re}(x)) + \phi^{Im}(x)) \qquad (14)$$

where $\phi^{Re}$ and $\phi^{Im}$ are functions in $\Gamma_0(\mathbb{R}^K)$ and $\mathrm{Re}(x)$ (resp. $\mathrm{Im}(x)$) is the vector of the real parts (resp. imaginary parts) of the components of $x \in \mathbb{C}^K$ the proximity operator is defined as $$\mathrm{prox}_{\bar{\phi}}: \mathbb{C}^K \to \mathbb{C}^K x \mapsto \mathrm{prox}_{\phi^{Re}}(\mathrm{Re}(x)) + \iota \mathrm{prox}_{\phi^{Im}}(\mathrm{Im}(x)).$$

By extending the algorithm in [Chaux et al., 2007] to the complex case, a minimizer of $J_{WT}$ can be iteratively computed according to the algorithm below (Algorithm 1), where the gradient of $J_L$ is first calculated, and then the frame coefficients are updated. It can be noticed that $\lambda_n$ and $\gamma_n$ correspond to relaxation and step-size parameters, respectively.

---

Algorithm 1:

---

Let $(\gamma_n)_{n>0}$ and $(\lambda_n)_{n>0}$ sequences of positive reals.
  1: Set $n = 0$ and $\varepsilon \geq 0$. Initialize $\zeta^{(n)}$ and set $\mathcal{J}^{(n)} = \mathcal{J}_{WT}(\zeta^{(n)})$.
  2: repeat -continued Algorithm 1:

3: Reconstruct the image by setting $\rho^{(n)} = T * \zeta^{(n)}$.
4: Compute the image $u^{(n)}$ such that:
   $\forall r \in \{1, \ldots, Y/R\} \times \{1, \ldots, X\}$,
   $u^{(n)}(r) = 2S^H(r)\Psi^{-1}(S(r)\rho^{(n)}(r) - d(r))$,
   where the vector $\overline{u}^{(n)}(r)$ is defined from $u^{(n)}$ in the same way as $\overline{\rho}(r)$ is defined from $\overline{\rho}$ (see Eq. (2.17)).
5: Determine the wavelet coefficients $v^{(n)} = Tu^{(n)} = (v_\alpha, (v_{o,j})_{o \in \mathbb{O}, 1 \leq j \leq j_{max}})$ of $u^{(n)}$.
6: Update the approximation coefficients of $\rho^{(n+1)}$:
   $\forall k \in \{1, \ldots, K_{j_{max}}\}, \zeta_{\alpha,k}^{(n+1)} = \zeta_{\alpha,k}^{(n)} + \lambda_n(\text{prox}_{\gamma_n \phi_\alpha}(\zeta_{\alpha,k}^{(n)} - \gamma_n v_{\alpha,k}^{(n)}) - \zeta_{\alpha,k}^{(n)})$.
7: Update the detail coefficients of the reconstructed image $\rho^{(n+1)}$:
   $\forall o \in \mathbb{O}, \forall j \in \{1, \ldots, j_{max}\}, \forall k \in \{1, \ldots, K_j\}$,
   $\zeta_{o,j,k}^{(n+1)} = \zeta_{o,j,k}^{(n)} + \lambda_n(\text{prox}_{\gamma_n \phi_{o,j}}(\zeta_{o,j,k}^{(n)} - \gamma_n v_{o,j,k}^{(n)}) - \zeta_{o,j,k}^{(n)})$.
8: Compute $\mathcal{J}^{(n+1)} = \mathcal{J}_{WT}(\zeta^{(n+1)})$.
9: $n \leftarrow n + 1$
10: until $|\mathcal{J}^{(n)} - \mathcal{J}^{(n-1)}| \leq \varepsilon \mathcal{J}^{(n-1)}$
11: return $\rho^{(n)} = T * \zeta^{(n)}$ For every $r \subset \{1, \ldots, Y\} \times \{1, \ldots, X\}$, let $\theta_r \geq 0$ be the maximum eigenvalue of the Hermitian positive semi-definite matrix $S^H(r)\Psi^{-1}S(r)$ and let $\theta = \max_{r \in \{1, \ldots, Y\} \times \{1, \ldots, X\}} \theta_r > 0$. To guarantee the convergence of Algorithm 1, the step-size and relaxation parameters are subject to the following conditions:

(i) $\inf_{n>0} \gamma_n > 0$ and $\sup_{n>0} \gamma_n < \frac{1}{\theta \|T\|^2}$, (ii) $\inf_{n>0} \lambda_n > 0$ and $\sup_{n>0} \lambda_n \leq 1$.

As discussed in [Chaâri et al. 2009], the optimization problem (11), (12) can be modified to include additional (preferably convex) constraints, e.g. upper and lower bounds of the image intensity value.

The present inventors have found that using wavelet regularization, as discussed above, allows preserving the image details while smoothing reconstruction artifacts but may introduce some irregularity in homogeneous area of the image. On the other hand, other (non wavelet-based) regularization schemes are known to be adapted to regularize smooth regions, but at the expense of an oversmoothing of image details. This is particular the case of "Total Variation" TV regularization, described inter alia by [Raj et al., 2007] and [Block et al., 2007].

A first improvement of the method of [Chaâri et al. 2008] and [Chaâri et al. 2009], constituting an aspect of the present invention, consists in combining WT and TV in a joint regularization framework in order to take advantage of their different properties, allowing them to alleviate the drawbacks of each other. A joint Wavelet Transform-Total Variation (WTTV) regularization can reduce to the optimization of the following penalized criterion:

$$\hat{\rho}_{WT-TV} = T^* \arg\min_\zeta \mathcal{J}_{WT-TV}(\zeta) \qquad (15)$$
$$= T^* \arg\min_\zeta \mathcal{J}_L(T^*\zeta) + \kappa_1 \mathcal{J}_P(\zeta) + \kappa_2 \|T^*\zeta\|_{TV}$$

where $J_L$ and $J_P$ have bee, defined above, $\kappa_1 > 0$ and $\kappa_2 > 0$ are regularization parameters, and $T^*$ is the wavelet adjoint operator. The discrete total variation norm of an image $\rho \in \mathbb{C}^{Y \times X}$ is given by:

$$\|\rho\|_{TV} = \sum_{y=1}^{Y} \sum_{x=1}^{X} \sqrt{|(\nabla_1 \rho)(y, x)|^2 + |(\nabla_1 \rho^T)^T(y, x)|^2} \qquad (16)$$

where for every $\rho \in \mathbb{C}^{Y \times X}$, $\nabla_1$ is the horizontally smoothed gradient operator defined by $$\nabla_1(\rho) = \qquad (17)$$
$$\frac{1}{2}(\rho(y+1, x+1) - \rho(y, x+1) + \rho(y+1, x) - \rho(y, x))_{1 \leq y \leq Y, 1 \leq x \leq X}$$

For the sake of presentation, it has been assumed that the image $\rho$ is periodic or equivalently that the image boundaries are toroidal.

Minimizing the optimality criterion (15) is much more difficult than minimizing the space-only criteria given by (11)-(13), because more than two terms are involved, while the Forward-Backward (FB) algorithm discussed above only applies to the minimization of criteria comprising two terms. Iterative minimization of a non-differentiable convex function comprising more than two terms can be performed using the so-called Parallel ProXimal Algorithm (PPXA) [Combettes and Pesquet, 2008], which also requires calculating the proximity operator of each of three involved terms.

The difficulty stems from the calculation of the proximity operator of $\|\cdot\|_{TV} \circ T^*$. To circumvent this difficulty, the TV penalization in equation (15) can be split into four terms as [Combettes and Pesquet, 2008]. The TV penalty term therefore reads:

$$\forall \rho \in \mathbb{C}^{Y \times X}, \|\rho\|_{TV} = \sum_{i=0}^{3} tv_i(\rho)$$

where for every $(q, r) \in \{0, 1\}^2$, $$tv_{2q+r}(\rho) = \sum_{y=1}^{Y/2} \sum_{x=1}^{X/2} \sqrt{|(\nabla_1 \rho)(2y+q, 2x+r)|^2 + |(\nabla_1 \rho^T)^T(2y+q, 2x+r)|^2}$$

For every q and r in $\{0, 1\}$, let $\downarrow^{q,r}$ be the decimation operator defined by $$\downarrow_{q,r}: \mathbb{C}^{2Y \times 2X} \to \mathbb{C}^{Y \times X}, v = (v_{y,x})_{1 \le y \le 2Y, 1 \le x \le 2X} \mapsto (v_{2y+q, 2r+r})_{1 \le y \le 2Y, 1 \le x \le 2X}$$

and $U_{q+2r}$ be the following operator:

$$U_{q+2r}: \mathbb{C}^{Y \times X} \to \mathbb{C}^{Y \times X}$$

$$\rho \mapsto \downarrow_{q,r} \begin{bmatrix} \nabla_0 \rho & \nabla_1 \rho \\ (\nabla_1 \rho^T)^T & \nabla_2 \rho \end{bmatrix}$$

where for every $\rho \in \mathbb{C}^{Y \times X}$, the operators $\nabla_0$ and $\nabla_2$ are defined by $$\nabla_0(\rho) = \frac{1}{2}(\rho(y+1, x+1) + \rho(y, x+1) + \rho(y+1, x) + \rho(y, x))_{1 \le y \le Y, 1 \le x \le X}$$

and $$\nabla_2(\rho) = \frac{1}{2}(\rho(y+1, x+1) + \rho(y, x+1) - \rho(y+1, x) + \rho(y, x))_{1 \le y \le Y, 1 \le x \le X}$$

Let also h be the function defined on $\mathbb{C}^{Y \times X}$ by:

$$h(\rho) = \sum_{y=1}^{Y/2} \sum_{x=1}^{X/2} \sqrt{|(\nabla_1 \rho)(y, x + X/2)|^2 + |(\nabla_1 \rho^T)^T(y + Y/2, x)|^2}$$

It turns out from the equations above that $\forall i \in \{0, 1, 2, 3\}$, $tv_i = h \circ U_i$. Consequently, the optimization problem in equation (15) can be rewritten as:

$$\hat{\rho}_{WT-TV} = T^* \arg\min_{\zeta} \left[ \mathcal{J}_L(T^*\zeta) + \kappa_1 \mathcal{J}_P(\zeta) + \kappa_2 \sum_{i=0}^{3} tv_i(T^*\zeta) \right] \quad (18)$$

$$= T^* \arg\min_{\zeta} \left[ \mathcal{J}_L(T^*\zeta) + \kappa_1 \mathcal{J}_P(\zeta) + \kappa_2 \sum_{i=0}^{3} h(U_i(T^*\zeta)) \right]$$

The regularized WT-TV reconstruction approach is summarized in Algorithm 2 where the PPXA algorithm [Combettes and Pesquet, 2008] is used to minimize the optimality criterion in equation (18) which is made up of J=6 convex functions.

---

Algorithm 2

Set $\gamma \in ]0, +\infty[$, $n = 0$, $(\omega_i)_{1 \le i \le 6} \in [0,1]^6$ such that $\Sigma_{i=0}^6 \omega i = 1$, $(\zeta_i^{(n)})1 \le i \le 6 \in (\mathbb{C}^K)^6$ where $\zeta_i^{(n)} = ((\zeta_{\alpha}^{i,(n)}), (\zeta_{o,j}^{i,(n)}))o \in \mathbb{O}, 1 \le j \le j_{max})$ for every $i \in \{1, \ldots, 6\}$. Set also $\epsilon \ge 0_\chi$ initialize $\zeta^{(n)} = \Sigma_{i=1}^6 \omega_i \zeta_i^{(n)}$ and $\mathcal{J}^{(n)} = 0$.
1: repeat
2: Compute the image $u^{(n)}$ such that:
$\forall r \in \{1, \ldots, Y/R\} \times \{1, \ldots, X\}$, $$u^{(n)}(r) = \left(I_R + \frac{2\gamma}{\omega_1} S^H(r) \Psi^{-1} S(r)\right)^{-1} \left(\rho_1^{(n)}(r) + \frac{2\gamma}{\omega_1} S^H(r) \Psi^{-1} d(r)\right) \text{ where } \rho_1^{(n)} = T^* \zeta_1^{(n)}.$$

3: Compute the wavelet coefficients $p_1^{(n)} = Tu^{(n)}$ of $u^{(n)}$.
4: Calculate $p_2^{(n)} = \{prox_{\gamma K1 \Phi_{\alpha/\omega 2}}(\zeta_\alpha^{2,(n)}), (prox_{\gamma \Phi_{o,j/\omega 2}}(\zeta_{o,j}^{2,(n)}))_{o \in \mathbb{O}, 1 \le j \le j_{max}}\}$.
5: For every $i \in \{0,1,2,3\}$, calculate $p_{i+3}^{(n)} = prox_{\gamma K2 tv_{i/\omega_i}}(\zeta_{i+3}^{(n)})$.
6: Set $P^{(n)} = \Sigma_{i=1}^6 \omega_i P_i^{(n)}$.
7: Set $\lambda_n \in [0,2]$.
8: for i = 1 to 6 do
9: $\zeta_i^{(n)} = \zeta_i^{(n)} + \lambda_n(2P^{(n)} - \zeta^{(n)} - P_i^{(n)})$.
10: end for
11: $\zeta^{(n+1)} = \zeta^{(n)} + \lambda_n(P^{(n)} - \zeta^{(n)})$.
12: Compute $\mathcal{J}^{(n+1)} = \mathcal{J}_{WT-TV}(\zeta^{(n+1)})$.
13: $n \leftarrow n + 1$.
14: until $|\mathcal{J}^{(n)} - \mathcal{J}^{(n-1)}| \le \epsilon \mathcal{J}^{(n-1)}$
15: return $\rho^{(n)} = T * \zeta^{(n)}$

---

In the method of [Chaâri et al. 2008] and [Chaâri et al. 2009], three-dimensional (3D) imaging is performed by stacking regularized two-dimensional (2D) images. A further improvement of the method, constituting another aspect of the present invention, consists in performing direct, regularized 3D image reconstruction. In the 3D case, the image reconstruction problem can still be written:

$$d(r) = S(r)\bar{\rho}(r) + n(r) \quad (19)$$

like in equation (12); however, $r = (y, x, z)$ is now the three-dimensional spatial position, $z \in \{1, \ldots, Z\}$ being the position along the third direction (slice selection). Moreover, the penalty term $J_P$ will depend on the distribution of the wavelet coefficient of a 3D dyadic wavelet transform.

A further improvement of the method, constituting another aspect of the present invention, consists in performing four-dimension (4D), spatio-temporal regularization in dynamic MRI. This embodiment of the invention can be applied e.g. to fMRI of the brain, wherein the whole brain volume has to be acquired several times, yielding a 4D dataset. In conventional fMRI, the 3D images are supposed independent although they belong to the same fMRI session. However, in practice, the 3D temporal images are somehow dependent since they belong to the same fMRI session involving the same experimental paradigm. The BOLD (Blood Oxygen Level Dependent) time-series and the acquisition noise are in fact correlated in time in a brain fMRI session. For this reason, taking into account temporal dependencies between 3D images helps to increase the SNR through the acquired images, and therefore enhances the reliability of the statistical analysis in fMRI. However, since in dynamic MRI the imaged object geometry generally changes during the acquisition, joining the reconstruction process to the temporal regularization is very difficult.

To deal with a 4D reconstruction of a time series of $N_r$ three-dimensional images ($N_r$ is usually even), the observa tion model of equations (12) and (19) will be rewritten as follows:

$$d_t(r) = S(r)\rho_t(r) + n_t(r) \quad (20)$$

where $t \in \{1, \ldots, N_r\}$ is the acquisition time. Using a dyadic 3D wavelet operator T, the coefficients will be reindexed so that $\zeta^t = (\zeta_\alpha^t, (\zeta_{o,j}^t)_{o \in \mathbb{O}, 1 \leq j \leq j_{max}})$ with $o \in \mathbb{O} = \{0,1\}^3 \setminus \{(0,0,0)\}$.

Accounting for an additional temporal $l_p$ regularization term, reconstruction of the 4D "volume" (i.e. of the time series of 3D images or volumes) is performed through the minimization of the following optimality criterion:

$$\hat{\zeta} = \arg\min_\zeta \mathcal{J}_{ST}(\zeta) \quad (21)$$

$$= \arg\min_\zeta \sum_{t=1}^{N_r} \sum_{r \in \{1,\ldots,Y/R\} \times \{1,\ldots,X\} \times \{1,\ldots,Z\}} \|d_t(r) - S(r)(T^*\zeta^t)(r)\|_{\Psi^{-1}}^2 +$$

$$\sum_{t=1}^{N_r} \mathcal{J}_P(\zeta^t) + \kappa \sum_{t=2}^{N_r} \|T^*\zeta^t - T^*\zeta^{t-1}\|_p^p$$

where $\zeta = (\zeta^1, \zeta^2, \ldots, \zeta^{N_r})T$, $\kappa > 0$ is a regularization parameter and $J_P$ is defined as in (13).

In equation (21), $$\sum_{t=1}^{N_r} \sum_{r \in \{1,\ldots,Y/R\} \times \{1,\ldots,X\} \times \{1,\ldots,Z\}} \|d_t(r) - S(r)(T^*\zeta^t)(r)\|_{\Psi^{-1}}^2$$

is the "error term" representative of a likelihood of each reconstructed image, given corresponding acquired elementary images;

$$\sum_{t=2}^{N_r} \|T^*\zeta^t - T^*\zeta^{t-1}\|_p^p.$$

is a temporal penalty term, representative of a pixel-by-pixel or voxel-by-voxel difference between consecutive images of the series and $$\sum_{t=1}^{N_r} \mathcal{J}_P(\zeta^t)$$

is a wavelet penalty term used for spatial regularization. It will be understood that a different (e.g. non wavelet-based) spatial regularization term could also be used.

The adjoint wavelet operator T* is then applied to each component $\zeta^t$ of $\zeta$ to obtain the reconstructed 3D image $\rho^t$ at the acquisition time t by taking into account the time dependencies with the other acquired images.

It will be noted that the temporal penalty term is not based on wavelets, but is representative of a pixel-by-pixel or voxel-by-voxel difference between consecutive images of the series. More precisely, in equation (21) the temporal penalty term is based on an $L_p$ norm; the present inventors have found that p has to be greater or equal to one, and that it should preferably satisfy: $1 \leq p < 1.5$. Other form of the temporal penalty term could be used, in particular based on (preferably convex) edge-preserving functions of a pixel-by-pixel or voxel-by-voxel difference between consecutive images of the series.

Minimizing the optimality criterion (21) is much more difficult than minimizing the space-only criteria given by (11)-(13), because more than two terms are involved, while the Forward-Backward (FB) algorithm discussed above only applies to the minimization of criteria comprising two terms. Iterative minimization of a non-differentiable convex function comprising more than two terms can be performed using the already-cited Parallel ProXimal Algorithm (PPXA) [Combettes and Pesquet, 2008], which also requires calculating the proximity operator of each of three involved terms. This task is quite simple for the two first terms of equation (21) since they are separable with respect to the time variable t and the spatial position r. However, this is not the case for the time penalization term (third term in Eq. (21), which makes non-trivial the calculation of the corresponding proximity operator. It is then proposed to rewrite the optimality criteria in $J_{ST}$ by decomposing the time penalization into two terms which are separable with respect to the time variable t (a given acquisition time t is either involved in the first or in the second term), and for which the proximity operators are easy to calculate. More specifically, the temporal penalty term $J_T$ is expressed as the sum of a first partial temporal penalty term $J_T^1$ and a second partial temporal penalty term $J_T^2$, wherein: the first partial temporal penalty term is representative of pixel-by-pixel or voxel-by-voxel differences between each even-numbered image of the series and a preceding odd-numbered image; and the second partial temporal penalty term is representative of pixel-by-pixel or voxel-by-voxel differences between each odd-numbered image of the series and a preceding even-numbered image:

$$\mathcal{J}_{ST}(\zeta) = \quad (22)$$

$$\sum_{t=1}^{N_r} \sum_{r \in \{1,\ldots,Y/R\} \times \{1,\ldots,X\} \times \{1,\ldots,Z\}} \|d_t(r) - S(r)(T^*\zeta^t)(r)\|_{\Psi^{-1}}^2 +$$

$$\sum_{t=1}^{N_r} \mathcal{J}_P(\zeta^t) + \mathcal{J}_T^1(\zeta) + \mathcal{J}_T^2(\zeta)$$

$$\mathcal{J}_T^1(\zeta) = \kappa \sum_{t=1}^{N_r/2} \|T^*\zeta^{2t} - T^*\zeta^{2t-1}\|_p^p$$

$$\mathcal{J}_T^2(\zeta) = \kappa \sum_{t=1}^{N_r/2-1} \|T^*\zeta^{2t+1} - T^*\zeta^{2t}\|_p^p$$

Since $J_T^1$ and $J_T^2$ are separable with respect to the time variable t, the corresponding proximity operator can easily be calculated based on the proximity operator of each of the involved terms. Let us consider the following function $$\Psi: \mathbb{C}^K \times \mathbb{C}^K \to \mathbb{R} \quad (\zeta^t, \zeta^{t-1}) \mapsto \kappa \|T^*\zeta^t - T^*\zeta^{t-1}\|_p^p = \phi \circ H$$
$$((\zeta^t, \zeta^{t-1}))$$

where $\phi(\cdot) = \kappa \|T^* \cdot \|_p^p$ and H is a linear operator defined by
$$H: \mathbb{C}^K \times \mathbb{C}^K \to \mathbb{C}^K (a,b) \mapsto a-b.$$

Its associated adjoint operator H* is therefore given by
$$H^*: \mathbb{C}^K \to \mathbb{C}^K \times \mathbb{C}^K a \mapsto (a, -a).$$

The proximity operator of $\Phi$ is then given by:

$$prox_\Phi = prox_{\phi \circ H} = Id + \frac{1}{2}H^*(prox_{2\phi} - Id) \circ H \quad (23)$$

The resulting algorithm (Algorithm 3) for the minimization of the space-time optimality criterion $J_{ST}$ is given below.

---

Algorithm 3

Set $\gamma \in ]0, +\infty[$, $n = 0$, $(\omega_i)_{1 \leq i \leq 4} \in [0,1]^4$ such that $\Sigma_{i=0}^4 \omega_i = 1$, $(\zeta_i^{(n)})_{1 \leq i \leq 4} \in (\mathbb{C}^{K \times N_r})^4$ where $\zeta_i^{(n)} = (\zeta_i^{1,(n)}, \zeta_i^{2,(n)}, \ldots, \zeta_i^{N_r,(n)})$ and $\zeta_i^{t,(n)} = ((\zeta_{i,a}^{t,(n)}), ((\zeta_{i,oj}^{t,(n)}))_0 \in \mathbb{O} 1 \leq j \leq j_{max})$ for every $i \in \{1, \ldots, 4\}$ and $t \in \{1, \ldots, N_r\}$. Set also $\varepsilon \geq 0$ and initialize $\zeta^{(n)} = \Sigma_{i=1}^4 \omega_i \zeta_i^{(n)}$ and $\mathcal{J}^{(n)} = 0$.

1: repeat
2:   Set $p_4^{1,(n)} = \zeta_4^{1,(n)}$.
3:   for $t = 1$ to $N_r$ do
4:     Calculate the image $u_t^{(n)}$ such that: $\forall r \in \{1, \ldots, Y/R\} \times \{1, \ldots, X\} \times \{1, \ldots, Z\}$, $$u_t^{(n)}(r) = \left(I_R + \frac{2\gamma}{\omega_1} S^H(r)\Psi^{-1}S(r)\right)^{-1}\left(\rho_{t,1}^{(n)}(r) + \frac{2\gamma}{\omega_1} S^H(r)\Psi^{-1}d_t(r)\right) \text{ where } \rho_{t,1}^{(n)} = T^*\zeta_1^{t,(n)}.$$

5:     Compute the wavelet coefficients $p_1^{t,(n)} = Tu_t^{(n)}$.
6:     Compute $p_2^{t,(n)} = (\text{prox}_{\gamma\Phi_a/\omega_2}(\zeta_{2,a}^{t,(n)}),(\text{prox}_{\gamma\Phi_{oj}/\omega_2}(\zeta_{2,oj}^{t,(n)})) \circ \in \mathbb{O}, 1 \leq j \leq j_{max}$.
7:     if $t$ is even then
8:       calculate $(p_3^{t,(n)}, p_3^{t-1,(n)}) = \text{prox}_{\gamma K\Phi/\omega_3}((\zeta^{t,(n)}, \zeta^{t-1,(n)}))$
9:     else if $t$ is odd and $t > 1$ then
10:       calculate $(p_4^{t,(n)}, p_4^{t-1,(n)}) = \text{prox}_{\gamma K\Phi/\omega_4}((\zeta^{t,(n)}, \zeta^{t-1,(n)}))$.
11:     end if
12:     if $t > 1$ then
13:       Set $P^{t-1,(n)} = \Sigma_{i=1}^4 \omega_i p_i^{t-1,(n)}$.
14:     end if
15:   end for
16:   Set $p_4^{N_r,(n)} = \zeta_4^{N_r,(n)}$.
17:   Set $P^{N_r,(n)} = \Sigma_{i=1}^4 \omega_i p_i^{N_r,(n)}$.
18:   Set $p_1^{(n)} = (p_1^{1,(n)}, p_1^{2,(n)}, \ldots, p_1^{N_r,(n)})$, $p_2^{(n)} = (p_2^{1,(n)}, p_2^{2,(n)}, \ldots, p_2^{N_r,(n)})$, $p_3^{(n)} = (p_3^{1,(n)}, p_3^{2,(n)}, \ldots, p_3^{N_r,(n)})$, $p_4^{(n)} = (p_4^{1,(n)}, p_4^{2,(n)}, \ldots, p_4^{N_r,(n)})$ and $P^{(n)} = (P^{1,(n)}, P^{2,(n)}, \ldots P^{N_r,(n)})$.
19:   Set $\lambda_n \in [0,2]$.
20:   for $i = 1$ to 4 do
21:     $\zeta_i^{(n)} = \zeta_i^{(n)} + \lambda_n(2P^{(n)} - \zeta^{(n)} - p_i^{(n)})$.
22:   end for
23:   $\zeta^{(n+1)} = \zeta^{(n)} + \lambda_n(P^{(n)} - \zeta^{(n)})$.
24:   Compute $\mathcal{J}^{(n+1)} = \mathcal{J}_{ST}(\zeta^{(n+1)})$.
25:   $n \leftarrow n + 1$.
26: until $|\mathcal{J}^{(n)} - \mathcal{J}^{(n-1)}| \leq \varepsilon \mathcal{J}^{(n-1)}$.
27: Set $\hat{\zeta} = \zeta^{(n)}$.

---

It will be understood that space-time regularization can also be applied to the case of a time series of bi-dimensional images, even if this is less common. Moreover, the spatial penalty term may also include a total variation component and/or constraints, as in the case of purely spatial 2D or 3D regularization.

It is worth noticing that in a 4D fMRI dataset, and since the imaged body volume is acquired many times, said body (i.e. a brain) may slightly move between successive scans. The inherent motion artifacts may be dramatic for the fMRI analysis. In this context, and since a standard fMRI study involves a motion correction step through applying a rigid transformation, another extension of the estimation method is proposed. This method accounts for the eventual motion artifacts by involving the rigid transformation parameters $S_r$ in the estimation step. The transformation is first applied to the standard SENSE data which will be used for the estimation step. An extension of the above described methods is also proposed performing the estimation step not on the standard SENSE reconstructed data, but on a quadratically regularized (QR) version of SENSE using Tikhonov regularization with a smoothing matrix (i.e. QR-SENSE). The QR-SENSE appears more efficient for improving the robustness of the estimation step than introducing an additional filtering step on the SENSE solution and remains computationally efficient since it admits a closed form expression. In order to further consider the motion artifacts occurring in fMRI, the proposed 4D reconstruction method (Algorithm 3) can also be extended to account for the rigid transformation parameters during the reconstruction process. The optimality criterion in equation (22) is therefore rewritten as follows:

$$\mathcal{J}_{ST}(\zeta) = \sum_{t=1}^{N_r} \sum_{r \in \{1,\ldots,Y/R\} \times \{1,\ldots,X\} \times \{1,\ldots,Z\}} \quad (22\text{bis})$$

$$|d_t(r + \delta r) - S(r - \delta r)(T^*\zeta^t)(r + \delta r)|_{\Psi^{-1}}^2 +$$

$$\sum_{t=1}^{N_r} \mathcal{J}_P(\zeta_c^t) + \mathcal{J}_T^1(\zeta_c) + \mathcal{J}_T^2(\zeta_c),$$

where $\zeta_c^t$ is derived from $\zeta^t$ after applying the motion correction transformation and assuming that $$\mathcal{J}_T^1(\zeta_c) = \sum_{t=1}^{N_r/2} \sum_{r \in \{1,\ldots,Y/R\} \times \{1,\ldots,X\} \times \{1,\ldots,Z\}} \kappa_r |(T^*\zeta_c^{2t})(r) - (T^*\zeta_c^{2t-1})(r)|^p$$

and $$\mathcal{J}_T^2(\zeta) = \sum_{t=1}^{N_r/2-1} \sum_{r \in \{1,\ldots,Y/R\} \times \{1,\ldots,X\} \times \{1,\ldots,Z\}} \kappa_r |(T^*\zeta_c^{2t+1})(r) - (T^*\zeta_c^{2t})(r)|^p$$

Since $\mathcal{J}_T^1$ (resp. $\mathcal{J}_T^2$) is separable with respect to the time variable t, its proximity operator can easily be calculated based on the proximity operator of each of the involved terms in the sums above.

The rigid transformation parameters δr can be found by minimizing $\mathcal{J}_{ST}(\zeta)$, expressed by equation (22 bis), also with respect to these parameters. Alternatively, said rigid transformation parameters can be estimated separately, on the basis of a conventional SENSE reconstruction.

All the regularization methods which have been described here (wavelet-based 2D spatial regularization, wavelet-based 3D spatial regularization, hybrid wavelet-based/total variation 2D and 3D spatial regularization, 3D and 4D space-time regularization) involve numerical parameters which have to be set, either manually or automatically using a suitable estimation algorithm. These parameters include the prior parameters, of the statistical distribution of the wavelet coefficients, or "hyperparameters": $\alpha_{o,j}=(\alpha_{o,j}^{Re}, \alpha_{o,j}^{Im})\in(\mathbb{R}^*_+)^2$, $\beta_{o,j}=(\beta_{o,j}^{Re}, \beta_{o,j}^{Im})\in(\mathbb{R}^*_+)^2$, $\mu_{o,j}=(\mu_{o,j}^{Re}, \mu_{o,j}^{Im})\in(\mathbb{R})^2$ and $\sigma_{o,j}=(\sigma_{o,j}^{Re}, \sigma_{o,j}^{Im})\in(\mathbb{R}_+)^2$. They can also include the temporal regularization parameter κ, the so-called "shape parameter", i.e. the value of "p" defining the $L_p$ norm $\|\cdot\|_p$ used in temporal regularization (see equation 21), and the parameters $\kappa_1$, $\kappa_2$ determining the relative weight of the wavelet and total variation penalty terms in hybrid regularization.

The already-cited documents [Chaâri et al. 2008] and [Chaâri et al. 2009] do not teach how to determine the relevant parameters. A further improvement of the method described by these documents, constituting another aspect of the present invention, consists in providing automatic calibration algorithms, allowing a fully or partly non-supervised wavelet-based regularization. Two different frameworks are considered to achieve this goal depending on the type of decomposition. In case of orthonormal wavelet decomposition, the hyperparameters can be accurately estimated using a maximum likelihood procedure (see below). In contrast, when resorting to redundant frame decomposition, a stochastic sampling procedure seems more efficient. In the latter case, the hyperparameters are estimated using the Minimum Mean Square Error (MMSE) or equivalently the posterior mean estimator (see below). The posterior mean estimator can also be used with an orthonormal wavelet decomposition, as this is a special case of frame.

First of all, the determination of the hyper-parameters defining the prior statistical distribution of the wavelet coefficients used for 2D or 3D spatial regularization will be considered.

A first possibility for determining the hyper-parameters $\Theta=(\mu, \sigma, (\alpha_{o,j}, \beta_{o,j})o\in\mathcal{O}, 1\leq j\leq j_{max})$ is to maximize the integrated likelihood according to the following equation:

$$\hat{\Theta} = \arg\max_{\Theta} p(d; \Theta) = \arg\max_{\Theta} \int p(d\,|\,T^*\zeta)f(\zeta;\Theta)d\zeta. \quad (24)$$

Maximizing Eq. (24) is a missing data problem since ζ is unknown. It requires integrating out the sought image decomposition ζ and iterating between image reconstruction and hyper-parameter estimation using the intensive EM algorithm described by [Dempster et al., 1977]. In order to alleviate the computational burden, it is advantageous to proceed differently by assuming that a reference or "auxiliary" full FOV image $\bar{\rho}$ is available, and so is its wavelet decomposition $\bar{\zeta}=(T^*)^{-1}\bar{\rho}$. In practice, the auxiliary image $\bar{\rho}$ can be obtained using 1D-SENSE reconstruction at the same R value, either unregularized or quadratically-regularized in a conventional way (e.g. using Tikhonov regularization) in the image space or in the k-space.

Then, the maximum likelihood (ML) estimation procedure consists of assuming that this auxiliary image is a realization of the full prior distribution and thus in fitting Θ directly on it:

$$\hat{\Theta} = \arg\max_{\Theta} f(\bar{\zeta}; \Theta)$$

In statistics, this solution is referred to as the complete data maximum likelihood as opposed to the above mentioned missing data maximum likelihood estimator. This procedure can be decomposed in two independent steps, the first one involving the setting of the Gaussian prior parameters (μ,σ) attached to the approximation coefficients $\bar{\zeta}_\alpha$ and the second one being related to the estimation of the GGL prior parameters $(\alpha_{o,j}, \beta_{o,j})o\in\mathcal{O}, 1\leq j\leq j_{max}$ from the corresponding detail coefficients $(\bar{\zeta}_{o,j})o\in\mathcal{O}, 1\leq j\leq j_{max}$.

On the one hand, ML estimators (μ, σ) are explicitly given by the empirical mean and standard deviation:

$$\hat{\mu}^{Re} = \frac{1}{K_{jmax}} \sum_{k=1}^{K_{jmax}} \text{Re}(\bar{\zeta}_{a,k}), \quad (25)$$

$$\hat{\sigma}^{Re} = \sqrt{\frac{1}{K_{jmax}} \sum_{k=1}^{K_{jmax}} (\text{Re}(\bar{\zeta}_{a,k}) - \hat{\mu}^{Re})^2}$$

$$\hat{\mu}^{Im} = \frac{1}{K_{jmax}} \sum_{k=1}^{K_{jmax}} \text{Im}(\bar{\zeta}_{a,k})$$

and $$\hat{\sigma}^{Im} = \sqrt{\frac{1}{K_{jmax}} \sum_{k=1}^{K_{jmax}} (\text{Re}(\bar{\zeta}_{a,k}) - \hat{\mu}^{Im})^2}.$$

For each resolution level j and orientation o, $\hat{\alpha}_{o,j}^{Re}$ and $\hat{\beta}_{o,j}^{Re}$ are estimated from $\bar{\zeta}_{o,j}$ as follows:

$$(\hat{\alpha}_{o,j}^{Re}, \hat{\beta}_{o,j}^{Re}) = \arg\max_{(\alpha,\beta)\in\mathbb{R}_+\times\mathbb{R}_+^*} f(\text{Re}(\bar{\zeta}_{o,j}); \alpha, \beta) \quad (26)$$

$$= \arg\max_{(\alpha,\beta)\in\mathbb{R}_+\times\mathbb{R}_+^*} \sum_{k=1}^{K_j} \log f(\text{Re}(\bar{\zeta}_{o,j,k}); \alpha, \beta)$$

$$= \arg\max_{(\alpha,\beta)\in\mathbb{R}_+\times\mathbb{R}_+^*} \left\{ \alpha \sum_{k=1}^{K_j} |\text{Re}(\bar{\zeta}_{o,j,k})| + \frac{\beta}{2}\sum_{k=1}^{K_j} \text{Re}(\bar{\zeta}_{o,j,k})^2 + \frac{K_j\alpha^2}{2\beta} - \frac{K_j}{2}\log\left(\frac{\beta}{2\pi}\right) + K_j\log\left(\text{erfc}\left(\frac{\alpha}{\sqrt{2\beta}}\right)\right)\right\}$$

The hyperparameters $\hat{\alpha}_{o,j}^{Im}$ and $\hat{\beta}_{o,j}^{Im}$ are estimated in the same way, by replacing Re(·) by Im(·) in equation (26).

This two-dimensional minimization problem does not admit a closed form solution. Hence, the ML parameters are computed using a numerical optimization method, such as direct search method (eg, Rosenbrock's method, see [Bertsekas, 1995, chap 1, p 159-165]). Alternative solutions based on Monte Carlo methods or the Stein principle can also be thought of, at the expense of an increased computational burden.

When temporal regularization is considered, two additional parameters have to be determined: the temporal regularization parameter κ and the shape parameter p (see equations 21 and 22).

Indeed, in a subject-level analysis, only data recorded for one subject is processed. For this reason, manually fixing the regularization parameter κ and the shape parameter p may be suitable regarding to the reasonable amount of data, even if this makes the proposed method not completely automatic and remains somehow user-dependent. When a group-level analysis is considered, the processed data becomes much larger, and since many subjects are considered, setting the temporal regularization parameter manually for all subjects at once is definitely sub-optimal due to the between-subject variability. This variability may be significant either from an anatomical or functional viewpoint. Manually setting this parameter for each subject apart would be possible, but cumbersome and it would make the proposed method more user-dependent regarding to the involved number of subjects in a group-level analysis (typically 15 subjects involved).

Even in a group-level analysis, the estimation is performed for each subject apart. Moreover, a parameter value is preferably estimated for each voxel of the 3D volume, which means that each voxel is processed independently of the others. Nonetheless, for the sake of computational efficiency, the same shape parameter p is considered for the whole volume. Otherwise stated, instead of determining a unique temporal regularization parameter, κ, a respective parameter $κ_r$ is determined for each voxel.

Again, a maximum likelihood estimation of said parameters is performed. Let $ρ^1(r) \ldots ρ^{Nr}(r)$ be the 3D images forming the 4D dataset, and let define $V_r$ as:

$$V_r = (ρ^2(r) - ρ^1(r), ρ^3(r) - ρ^2(r), \ldots, ρ^{2Nr}(r) - ρ^{Nr-1}(r))$$

Then, the joint estimation of the parameters p and $κ_r$ in the ML sense is performed by minimizing the following criterion:

$$L(p,κ) \propto -\log(κ_r) + κ_r \Sigma_{t=1}^{Nr-1} |V_r(t)|^p \qquad (27)$$

preferably under the constraint p≥1.

Obviously, a given voxel is supposed to more likely behave similarly to its neighbors, as well as for anatomical and functional perspective. An alternative method consists of estimating a parameter value per functional region of the brain (i.e. a group of neighboring voxels having similar functional roles). This estimation is based on an a priori classification step of the brain in order to identify the different functional areas. This extension makes the estimation process more robust since more samples are available at a given estimation step. Indeed, the temporal signals related to all the voxels belonging to the same functional region are gathered in the same vector. If we denote by S, the size of a functional region t, the Maximum Likelihood estimation will be made on a signal involving S, times more samples. The resulting estimation is therefore more robust to atypical observations (outliers), which may be occur in an fMRI session.

The image reconstruction method of [Chaâri et al. 2008] and [Chaâri et al. 2009] is based on the decomposition of the observed volume on a wavelet basis. A further improvement, constituting another aspect of the present invention, consists in generalizing said method to the case where decomposition is performed on a frame.

Frames generalize the concepts of wavelets, curvelets, bandlets, etc. A frame is a family of functions on which a signal (or image, which is simply a multi-dimensional signal) can be decomposed. In general, the resulting representation of the signal is redundant; a frame is called a basis when it is not redundant. Frames are generally used to help capturing more geometrical details of images under investigation. For this reason, using frames in pMRI reconstruction is helpful in order to track reconstruction artefacts'.

More precisely, let us consider real-valued digital signals of length L as elements of the Euclidean space $\mathbb{R}^L$ endowed with the usual scalar product and norm denoted as ⟨·|·⟩ and ||·||, respectively.

Let K be an integer greater than or equal to L. A family of vectors $(e_k)_{1 \leq k \leq K}$ in the finite-dimensional space $\mathbb{R}^K$ is a frame when there exists a constant μ in ]0, +∞[ such that $$\forall y \in \mathbb{R}^L, μ \|y\|^2 \leq \sum_{k=1}^{K} |\langle y | e_k \rangle|^2 \qquad (28)$$

If the inequality (28) becomes an equality, is called a $(e_k)_{1 \leq k \leq K}$ tight frame. The bounded linear frame analysis operator F and the adjoint synthesis frame operator F* are defined as $$F : \mathbb{R}^L \to \mathbb{R}^K : y \mapsto (\langle y | e_k \rangle)_{1 \leq k \leq K} \qquad (29)$$

$$F^* : \mathbb{R}^K \to \mathbb{R}^L : (\xi_k)_{1 \leq k \leq K} \mapsto \sum_{k=1}^{K} \xi_k e_k$$

Note that F is injective whereas F* is surjective. When $F^1 = F^*$, then $(e_k)_{1 \leq k \leq K}$ is an orthonormal basis. A simple example of a redundant frame is the union of orthonormal bases. In this case, the frame is tight with μ=M and thus F*F=MI, where I is the identity operator.

In the following, two frame estimation problems of increasing complexity will be addressed, the first one corresponding to a denoising formulation and the second one to an extension involving a degradation operator such as the sensitivity matrix S in parallel MRI reconstruction. The denoising problem is addressed first and its application to pMRI matches the situation in which a noisy reference image, denoted as y in what follows, (e.g. such as the SENSE reconstruction) is available to estimate the hyperparameters of the frame representation. The second problem will be discussed after presenting Algorithm 4 and would correspond to estimating the hyperparameters of the frame decomposition directly from the reduced FOV images in the pMRI context.

An observed signal y=F*x+n can be written according to its frame representation (FR) involving coefficients $x \in \mathbb{R}^K$ as follows:

$$y = F^*x + n \qquad (30)$$

where n is the error between the observed signal and its FR F*x. This error is modeled by imposing that belongs to the closed convex set $$C_δ = \{x \in \mathbb{R}^K | N(y - F^*x) \leq δ\}$$

where $δ \in [0, \infty[$ is some error bound and N can be any norm on $\mathbb{R}^L$.

In signal/image recovery problems, n is an additive noise that corrupts the measured data. The following developments will be focused on the case of a bounded observation error modeled by uniform noise. By adopting a probabilistic approach, y and x are assumed to be realizations of random vectors Y and X. In this context, the goal is to characterize the probability distribution of X|Y by considering some parametric probabilistic model and by estimating the associated hyperparameters. The estimation problem is much more difficult than in the case of the decomposition on a non-redundant basis, e.g. a wavelet basis, because F. is not bijective.

In a Bayesian framework, it is necessary to define prior distributions for the frame coefficients. For instance, this prior may be chosen so as to promote the sparsity of the representation. In the following f(x,θ), denotes the probability density function (pdf) of the frame coefficients that depends on an unknown hyperparameter vector θ and f(θ), is the a priori pdf for the hyperparameter vector θ. In compliance with the constraint $C_\delta$, n is assumed to be uniformly distributed on the ball $B_{0,\delta} = \{\alpha \in \mathbb{R}^L | N(\alpha) \leq \delta\}$, and $f(y|x)$ is the uniform pdf on the closed convex ball:

$$B_{F^*x,\delta} = \{y \in \mathbb{R}^L | N(y - F^*x) \leq \delta\}$$

The hyperparameter vector θ is also considered a realization of the random vector Θ, and the conditional pdf of (X,Θ) given Y can be written as:

$$f(x, \theta | y) \propto f(y|x) f(x|\theta) f(\theta) \tag{31}$$

For the sake of simplicity, it will be assumed that frame coefficients are a priori independent with marginal GG (Generalized Gaussian) distributions even if, as discussed above, a GGL distribution is better suited for applications to pMRI This leads to the following frame coefficient prior:

$$f(x_k | \alpha_k, \beta_k) = \frac{\beta_k}{2\alpha_k \Gamma\left(\frac{1}{\beta_k}\right)} \exp\left(-\frac{|x_k|^{\beta_k}}{\alpha_k^{\beta_k}}\right) \tag{32}$$

where $\alpha_k > 0$, $\beta_k > 0$ (with $k \in \{1, \ldots, K\}$) are the scale and shape parameters associated with $x_k$, which is the component of the frame coefficient vector and Γ(·) is the Gamma function.

By introducing it $\gamma_k = \alpha_k^{\beta_k}$, the frame prior can be rewritten as:

$$f(x_k | \gamma_k, \beta_k) = \frac{\beta_k}{2\gamma_k^{1/\beta_k} \Gamma\left(\frac{1}{\beta_k}\right)} \exp\left(-\frac{|x_k|^{\beta_k}}{\gamma_k}\right) \tag{33}$$

The distribution of a frame coefficient generally differs from one coefficient to another. However, some frame coefficients can have very similar distributions, which can be defined by the same hyperparameters. As a consequence, it is proposed to split the frame coefficients into G different groups. The $g^{th}$ group will be parameterized by a unique hyperparameter vector denoted as $\theta_g = (\beta_g, \gamma_g)$. In this case, the frame prior can be expressed as $$f(x|\theta) = \prod_{g=1}^{G} \left[\left(\frac{\beta_g}{2\gamma_g^{1/\beta_g} \Gamma\left(\frac{1}{\beta_g}\right)}\right)^{n_g} \exp\left(-\frac{1}{\gamma_g} \sum_{k \in S_g} |x_k|^{\beta_g}\right)\right] \tag{34}$$

where the summation covers the index set $S_g$ of the elements of the $g^{th}$ group containing $n_g$ elements and $\theta_g = (\theta_1 \ldots \theta_G)$. E.g., each group can correspond to a given wavelet subband. A coarser classification may be mad when using multiscale frame representations by considering that all the frame coefficients at a given resolution level belong to a same group.

The hierarchical Bayesian model for the frame decomposition is completed by the following improper hyperprior:

$$f(\theta) = \prod_{g=1}^{G} f(\theta_g) = \prod_{g=1}^{G} [f(\gamma_g) f(\beta_g)] \propto \prod_{g=1}^{G} \left[\frac{1}{\gamma_g} 1_\mathbb{R} + (\gamma_g) 1_{[0,3]}(\beta_g)\right] \tag{35}$$

where $1_A(\xi)$ is the function defined on $A \subset \mathbb{R}$ by $1_A(\xi) = 1$ if $\xi \in A$ and $1_A(\xi) = 0$ otherwise.

The motivations for using this kind of prior are the following
- the interval [0,3] covers all possible values of $\beta_g$ encountered in practical applications, and there is no additional information about the parameter.
- The prior for the parameter $\gamma_g$ is a Jeffrey's distribution that reflects the absence of knowledge about this parameter.

The resulting posterior distribution is therefore given by:

$$f(x, \theta | y) \propto 1_{C_\delta}(x) \prod_{g=1}^{G} \left[\left(\frac{\beta_g}{2\gamma_g^{1/\beta_g} \Gamma\left(\frac{1}{\beta_g}\right)}\right)^{n_g} \right. \tag{36}$$

$$\left. \exp\left(-\frac{1}{\gamma_g} \sum_{k \in S_g} |x_k|^{\beta_g}\right) \left(\frac{1}{\gamma_g} 1_{\mathbb{R}_+}(\gamma_g) 1_{[0,3]}(\beta_g)\right)\right]$$

The Bayesian estimators [e.g., the maximum a posteriori (MAP) or minimum mean square error (MMSE) estimators also known as the posterior mean estimator] associated with the posterior distribution (35) have no simple closed-form expression.

In what follows, a stochastic procedure is proposed to compute the MMSE estimator, which relies on hybrid Markov Chain Monte Carlo (MCMC) algorithms. The idea is to use a suitable algorithm to generate samples distributed according to the posterior distribution (35). After convergence, the generated samples are used to compute the MMSE estimates of the unknown model parameter and hyperparameter vectors x and θ, respectively. In the pMRI context, x is the sought frame representation of the reference image.

When the considered frame is the union of orthonormal M bases and N(·) is the Euclidean norm, the well-known Gibbs sampler (GS) can be used [Geman, 1984], which iteratively generates samples distributed according to conditional distributions associated with the target distribution. More precisely, the basic GS iteratively generates samples distributed according to f(x|θ,y) and f(θ|x, y) to simulate realizations of the full posterior. f(x, θ|y).

Straightforward calculations yield the following conditional distribution:

$$f(x | \theta, y) \propto 1_{C_\delta}(x) \prod_{g=1}^{G} \exp\left(-\frac{1}{\gamma_g} \sum_{k \in S_g} |x_k|^{\beta_g}\right) \tag{37}$$

This conditional distribution is a product of GG distributions truncated on C. Actually, sampling according to this truncated distribution is not always easy to perform since the adjoint frame operator F_is usually of large dimension. However, two alternative sampling strategies are detailed in what follows.

Naive sampling proceeds by sampling according to independent GG distributions $$\prod_{g=1}^{G} \exp\left(-\frac{1}{\gamma_g} \sum_{k \in S_g} |x_k|^{\beta_g}\right)$$

and then accepting the proposed candidate x only if $N(y-F^*x) \leq \delta$. This method can be used for any frame decomposition and any norm. However, it can be quite inefficient because of a very low acceptance ratio, especially when $\delta$ takes small values.

The Gibbs sampler is designed to sample more efficiently from the conditional distribution in Eq. (36) when the considered frame is the union of M orthonormal bases and $N(\cdot)$ is the Euclidean norm. In this case, the analysis frame operator and the corresponding adjoint can be written as $F=[F_1 \ldots F_M]^T$ and $F^*=[F^*_1 \ldots F^*_M]^T$ respectively, where $\forall m \in \{1, \ldots, M\}$, $F_m$ is the decomposition operator onto the $m^{th}$ orthonormal basis such as $F^*_m F_m = F_m F^*_m = \text{Id}$. In what follows, every $x \in \mathbb{R}^K$ with $K=ML$ is decomposed as $x=x_1^T, \ldots, x_M^T]^T$ where $x_m \in \mathbb{R}^L$ $\forall m \in \{1, \ldots, M\}$.

The GS for the generation of frame coefficients draws vectors according to the conditional distribution $f(x_n|x_{-n}, y, \theta)$ under the constraint $N(y-F^*x) \leq \delta$ where $x_{-n}$ is the reduced size vector of dimension $\mathbb{R}^{K-L}$ built from x by removing the $n^{th}$ vector $x_n$. If $N(\cdot)$ is the Euclidean norm, then $\forall n \in \{1, \ldots, M\}$:

$$N\left(y - \sum_{m=1}^{M} F^*_m x_m\right) \leq \delta \Leftrightarrow \left\|F^*_n\left(F_n y - \sum_{m=1}^{M} F_n F^*_m x_m\right)\right\| \leq \delta \Leftrightarrow \tag{38}$$

$$\left\|F_n y - \sum_{m \neq n} F_n F^*_m x_m - x_n\right\| \leq \delta \text{(since } \forall z \in \mathbb{R}^L, \|F^*_n z\| = \|z\|) \Leftrightarrow$$

$$N(x_n - c_n) \leq \delta,$$

where $c_n = F_n y - \sum_{m \neq n} F_n F^*_m x_m$

To sample each $x_n$, it is proposed to use an MH step whose proposal distribution is supported on the ball $B_{Cn,\delta}$ defined by:

$$B_{Cn,\delta} = \{\alpha \in \mathbb{R}^L | N(\alpha - c_n) \leq \delta\} \tag{39}$$

Random generation from a pdf $q_\delta$ defined on $B_{Cn,\delta}$ will now be discussed.

First of all, it will be considered how to sample vectors in the unit $l_p$ ball ($p \in ]0, +\infty]$) of $\mathbb{R}^L$. In the special case $p=+\infty$, this can be easily performed by sampling independently along each space coordinate according to a distribution on the interval $[-1, 1]$. The parameter "p" considered here should not be confused with the shape parameter used in temporal regularization, see equations 21 and 22.

Thus, this section focuses on the more difficult problem associated with a finite value of p. In the following, $\|\cdot\|_p$ denotes the $l_p$ norm.

Let $A=[A_1, \ldots, A_L]^T$ be the random vector of i.i.d. components which have the following $GG(P^{1/p}, p)$ pdf:

$$\forall a \in \mathbb{R}, f(a) = \frac{p^{1-1/p}}{2\Gamma(1/p)} \exp\left(-\frac{|a|^p}{p}\right)$$

Let $U=[U_1, \ldots, U_L]^T = A/\|A\|_p$. Then, it can be shown ([Gupta et al., 1997]) that the random vector U is uniformly distributed on the surface of the $l_p$ unit sphere of $\mathbb{R}^{L'}$ and the joint pdf of $U_1, \ldots, U_{L'-1}$ is $$f(u_1, \ldots, u_{L'-1}) =$$

$$\frac{p^{L'-1}\Gamma(L'/p)}{2^{L'-1}(\Gamma(1/p))^{L'}}\left(1 - \sum_{k=1}^{L'-1} |u_k|^p\right)^{(1-p)/p} 1_{D_{p,L'}}(u_1, \ldots, u_{L'-1})$$

where $D_{p,L'} = \left\{(u_1, \ldots, u_{L'-1}) \in \mathbb{R}^{L'-1} \Big| \sum_{k=1}^{L'-1} |u_k|^p < 1\right\}$.

The uniform distribution on the unit $l_p$ sphere of $\mathbb{R}^{L'}$ will be denoted by $U(L',p)$. Therefore $U=[U_1, \ldots, U_L]^T \sim U(L',p)$.

For every $\in \{1, \ldots, L'-1\}$, it can be shown ([Gupta et al., 1997]) that the pdf of $V=[U_1, \ldots, U_L]^T$ is given by:

$$q_1(u_1, \ldots, u_L) = \tag{40}$$

$$\frac{p^L \Gamma(L'/p)\left(1 - \sum_{k=1}^{L} |u_k|^p\right)^{(L'-L)/p-1}}{2^L(\Gamma(1/p))^L \Gamma((L'-L)/p)} 1_{D_{p,L+1}}(u_1, \ldots, u_L)$$

In particular, if $p \in \mathbb{N}^*$ and $L'=L+p$, equation (40) provides the uniform distribution on the unit $l_p$ sphere of $\mathbb{R}^{L'}$. Sampling from any distribution $q_\eta$ on the ball of radius $\delta \geq \eta > 0$ is straightforwardly deduced by scaling V.

Having a closed form expression of this pdf is important to be able to calculate the acceptance ratio of the MH move. To take into account the value of $x_n^{(i-1)}$ obtained at the previous iteration (i-1), it may however be preferable to choose a proposal distribution supported on a restricted ball of radius $\eta \in ]0, \delta[$ containing $x_n^{(i-1)}$. This strategy, similar to the random walk MH, results in a better exploration of regions associated with large values of the conditional distribution $f(x|\theta, y)$. More precisely, it is proposed to choose a proposal distribution defined on $B_{\hat{x}_n^{(i-1)}, \eta}$ where $$\hat{x}_n^{(i-1)} = P(x_n^{(i-1)} - c_n) + c_n \tag{41}$$

and P is the projection onto the ball $B_{0,\delta-\eta}$ defined as:

$$\forall a \in \mathbb{R}^L, P(a) = \begin{cases} a & \text{if } N(a) \leq \delta - \eta \\ \frac{\delta - \eta}{N(a)} a & \text{otherwise.} \end{cases} \tag{42}$$

This choice of the center of the ball guarantees that $B_{\hat{x}_n^{(i-1)}, \eta} \subset B_{c_n, \delta}$.

Moreover, any point of $B_{c_n,\delta}$ can be reached after consecutive draws in $B_{\hat{x}_n^{(i-1)},\eta}$. The radius $\eta$ has to be adjusted to ensure a good exploration of $B_{c_p,\delta}$. In practice, it may also be interesting to fix a small enough value of $\eta$ (compared with $\delta$) so as to improve the acceptance ratio.

Instead of sampling the hyper-parameter vector $\theta$ according to $f(\theta|x, y)$ it is proposed to iteratively sample according to $f(\gamma_g|\beta_g, x, y)$ and $f(\beta_g|\gamma_g, x, y)$. Straightforward calculations yield the following results:

$$f(\gamma_g | \beta_g, x, y) \propto \gamma_g^{-\frac{n_g}{\beta_g}-1} \exp\left(-\frac{1}{\gamma_g} \sum_{k \in S_g} |x_k|^{\beta_g}\right) 1_{\mathbb{R}_+}(\gamma_g) \quad (43)$$

$$f(\beta_g | \gamma_g, x, y) \propto \frac{\beta_g^{n_g} 1_{[0,3]}(\beta_g)}{\gamma_g^{n_g/\beta_g} [\Gamma(1/\beta_g)]^{n_g}} \exp\left(\sum_{k \in S_g} \frac{-|x_k|^{\beta_g}}{\gamma_g}\right). \quad (44)$$

Consequently, $f(\gamma_g|\beta_g, x, y)$ is the pdf of the inverse gamma distribution $$IG\left(\frac{n_g}{\beta_g}, \sum_{k \in S_g} |x_k|^{\beta_g}\right)$$

that is easy to sample. Conversely, it is more difficult to sample according to the truncated pdf $f(\beta_g|\gamma_g, x, y)$. This is achieved by using an MH move whose proposal $q(\beta_g|\beta_g^{(i-1)})$ is a Gaussian distribution truncated on the interval [0, 3] with standard deviation $\sigma\beta_a=0.05$ [Dobigeon et al, 2007], [Robert, 1995]. The mode of this distribution is the value of the parameter $\beta_g^{(i-1)}$ at the previous iteration (i−1). The resulting method is the hybrid GS summarized in Algorithm 4.

If one wants to integrate altogether the reconstruction and hyperparameter estimation steps in the same Bayesian framework, observation model in Eq. 30 can be extended to y=SF*x+n, where S is the sensitivity matrix defined in Eq. (3). The inference has then to be reconducted accordingly.

---

Algorithm 4

---

1: Initialize with some $\theta^{(0)} = (\theta_g^{(0)})1 \leq g \leq G = (\gamma_g^{(0)}, \beta_g^{(0)})_{1 \leq g \leq G}$ and $x^{(0)} \in C_\delta$, and set i = 1.

2: repeat

3: <u>Sampling x:</u>

4: for n = 1 to M do

5: Compute $c_n^{(i)} = F_n(y - \Sigma_{m<n} F_m * x_m^{(i)} - \Sigma_{m>n} F_m * x_m^{(i-1)})$
and $\hat{x}_n^{(i-1)} = P(x_n^{(i-1)} - c_n^{(i)}) + c_n^{(i)}$.

6: Simulate $x_n^{(i)}$ as follows:
Generate $\tilde{x}_n^{(i)} \sim q_\eta(x_n - \hat{x}_n^{(i-1)})$ where $q_\eta$ is defined on $\beta_{o,\eta}$
Compute the ratio $$r(\tilde{x}_n^{(i)}, x_n^{(i-1)}) = \frac{f(\tilde{x}_n^{(i)} | \theta^{(i-1)}, (x_m^{(i)})m < n, (x_m^{(i-1)})m > n, y) q_\eta(x_n^{(i-1)} - P(\tilde{x}_n^{(i)} - c_n^{(i)}) - c_n^{(i)})}{f(x_n^{(i-1)} | \theta^{(i-1)}, (x_m^{(i)})m < n, (x_m^{(i-1)})m > n, y) q_\eta(\tilde{x}_n^{(i)} - \hat{x}_n^{(i-1)})}$$

and accept the proposed candidate with the probability $\min\{1, r(\tilde{x}_n^{(i)}, x_n^{(i-1)})\}$ 7: end for 8: <u>Sampling $\theta$:</u>

9: for g = 1 to G do

10: Generate $\gamma_g^{(i)} \sim IG\left(\frac{n_g}{\beta_g^{(i-1)}}, \sum_{k \in S_g} |x_k^{(i)}|^{\beta_g^{(i-1)}}\right)$ 11: Simulate $\beta_g^{(i)}$ as follows:
Generate $\tilde{\beta}_g^{(i)} \sim q(\beta_g|\beta_g^{(i-1)})$.
Compute the ratio $$r(\tilde{\beta}_g^{(i)}, \beta_g^{(i-1)}) = \frac{f(\tilde{\beta}_g^{(i)} | \gamma_g^{(i)}, x^{(i)}, y) q(\beta_g^{(i-1)} | \tilde{\beta}_g^{(i)})}{f(\beta_g^{(i-1)} | \gamma_g^{(i)}, x^{(i)}, y) q(\tilde{\beta}_g^{(i)} | \beta_g^{(i-1)})}$$

and accept the proposed candidate with the probability $\min\{1, r(\tilde{\beta}_g^{(i)}, \beta_g^{(i-1)})\}$.

12: end for

13: Set i ← t + 1.

14: Until Convergence

Although this algorithm is intuitive and simple to implement, it must be pointed out that it was derived under the restrictive assumption that the considered frame is the union of M orthonormal bases. When these assumptions do not hold, another algorithm, discussed below, allows sampling frame coefficients and the related hyperparameters by exploiting algebraic properties of frames. Indeed, as a direct generation of samples according to $f(x|\theta, y)$ is generally impossible, an alternative method is proposed which replaces the Gibbs move by an MH move. This MH move aims at sampling globally a candidate x according to a proposal distribution. This candidate is accepted or rejected with the standard MH acceptance ratio. The efficiency of the MH move strongly depends on the choice of the proposal distribution for x.

We denote as $x^{(i)}$ be the $i^{th}$ accepted sample of the algorithm and $q(x|x^{(i-1)})$ the proposal that is used to generate a candidate at iteration i. The main difficulty for choosing $q(x|x^{(i-1)})$ stems from the fact that it must guarantee that $x \in C_\delta$ while yielding a tractable expression of $q(x^{(i-1)}|x)/q(x|x^{(i-1)})$.

For this reason, it is proposed to exploit the algebraic properties of frame representations. More precisely, any frame coefficient vector can be decomposed as $x = x_H + x_\perp$, where $x_H$ and $x_{H\perp}$ are realizations of random vectors taking their values in $H = \text{Ran}(F)$ and $H^\perp = [\text{Ran}(F)]^\perp = \text{Null}(F^*)$, respectively. It is recalled that the range of F is $\text{Ran}(F) = \{x \in \mathbb{R}^K | \exists y \in \mathbb{R}^L, Fy = x\}$ and the null space of $F^*$ is $$\text{Null}(F^*) = \{x \in \mathbb{R}^K | F^*x = 0\}$$

The proposal distribution used here allows generating samples $x_H \in H$ and $x_{H\perp} \in H^\perp$. More precisely, the following separable form of the proposal pdf will be considered:

$$q(x|x^{(i)}) = q(x_H | x_H^{(i-1)}) q(x_{H\perp} | x_{H\perp}^{(i-1)}) \quad (45)$$

where $x_H^{(i-1)} \in H$, $x_{H\perp}^{(i-1)} \in H^\perp$ and $x^{(i-1)} = x_H^{(i-1)} + x_{H\perp}^{(i-1)}$. In other words, independent sampling of $x_H$ and $x_{H\perp}$ will be performed.

If the decomposition $x = x_H + x_{H\perp}$ is considered, sampling x in $C_\delta$ is equivalent to sampling $\lambda \in \overline{C}_\delta$, where $C_\delta = \{\lambda \in \mathbb{R}^L | N(y - F^*F\lambda) \le \delta\}$. Indeed, $x_H = F\lambda$ where $\lambda \in \mathbb{R}^L$ and, since $x_{H\perp} \in \text{Null}(F^*)$, $F^*x = F^*F\lambda$. Sampling $\lambda$ in $\overline{C}_\delta$ can be easily achieved, e.g., by generating u from a distribution on the ball $B_{y,\delta}$ and by taking $\lambda = (F^*F)^{-1} u$.

To make the sampling of $x_H$ at iteration i more efficient, taking into account the sampled value at the previous iteration $x_H^{(i-1)} = F\lambda^{(i-1)} = F(F^*F)^{-1} u^{(i-1)}$ may be interesting. Similarly to random walk generation techniques, u is generated in $B_{\hat{u}^{(i-1)},\eta}$ where $\eta \in ]0, \delta[$ and $\hat{u}^{(i-1)} = P(u^{(i-1)} - y) + y$. This allows drawing a vector u such that $x_H = F(F^*F)^{-1} u \in C_\delta$ and $N(u - u^{(i-1)}) \le 2\eta$.

The generation of u can then be performed according to equation (40) provided that $N(\cdot)$ is an $l_p$ norm with $p \in [1, +\infty]$.

Once that $x_H = F\lambda \in H \cap C_\delta$ (which ensures that x is in $C_\delta$), has been simulated, $x_{H\perp}$ has to be sampled as an element of $H^\perp$. Since $y = n = F^*x + n = F^*x_H + n$, there is no information in y about $x_{H\perp}$. As a consequence, it is proposed to sample $x_{H\perp}$ by drawing z according to the Gaussian distribution $\mathcal{N}(x^{(i-1)}, \sigma_x^2 I)$ and by projecting z onto $H^\perp$, i.e., $$x_{H\perp} = \Pi_{H\perp} z$$

$\Pi_{H\perp} = I - F(F^*F)^{-1}F^*$ is the orthogonal projection operator onto $H^\perp$.

It can then be shown that the expression of the proposal pdf $$\frac{q(x^{(i-1)} | x)}{q(x | x^{(i-1)})} = \frac{q_\eta(u^{(i-1)} - P(u - y) - y)}{q_\eta(u - \hat{u}^{(i-1)})}. \quad (46)$$

This expression remains valid in the degenerate case when K=L (yielding $x_{H\perp} = 0$). Finally, it is important to note that, if $q_\eta$ is the uniform distribution on the ball $B_{0,\eta}$, the above ratio reduces to 1, which simplifies the computation of the MH acceptance ratio. The final algorithm is summarized in Algorithm 5. It is noteworthy that the sampling of the hyper-parameter vector is performed as for the hybrid GS of Algorithm 4.

---

Algorithm 5

1: Initialize with some $\theta^{(0)} = (\theta_g^{(0)})_{1 \le g \le G} = (\gamma_g^{(0)}, \beta_g^{(0)})_{1 \le g \le G}$ and $u^{(0)} \in B_{y,\delta}$.
   Set $x^{(0)} = F(F^*F)^{-1} u^{(0)}$ and $i = 1$.
2: Repeat
3: Sampling x:
   Compute $\hat{u}^{(i-1)} = P(u^{(i-1)} - y) + y$.
   Generate $\tilde{u}^{(i)} \sim q_\eta(u - \hat{u}^{(i-1)})$ where $q_\eta$ is defined on $\beta_{o,\eta}$.
   Compute $\tilde{x}_H^{(i)} = F(F^*F)^{-1} \tilde{u}^{(i)}$.
   Generate $z^{(i)} \sim N(x^{(i-1)}, \sigma_x^2 I)$.
   Compute $\tilde{x}_{H\perp}^{(i)} = \Pi_{H\perp} z^{(i)}$ and $\tilde{x}^{(i)} = \tilde{x}_H^{(i)} + \tilde{x}_H^{\perp(i)}$.

Compute the ratio $r(\tilde{x}^{(i)}, x^{(i-1)}) = \dfrac{f(\tilde{x}^{(i)} | \theta^{(i-1)}, y) q_\eta(u^{(i-1)} - P(\tilde{u}^{(i)} - y) - y)}{f(x^{(i-1)} | \theta^{(i-1)}, y) q_\eta(\tilde{u}^{(i)} - \hat{u}^{(i-1)})}$ and accept the proposed candidates $\tilde{u}^{(i)}$ and $\tilde{x}^{(i)}$ with probability
   $\min\{1, r(\tilde{x}^{(i)}, x^{(i-1)})\}$.
4: Sampling $\theta$:
5: for g = 1 to G do
6: Generate $\gamma_g^{(i)} \sim IG\left(\dfrac{n_g}{\beta_g^{(i-1)}}, \sum_{k \in S_g} |x_k^{(i)}|\beta_g^{(i-1)}\right)$.

---
Algorithm 5
---

7: Simulate $\beta_g^{(i)}$ as follows:
   Generate $\tilde{\beta}_g^{(i)} \sim q(\beta_g | \beta_g^{(i-1)})$.
   Compute the ratio $$r(\tilde{\beta}_g^{(i)}, \beta_g^{(i-1)}) = \frac{f(\tilde{\beta}_g^{(i)} | \gamma_g^{(i)}, x^{(i)}, y) q(\beta_g^{(i-1)} | \tilde{\beta}_g^{(i)})}{f(\beta_g^{(i-1)} | \gamma_g^{(i)}, x^{(i)}, y) q(\tilde{\beta}_g^{(i)} | \beta_g^{(i-1)})}$$

and accept the proposed candidate with the probability $\min\{1, r(\tilde{\beta}_g^{(i)}, \beta_g^{(i-1)})\}$.
8: end for
9: Set $i \leftarrow i + 1$.
10: Until Convergence

---

The hierarchical Bayesian model of equations (31-35) can be extended to include an additional term in the prior depending on the Total Variation (TV) of the image to be reconstructed. Like redundant frame representations, using TV priors leads also to a hyper-parameter estimation problem.

Assuming an exponential shape, the new prior can be expressed as:

$$f(x | \theta) = \frac{1}{Z(\theta)} \exp(-\kappa \|F^* x\|_{TV}) \prod_{g=1}^{G} \left[ \left(\frac{1}{\gamma_g^{1/\beta_g}}\right)^{n_g} \exp\left(-\frac{1}{\gamma_g} \sum_{k \in S_g} |x_k|^{\beta_g}\right) \right] \quad (47)$$

where $\theta = (\theta_1, \ldots, \theta_G, \kappa)$ is the new hyper-parameter vector with $\kappa > 0$, $\|\cdot\|_{TV}$ is the TV semi-norm and $Z(\theta)$ is a normalization constant. The new hierarchical Bayesian model for the frame decomposition is completed by the following improper hyperprior:

$$f(\theta) = Z(\theta) \varphi(\kappa) \prod_{g=1}^{G} \varphi(\theta_g) = Z(\theta) \varphi(\kappa) \prod_{g=1}^{G} [\varphi(\gamma_g) \varphi(\beta_g)] \propto \quad (48)$$

$$Z(\theta) 1_{[0, \kappa_{max}]}(\kappa) \prod_{g=1}^{G} \left[\frac{1}{\gamma_g} 1_{\mathbb{R}_+}(\gamma_g) 1_{[0,3]}(\beta_g)\right],$$

where $\kappa_{max}$ is a positive real to be fixed (in a preferred embodiment, $\kappa_{max} = 10$).

It can be shown that $Z(\theta)$ is uniformly bounded with respect to $\gamma_g$ and therefore that the hyperprior $f(\theta)$ in Eq. (47) has a stable asymptotic behaviour when $\gamma_g \to +\infty$.

The resulting new posterior distribution is therefore given by:

$$f(x, \theta | y) = 1_{C^*}(x) \quad (49)$$

$$\prod_{g=1}^{G} \left[ \left(\frac{1}{\gamma_g^{1/\beta_g}}\right)^{n_g} \exp\left(-\frac{1}{\gamma_g} \sum_{k \in S_g} |x_k|^{\beta_g}\right) \left(\frac{1}{\gamma_g} 1_{\mathbb{R}_+} + (\gamma_g) 1_{[0,3]}(\beta_g)\right) \right] \times$$

$$\exp(-\kappa \|F^* x\|_{TV}) 1_{[0, \kappa_{max}]}(\kappa).$$

The Bayesian estimators associated with the posterior distribution in Eq. (48) still have no simple closed-form expression. For this reason, the same sampling strategy discussed above will be applied, and the frame coefficients will be sampled as in Algorithm 5. However, for the hyperparameters vector, straightforward calculations show that the posterior distribution for the hyper-parameters $\gamma_g$, $\beta_g$ and $\kappa$ will be expressed as:

$$f(\gamma_g | \beta_g, \kappa, x, y) \propto \gamma_g^{-\frac{n_g}{\beta_g}-1} \exp\left(-\frac{1}{\gamma_g} \sum_{k \in S_g} |x_k|^{\beta_g}\right) 1_{\mathbb{R}_+}(\gamma_g) \quad (50)$$

$$f(\beta_g | \gamma_g, \kappa, x, y) \propto \exp\left(\sum_{k \in S_g} -\frac{1}{\gamma_g} |x_k|^{\beta_g}\right) 1_{[0,3]}(\beta_g) \quad (51)$$

and $$f(\kappa | \gamma_1, \ldots \gamma_G, \beta_1, \ldots, \beta_G, x, y) \propto \exp(-\kappa \|F^* x\|_{TV}) 1_{[0, \kappa_{max}]}(\kappa) \quad (52)$$

respectively.

Consequently, $f(\gamma_g | \beta_g, \kappa, x, y)$ is the pdf of the inverse gamma $$\mathcal{IG}\left(\frac{n_g}{\beta_g}, \sum_{k \in S_g} |x_k|^{\beta_g}\right)$$

Sampling $\gamma_g$ will therefore be performed exactly as in Algorithm 4. Conversely, it is more difficult to sample according to $f(\beta_g | \gamma_g, \kappa, x, y)$ and $f(\kappa | \gamma_1, \ldots, \gamma_G, \beta_1, \ldots, \beta_G, x, y)$. This task is achieved by using two MH moves whose proposal distributions $q(\beta_g | \beta_g^{(i-1)})$ and $q(\kappa | \kappa^{(i-1)})$ are Gaussian distributions truncated on the intervals [0, 3] and [0, $\kappa_{max}$] with standard deviations $\sigma_{\beta_g} = 0.05$ and $\sigma_\kappa = 0.01$, respectively. These standard deviation values have been fixed based on our practical observations. The resulting method to sample according to the posterior distribution in Eq. (49) is summarized in Algorithm 6.

Algorithm 6

1: Initialize with some $\theta^{(0)} = ((\theta_g^{(0)})_{1 \leq g \leq G}, \kappa^{(0)}) = ((\gamma_g^{(0)}, \beta_g^{(0)})_{1 \leq g \leq G}, \kappa^{(0)})$
and $u^{(0)} \in B_{y,\delta}$. Set $x^{(0)} = F(F^*F)^{-1}u^{(0)}$ and $i = 1$.
2: repeat
3:    Sampling x:
      Compute $\hat{u}^{(i-1)} = P(u^{(i-1)} - y) + y$.
      Generate $\tilde{u}^{(i)} \sim q_n(u - \hat{u}^{(i-1)})$ where $q_n$ is defined on $\beta_{o,\eta}$.
      Compute $\tilde{x}_H^{(i)} = F(F^*F)^{-1}\tilde{u}^{(i)}$.
      Generate $z^{(i)} \sim N(x^{(i-1)}, \sigma_x^2 I)$.
      Compute $\tilde{x}_H^{\perp(i)} = \Pi_H^\perp z^{(i)}$ and $\tilde{x}^{(i)} = \tilde{x}_H^{(i)} + \tilde{x}_H^{\perp(i)}$.

Compute the ratio $r(\tilde{x}^{(i)}, x^{(i-1)}) = \dfrac{f(\tilde{x}^{(i)} \mid \theta^{(i-1)}, y)q_n(u^{(i-1)} - P(\tilde{u}^{(i)} - y) - y)}{f(x^{(i-1)} \mid \theta^{(i-1)}, y)q_n(\tilde{u}^{(i)} - \hat{u}^{(i-1)})}$ and accept the proposed candidates $\tilde{u}^{(i)}$ and $\tilde{x}^{(i)}$ with probability
      $\min\{1, r(\tilde{x}^{(i)}, x^{(i-1)})\}$.
4:    Sampling $\theta$:
5:    for g = 1 to G do 6:       Generate $\gamma_g^{(i)} \sim IG\left(\dfrac{n_g}{\beta_g^{(i-1)}}, \sum_{k \in S_g} |x_k^{(i)}| \beta_g^{(i-1)}\right)$.

7:       Simulate $\beta_g^{(i)}$ as follows:
         Generate $\tilde{\beta}_g^{(i)} \sim q(\beta_g | \beta_g^{(i+1)})$.

Compute the ratio $r(\tilde{\beta}_g^{(i)}, \beta_g^{(i-1)}) = \dfrac{f(\tilde{\beta}_g^{(i)} \mid \gamma_g^{(i)}, \kappa^{(i)}, x^{(i)}, y)q(\beta_g^{(i-1)} \mid \tilde{\beta}_g^{(i)})}{f(\beta_g^{(i-1)} \mid \gamma_g^{(i)}, \kappa^{(i)}, x^{(i)}, y)q(\tilde{\beta}_g^{(i)} \mid \beta_g^{(i-1)})}$ and accept the proposed candidate with the probability $\min\{1, r(\tilde{\beta}_g^{(i)}, \beta_g^{(i-1)})\}$.
8:    end for
9:    Simulate $\kappa^{(i)}$ as follows:
      Generate $\tilde{\kappa}^{(i)} \sim q(\kappa | \kappa^{(i-1)})$.

Compute the ratio $r(\tilde{\kappa}^{(i)}, \kappa^{(i-1)}) = \dfrac{f(\tilde{\kappa}^{(i)} \mid \gamma_1^{(i)}, \ldots, \gamma_G^{(i)}, \beta_1^{(i)}, \ldots, \beta_G^{(i)}, x^{(i)}, y)q(\kappa^{(i-1)} \mid \tilde{\kappa}^{(i)})}{f(\kappa^{(i-1)} \mid \gamma_1^{(i)}, \ldots, \gamma_G^{(i)}, \beta_1^{(i)}, \ldots, \beta_G^{(i)}, x^{(i)}, y)q(\tilde{\kappa}^{(i)} \mid \kappa^{(i-1)})}$ and accept the proposed candidate with the probability $\min\{1, r(\tilde{\kappa}^{(i)}, \kappa^{(i-1)})\}$.
10: Set $i \leftarrow i + 1$.
11: Until Convergence

---

The technical results of different embodiments of the inventive methods will now be discussed with reference to FIG. 2-20.

The anatomical results reported in FIGS. 2-10 and 13 were obtained in the following conditions. Experiments have been conducted on real data sets comprising 256×256× 14 Gradient-Echo (GE) anatomical with 0.93×0.93×8 mm3 spatial resolution. GE anatomical images were acquired with TE/TR=10/500 ms and BW=31.25 kHz. Note also that these images have been acquired using acceleration factors R=2 and R=4 on a Signa 1.5 Tesla GE Healthcare scanner with an eight-channel head coil. Interestingly, the scanning time of anatomical data lasted 5~mn in non-parallel imaging, while acquisition duration was decreased to 3 mn 10 s and 2 mn 20 s in parallel imaging with R=2 and R=4, respectively.

Figure 2:
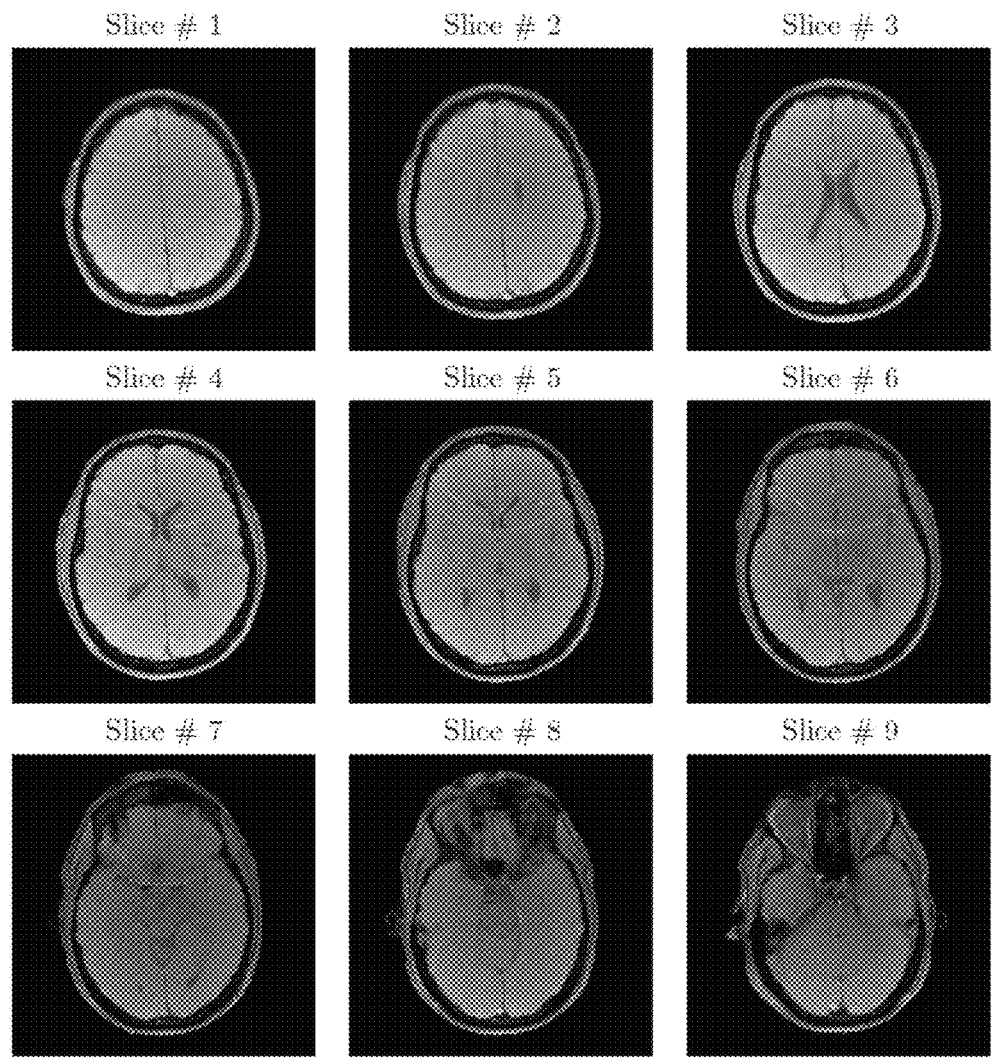
FIGS. 2 and 3, nine anatomical axial slices of a human brain obtained using the Tikhonov-regularized SENSE pMRI reconstruction method known from prior art, with R=2 and R=4 respectively.
Figure 3:
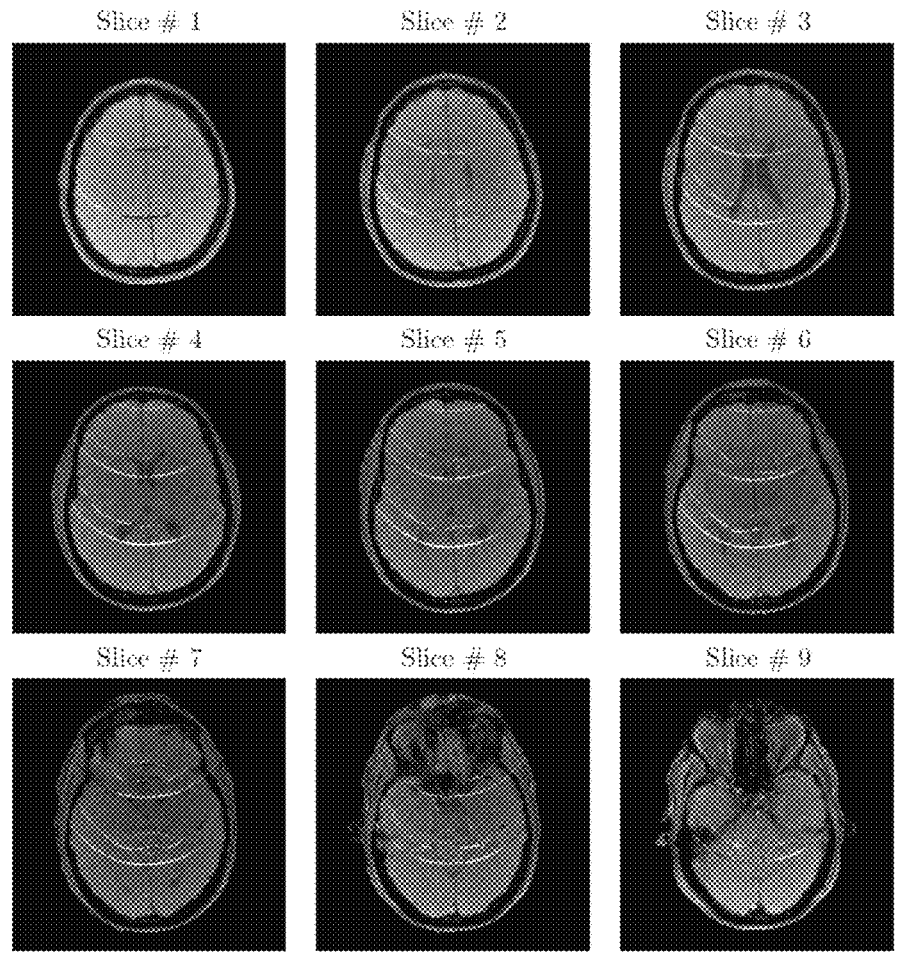

FIGS. 2 and 3 show 9 anatomical slices of a human brain obtained using SENSE with Tikhonov regularization. The Tikhonov parameter has been fixed manually. The reduction factor is R=2 for FIG. 2, and R=4 for FIG. 3. Despite the regularization, some aliasing artifacts are visible in the form of curved lines, particularly on FIG. 3. Some oversmoothing of the images is also visible.

Figure 4:
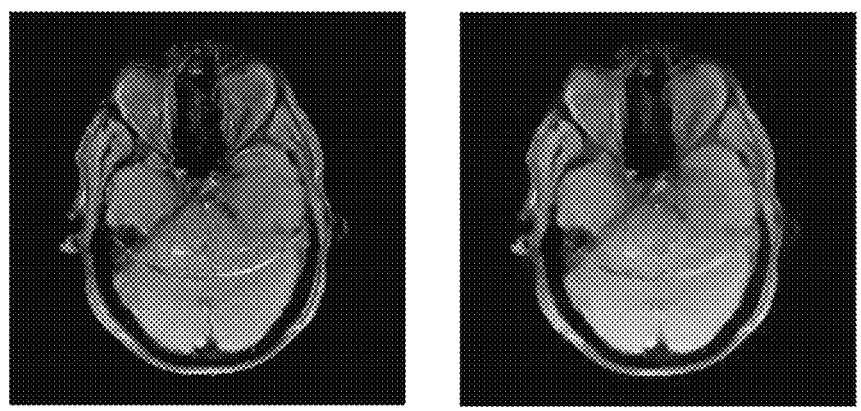
FIG. 4, an anatomical axial slice of the same human brain obtained using the TV-regularized SENSE pMRI reconstruction method known from prior art, with R=2 (left panel) and R=4 (right panel)

FIG. 4 has been obtained in the same experimental conditions, using TV regularization (left panel: R=2; right panel: R=4—a single slice is shown) with a manually tuned regularization parameter κ. Quite strong aliasing artifacts and some "staircase" defects are visible; these defects can be mitigated by increasing the value of κ, at the expense of the informational content of the images.

Figure 5:
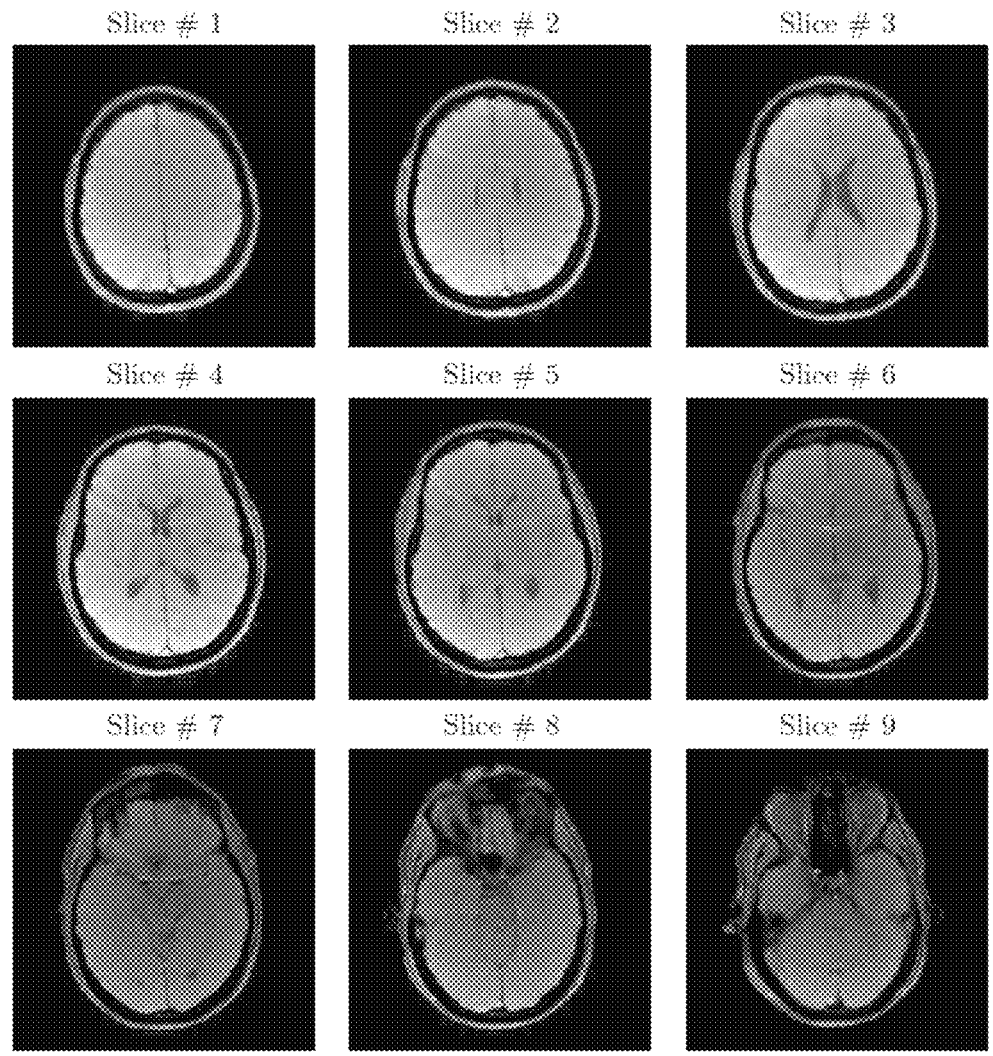
FIGS. 5 and 6, nine anatomical axial slices of the same human brain obtained using an autocalibrated 2D wavelet transform-based regularization scheme (UWR-SENSE) according to an embodiment of the invention, with R=2 and R=4 respectively.
Figure 6:
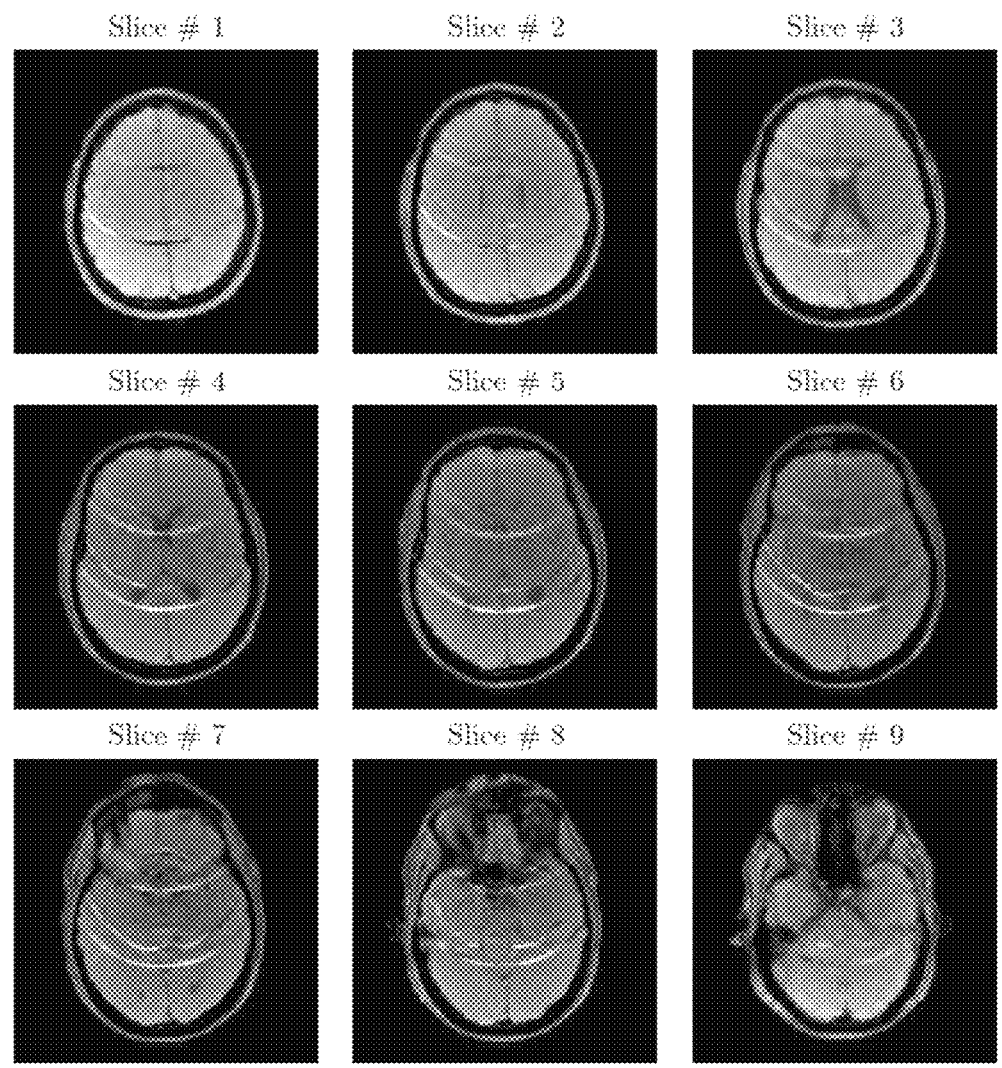

FIGS. 5 and 6 have been obtained, in the same experimental conditions, using an autocalibrated 2D wavelet transform-based regularization scheme, as described above; this method will be called 2D-UWR-SENSE, where "UWR" stands for "Unconstrained Wavelet Regularization". Again, R=2 for FIG. 5 and R=4 for FIG. 6.

More precisely, dyadic (M=2) Symmlet orthonormal wavelet bases associated with filters of length 8 were used over $j_{max}=3$ resolution levels. Regarding the wavelet coefficients, the prior of equation (10) has been employed.

The related hyper-parameters (a couple of hyper-parameters is fitted for real/imaginary parts of each subband, i.e. each approximation/detail coefficients at each resolution level and orientation) were estimated using the Bayesian approach described above. Full FOV image reconstruction was then performed using wavelet-based regularization.

The smoothing effects observed in FIGS. 2 and 3 with Tikhonov regularization no longer exist in the WT regularized images of FIGS. 5 and 6, where a quite accurate reconstruction is performed within the brain mask without introducing the staircase effects observed with TV regularization (see FIG. 4).

A further improvement of the image quality can be obtained by incorporating an additional constraint in the method described hereabove in order to better regularize artifact regions. The ensuing algorithm is called CWR-SENSE, where "CWR" stands for "Constrained Wavelet Regularization".

This method implies imposing local lower and upper bounds on the image intensity values in artifact areas, regardless of their shape and/or location. These bounds define the nonempty closed convex set:

$$C = \{\rho \in \mathbb{C}^K | \forall r \in \{1, \ldots, Y/R\} \times \{1, \ldots, X\}, \rho(r) \in C_r\} \quad (53)$$

where the constraint introduced on the range values at position $r \in 2\{1, \ldots, Y/R\} \times \{1, \ldots, X\}$ is modeled by:

$$C_r = \{\xi \in \mathbb{C} | Re(\xi) \in \mathbb{I}_r^{Re}, Im(\xi) \in \mathbb{I}_r^{Im}\} \quad (54)$$

with $\mathbb{I}_r^{Re} = [I_{min,r}^{Re}, I_{max,r}^{Re}]$ and $\mathbb{I}_r^{Im} = [I_{min,r}^{Im}, I_{max,r}^{Im}]$. The optimality criterion becomes then:

$$\mathcal{J}_{CWT}(\zeta) = \mathcal{J}_{WT}(\zeta) + i_{C^*}(\zeta) \quad (55)$$

where $C^* = \{\zeta \in \mathbb{C}^K | T^*\zeta \in C\}$ and is the indicator function of the closed convex set $i_{C^*}$ defined by:

$$\forall \zeta \in \mathbb{C}^K, \quad i_{C^*}(\zeta) = \begin{cases} 0 & \text{if } \zeta \in C^* \\ +\infty & \text{otherwise.} \end{cases} \quad (56)$$

A morphological gradient [Serra, 1982] can used to detect artifact regions (very low/high transitions in the gradient image) on which the additional convex constraints are applied. The upper and lower bounds that define the convex sets $C_r$ are spatially varying since they depend on r. They can thus be computed using a morphological opening and closing operations applied to the basic-SENSE reconstructed image (auxiliary, or reference, image) in order to discard very low and high intensities.

Figure 7:
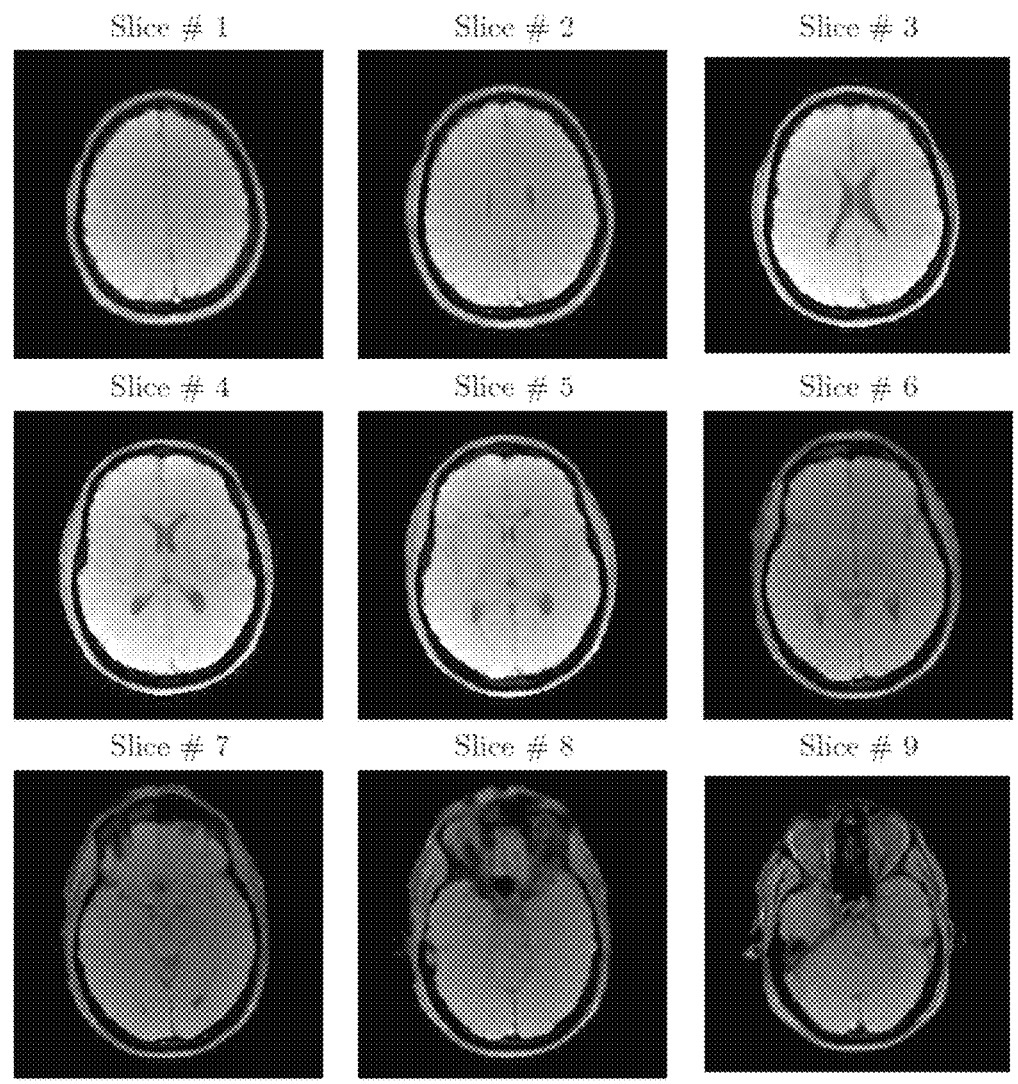
FIGS. 7 and 8, nine anatomical axial slices of the same human brain obtained using a constrained, autocalibrated 2D wavelet transform-based regularization scheme (CWR-SENSE) according to another embodiment of the invention, with R=2 and R=4 respectively.
Figure 8:
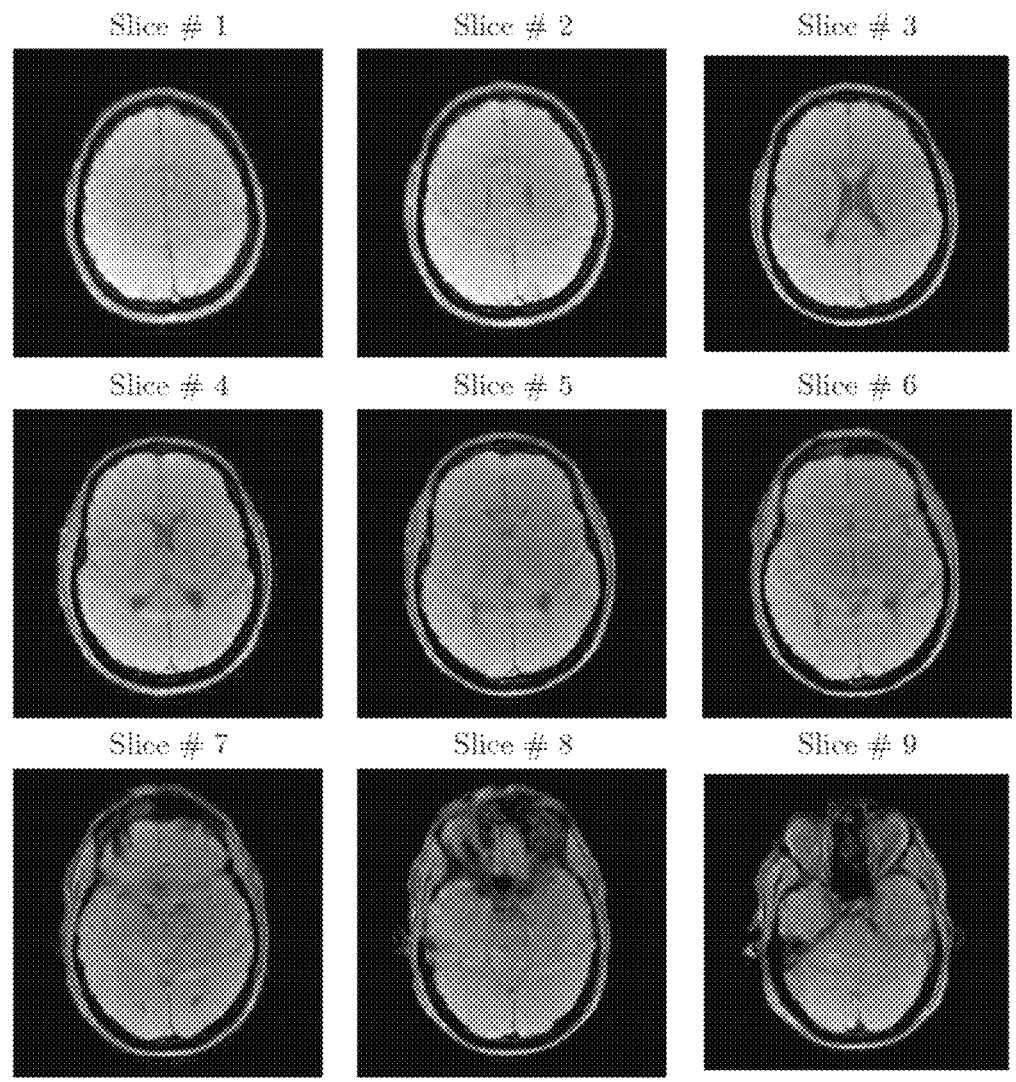

FIGS. 7 and 8 illustrate the results of the CWR-SENSE method, for R=2 and R=4 respectively. It can be seen that the surviving artifacts in FIGS. 5 and 6 have now been removed due to the anisotropic smoothing using the additional convex constraint.

From a quantitative point of view, significant improvements were achieved by the UWR/CWR-SENSE algorithms in comparison with basic-SENSE and Tikhonov reconstructions. The following table 1 reports the signal-noise-ratio (SNR) values in dB corresponding to the basic-SENSE, Tikhonov regularization and the proposed UWR/CWR-SENSE techniques for the illustrated slices of the anatomical brain volume shown in FIGS. 3, 6 and 8 (R=4). On average, the gain drew from the proposed constrained regularization strategy amounts to 1.08 dB and a better visual quality.

TABLE 1

|  | SENSE | Tikhonov | UWR-SENSE | CWR-SENSE |
| --- | --- | --- | --- | --- |
| Slice #1 | 14.36 | 14.63 | 14.77 | 14.95 |
| Slice #2 | 11.55 | 11.62 | 12.01 | 12.53 |
| Slice #3 | 12.95 | 13.44 | 14.02 | 14.22 |
| Slice #4 | 9.24 | 9.48 | 10.01 | 10.30 |
| Slice #5 | 11.50 | 11.79 | 12.06 | 12.25 |
| Slice #6 | 9.68 | 9.87 | 10.12 | 10.32 |
| Slice #7 | 11.00 | 11.56 | 11.85 | 12.00 |
| Slice #8 | 12.16 | 12.49 | 13.00 | 13.36 |
| Slice #9 | 13.78 | 14.77 | 15.83 | 16.04 |
| Volume average | 11.80 | 12.18 | 12.63 | 12.88 |

The influence of the choice of the wavelet basis has also been studied. More particularly, four different bases have been considered: dyadic Symmlet 8, dyadic Daubechies 8, dyadic Haar and Meyer with M=4 bands [Chaux et al., 2006b]. The first three bases give quite similar results (apart from some blocking effects which only occur with the Haar basis), the dyadic Symmlet 8 leading to a slightly higher SNR. On the contrary, the Meyer 4-band wavelet basis leads to a significantly lower SNR.

Figure 9:
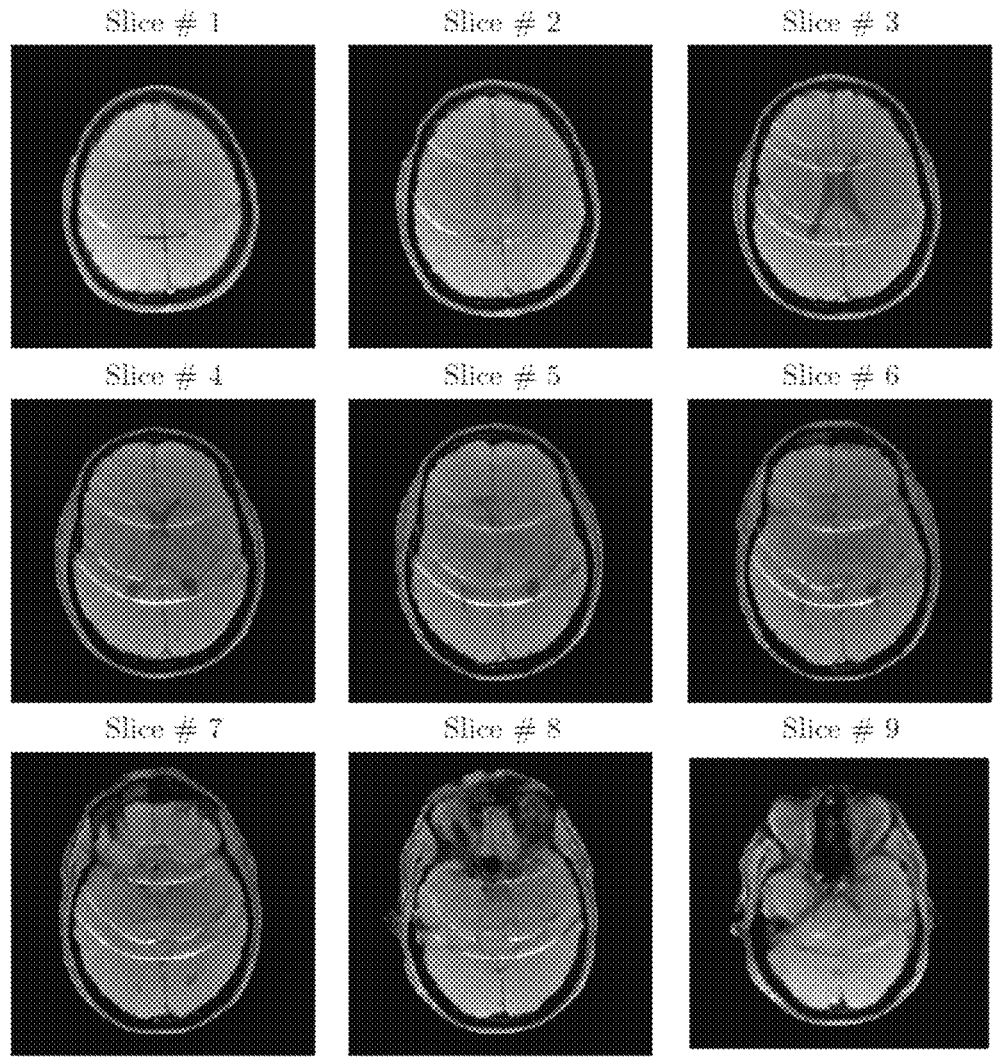
FIG. 9, nine anatomical axial slices of the same human brain obtained using an autocalibrated combined wavelet-total variation regularization scheme according to another embodiment of the invention, with R=4 and using image decomposition on a non-redundant orthonormal wavelet basis.
Figure 10:
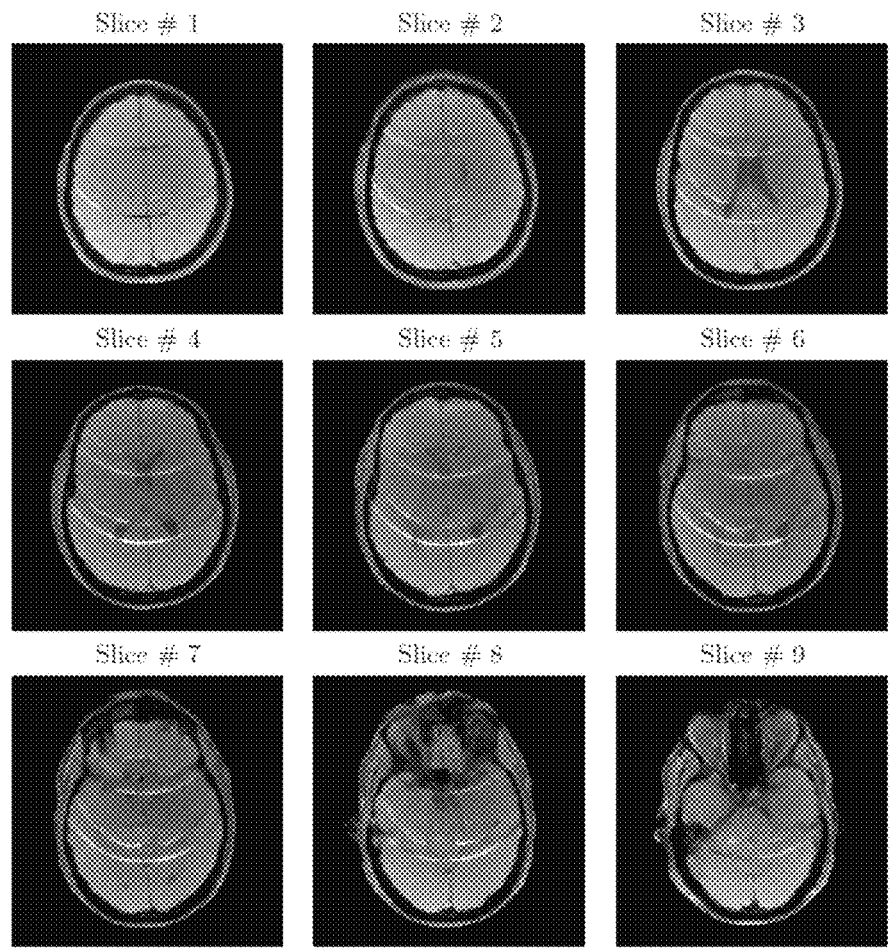
FIG. 10, nine anatomical axial slices of the same human brain obtained using an autocalibrated combined wavelet-total variation regularization scheme according to another embodiment of the invention, with R=4 and using image decomposition on a redundant wavelet frame constituted by the union of two orthonormal bases.

FIG. 9 shows the results obtained by combined wavelet-total variation regularization (algorithm 2) using a dyadic (M=2) Symmlet orthonormal wavelet basis associated with filters of length 8 over $j_{max}$=3 resolution levels, with a reduction factor R=4. FIG. 10 show the results obtained by combined wavelet-total variation regularization using a redundant wavelet frame constituted by a Union of 2 Orthonormal Bases (U2OB) with Symmlet 8 and Symmlet 4 filters. The hyper-parameters of the wavelet prior and the TV regularization parameter were estimated using the approach described above. These figures show that the reconstructed images present better regularity than the ones reconstructed using the UWR-SENSE algorithm (FIG. 6). However, from a visual viewpoint, using redundant WT do not necessarily lead to better reconstruction quality. From a quantitative viewpoint, SNR values in dB are provided in the table 2 below. Comparisons with SNR values in table 1 confirm the usefulness of combining WT and TV in a joint regularization framework. This table shows that a slight improvement of 0.02 dB is obtained compared to the UWR-SENSE algorithm when using Symmlet wavelets. However, more significant improvement (0.24 dB) is reached when using the U2OB redundant wavelet frame. It turns out then that even if the reconstruction performance obtained using an orthonormal wavelet basis and a redundant wavelet frame seems equivalent, SNR values indicate that using redundant frames is fruitful.

FIG. 13 shows the reconstructed images using TV regularization (left), 3D-UWR-SENSE with a wavelet frame constituted by a union of two orthonormal wavelet basis (middle) and a hybrid frame-TV regularization method (right). The top row shows whole images, the bottom row a magnified detail. The two orthonormal bases whose union constitutes the wavelet frame used for reconstruction (middle and right columns) are a Daubechies basis of length 4 and a shifted Daubechies basis of length 8.

Three resolution levels have been used, which means that G=20 groups of wavelet coefficients are considered. For the frame representations, the hyperparameters have been chosen using the hybrid MCMC algorithm described above.

TABLE 2

|  | OB | U2OB |
| --- | --- | --- |
| Slice #1 | 14.85 | 15.16 |
| Slice #2 | 12.18 | 12.35 |
| Slice #3 | 13.85 | 14.32 |
| Slice #4 | 9.78 | 9.85 |
| Slice #5 | 12.17 | 12.62 |
| Slice #6 | 10.20 | 10.17 |
| Slice #7 | 11.75 | 12.04 |
| Slice #8 | 13.15 | 13.44 |
| Slice #9 | 15.94 | 15.88 |
| Volume average | 12.65 | 12.87 |

The anatomical results reported in FIGS. 11 and 12. were obtained in the following conditions. The anatomical MRI scan was performed on a 3T Tim Trio Siemens scanner using a 3D T1-weighted MP-RAGE pulse sequence and a matrix array head coil consisting of 32 receive channels. The scan parameter were chosen as follows: slice orientation=sagittal (Right->Left), slice thickness=1.1 mm; TE=2.98 ms, TR=2300 ms; TI=900 ms, Flip Angle: 9°, BW=61 kHz, single shot. The field of View was 256×240×176 mm3 with a matrix size of 256×240×160 corresponding to anisotropic resolution of 1×1×1.1 mm3. The scanning time was TA_conv=9 min 14 s using conventional MRI i.e. without acceleration (neither pMRI nor partial Fourier). The use of a ⅝ partial Fourier scheme enabled to decrease the scanning time to 7 min 46 s. The parallel MRI data were collected without partial Fourier using an acceleration factor R=2 or R=4. The respective scanning times for these exams were 5 min 03 s and 2 min 59 s and not TA_conv/R as expected. The reason for this lies in the Siemens k-space sampling strategy. The manufacturer adopts a full sampling scheme for the 24 central lines inducing an actual acceleration factor lower than the prescribed one (1.83 instead of 2 and 3.09 instead of 4).

Figure 11:
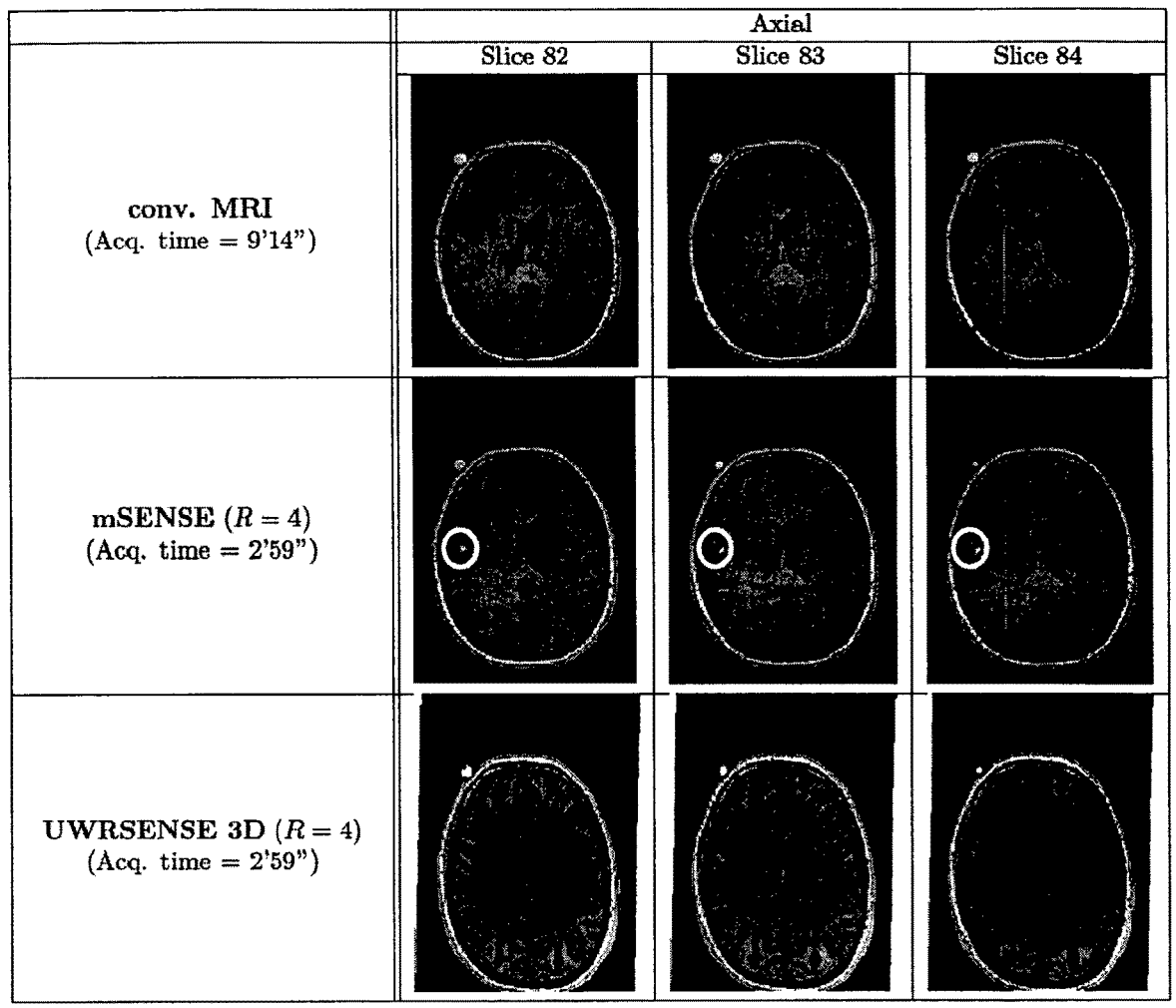
FIG. 11, three anatomical axial slices of the same human brain obtained using: conventional non-parellel MRI (top row), mSENSE parallel MRI reconstruction with R=4 (middle row) and an autocalibrated 3D wavelet transform-based regularization scheme (3D-UWR-SENSE) according to another embodiment of the invention (bottom row)

FIG. 11-12 illustrate different MRI reconstruction algorithms from single subject T1-weighted MRI data acquired at 3 Tesla (Siemens Tim Trio) using a matrix array 32-channel head coil. FIGS. 11 and 12 show axial and coronal views, respectively for the same subject. Top row in these figures shows the ground truth i.e. the reconstruction performed from full k-space acquisition. Then, the mSENSE (middle row) and 3D-UWR-SENSE (bottom row) algorithms are compared in a noisy context ie for R=4. For the latter algorithm the results have been obtained for J=2 resolution levels and Daubechies wavelets (non-redundant). Also, the hyperparameters of the wavelet representation have been estimated using a complete-data maximum likelihood procedure, as detailed above in the manuscript. MSENSE reconstruction artefacts appearing as white matter spots on the grey matter's boundaries are indicated by white circles in both views outlines. Clearly, the 3D-UWR-SENSE algorithm outperforms the mSENSE technique since these artefacts do not appear at the same location. Also, the elliptical-shaped artefacts in the centre of the axial view are strongly filtered by the inventive wavelet-based algorithm. Coronal views confirm the substantial noise reduction in the brain stem and subcortical regions using the proposed invention.

The results obtained using 2D wavelet bases are not shown here, as they are qualitatively close to the ones reported in FIGS. 11 and 12. However, the 3D wavelet-based reconstruction quantitatively outperforms the 2D-wavelet-based reconstruction in terms of Signal to Noise Ratio (SNR). Note that the 3D reconstruction generated a SNR improvement of 1.3 dB with respect to 2D technique.

Until here, only results regarding the case of static, anatomical imaging have been discussed. However, as discussed above, the present invention also applies to the space-time regularization of 4D fMRI image series, obtained e.g. by echoplanar imaging (EPI). The corresponding results are illustrated by FIGS. 14-20.

For validation purpose, fMRI data were acquired on a 3 T Siemens Trio magnet using a Gradient-Echo EPI (GE-EPI) sequence (TE=30 ms, TR=2400 ms, slice thickness=3 mm, transversal orientation, FOV=192 mm$^2$) during a cognitive localizer [Pinel et al, 2007] protocol. This experiment has been designed to map auditory, visual and motor brain functions as well as higher cognitive tasks such as number processing and language comprehension (listening and reading). It consisted of a single session of $N_r$=128 scans. The paradigm was a fast event-related design comprising sixty auditory, visual and motor stimuli, defined in ten experimental conditions (auditory and visual sentences, auditory and visual calculations, left/right auditory and visual clicks, horizontal and vertical checkerboards). An L=32 channel coil was used to enable parallel imaging.

For each of 15 subjects, fMRI data were collected at the 2×2 mm$^2$ spatial in-plane resolution using different reduction factors (R=2 or R=4). Based on the raw data files delivered by the scanner, reduced FOV EPI images were reconstructed using two specific treatments:

i) k-space regridding to account for the non-uniform k-space sampling during readout gradient ramp, which occurs in fast MRI sequences like GE-EPI;

ii) Nyquist ghosting correction to remove the odd-even echo inconsistencies during k-space acquisition of EPI images.

Then, the 4D-UWR-SENSE and the already discussed 3D-UWR-SENSE (simply called "UWR-SENSE" for short) algorithms have been utilized in a final step to reconstruct the full FOV EPI images and compared to the mSENSE solution (mSENSE is the unregularized SENSE algorithm implemented by Siemens scanners).

Figure 14:
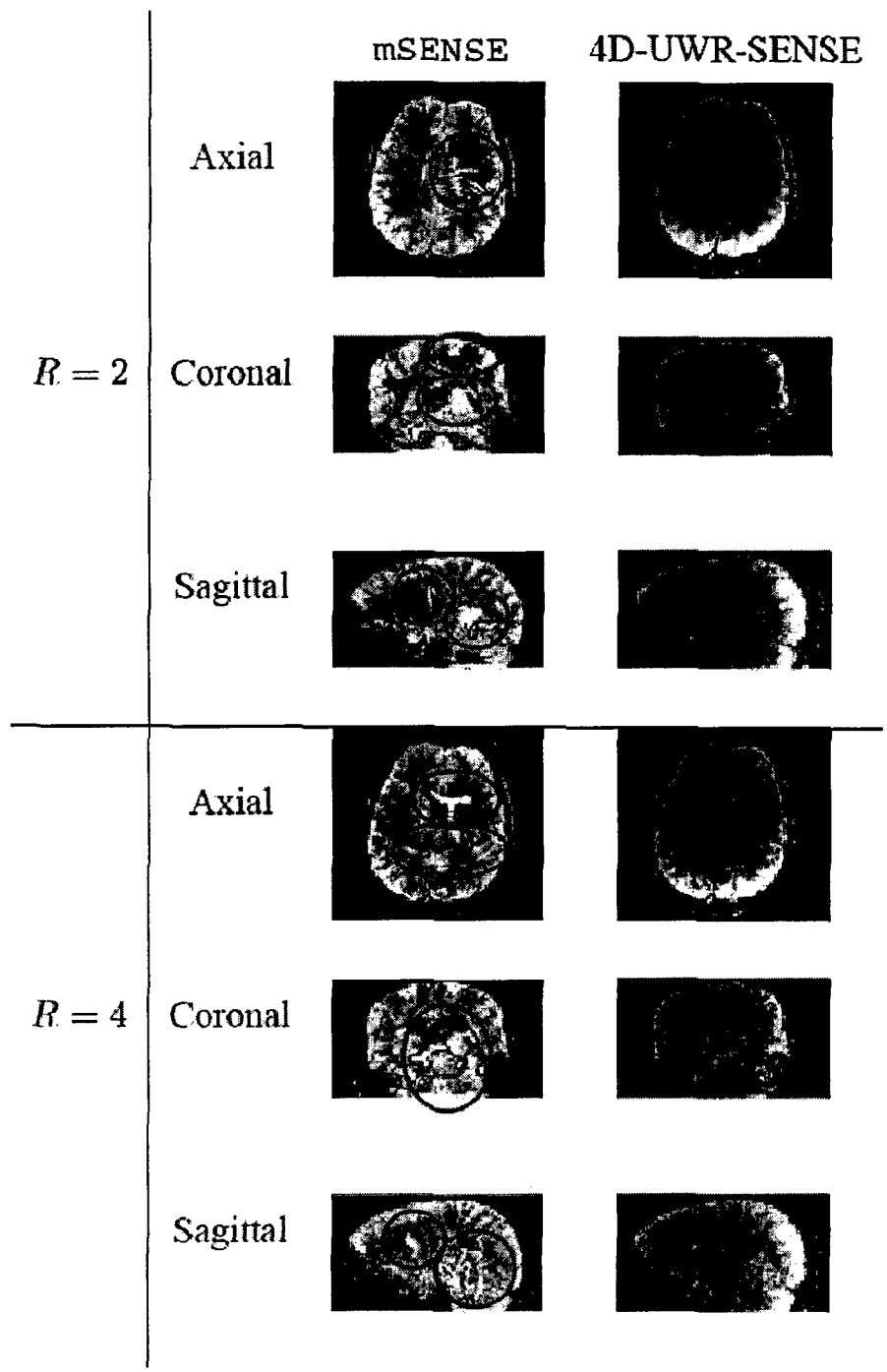
FIG. 14, Axial, Coronal and Sagittal slices of a human brain, acquired using Ecoplanar (EPI) fMRI and reconstructed using the mSENSE method, known from prior art, and an autocalibrated 2D wavelet transform-based regularization scheme (4D-UWR-SENSE) according to an embodiment of the invention.

FIG. 14 compares the two pMRI reconstruction algorithms to illustrate on axial, coronal and sagittal slices how the mSENSE reconstruction artifacts have been removed using the 4D-UWR-SENSE approach. The mSENSE reconstructed images actually present large artifacts located both at the center and boundaries of the brain in sensory and cognitive regions (temporal lobes, frontal and motor cortices); on the figure, the artifacts are outlined by ellipses. This results in SNR loss and thus may have a dramatic impact for activation detection in these brain regions.

Irrespective of the reconstruction pipeline, the full FOV fMRI images were then preprocessed using the SPM5 software (http://www.fil.ion.ucl.ac.uk/spm/software/spm5/): preprocessing involved realignment, correction for motion and differences in slice acquisition time, spatial normalization, and smoothing with an isotropic Gaussian kernel of 4 mm full-width at half-maximum. Anatomical normalization to MNI space was performed by coregistration of the functional images with the anatomical T1 scan acquired with the thirty two channel-head coil. Parameters for the normalization to MNI space were estimated by normalizing this scan to the T1 MNI template provided by SPM5, and were subsequently applied to all functional images.

For performing subject-level analysis, a General Linear Model (GLM) was constructed to capture stimulus-related BOLD response. The design matrix relied on ten experimental conditions and thus made up of twenty-one regressors corresponding to stick functions convolved with the canonical Hemodynamic Response Function (HRF) and its first temporal derivative, the last regressor modeling the baseline. This GLM was then fitted to the same acquired images and reconstructed using the Siemens reconstructor, UWR-SENSE and 4D-UWR-SENSE.

Contrast estimate images for motor responses and higher cognitive functions (computation, language) were subjected to further analyses at the subject and group levels. These two contrasts are complementary since the expected activations lie in different brain regions and thus can be differentially corrupted by reconstruction artifacts.

More precisely, were studied:
the Auditory computation vs. Auditory sentence (aC-aS) contrast which is supposed to elicit evoked activity in the frontal and parietal lobes, since solving mental arithmetic task involves working memory and more specifically the intra-parietal sulcus;
the Left click vs. Right click (Lc-Rc) contrast for which we expect evoked activity in the right motor cortex (precentral gyrus, middle frontal gyrus). Indeed, the Lc-Rc contrast defines a compound comparison which involves two motor stimuli which are presented either in the visual or auditory modality. This comparison aims therefore at detecting lateralization effect in the motor cortex.

These two contrasts were chosen because they summarized well different situations (large vs small activation clusters, distributed vs focal activation pattern, bilateral vs unilateral activity) that occurred for this paradigm when looking at sensory areas (visual, auditory, motor) or regions involved in higher cognitive functions (reading, calculation).

Figure 15:
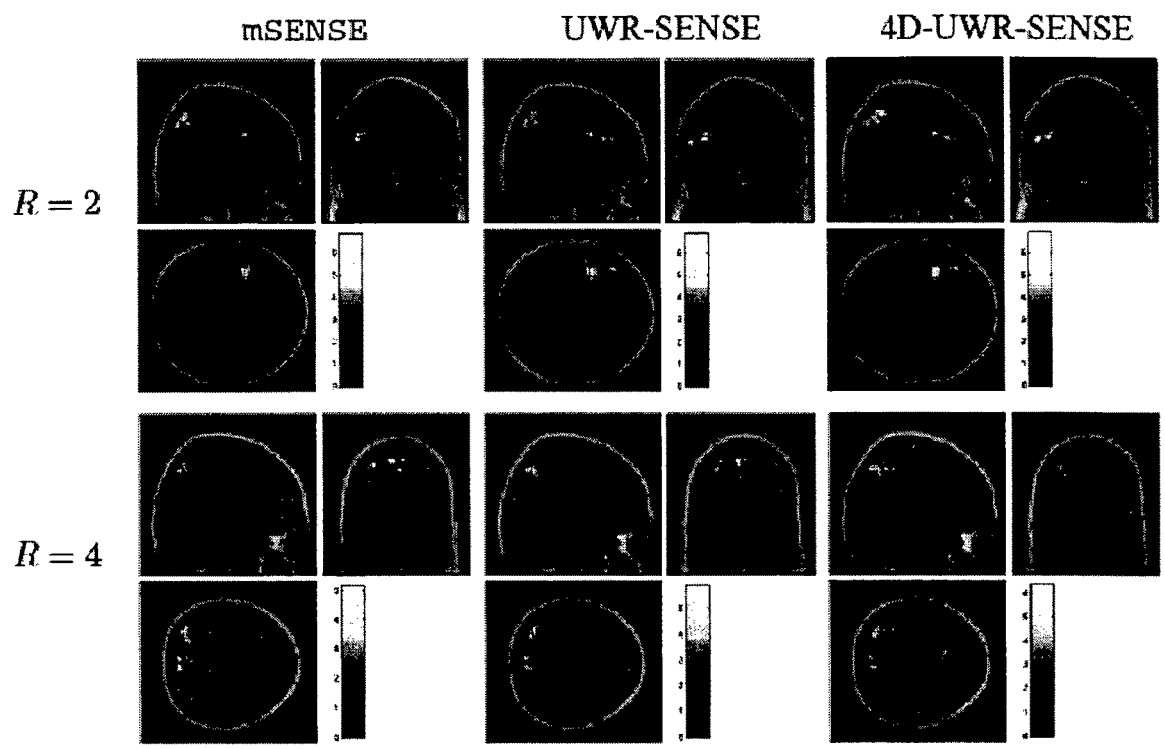
FIG. 15, subject-level student-t maps, superimposed to anatomical imaging, of the aC-aS contrast detected using EPI fMRI; data have been reconstructed using the mSENSE, UWR-SENSE and 4D-UWR-SENSE methods, respectively, with R=2 (top of the figure) and R=4 (bottom of the figure); sagittal, coronal and axial views are displayed.

FIG. 15 shows subject-level student-t maps superimposed to anatomical MRI for the aC-aS contrast. Data have been reconstructed using the mSENSE, UWR-SENSE and 4D-UWR-SENSE, respectively, with R=2 (top of the figure) and R=4 (bottom of the figure). The neurological convention (left is left) is adopted. The cross shows the maximum activation peak.

For the most significant slice and R=2, all pMRI reconstruction algorithms succeed in finding evoked activity in the left parietal and frontal cortices, more precisely in the inferior parietal lobule and middle frontal gyrus. However, for R=4 only UWR-SENSE and 4D-UWR-SENSE—and preferentially the latter—enable to retrieve reliable frontal activity elicited by mental calculation, which is lost by the mSENSE algorithm. From a quantitative viewpoint, the proposed 4D-UWR-SENSE algorithm finds larger clusters whose local maxima are more significant than the ones obtained using mSENSE and UWR-SENSE, as reported in Table 3. Concerning the most significant cluster for R=2, the peak positions remain stable whatever the reconstruction algorithm. However, examining their significance level, one can first measure the benefits of wavelet-based regularization when comparing UWR-SENSE with mSENSE results and then additional positive effects of temporal regularization and 3D wavelet decomposition when looking at the 4D-UWR-SENSE results. These benefits are also demonstrated for R=4. Table 3 shows the significant statistical results at the subject-level for the aC-aS contrast (corrected for multiple comparisons at the significance level of $\alpha$=0.05, which means that the null hypothesis is rejected if the p-value is smaller or equal to $\alpha$).

The 'p-value' of the statistical significance test should not be confused with the "shape parameter" used in temporal regularization, see equations 21 and 22, or with the parameter "p" used to illustrate the MCMC algorithm.

TABLE 3

| | | cluster-level | | voxel-level | | |
|---|---|---|---|---|---|---|
| | | p-value | Size | p-value | T-score | Position |
| R = 2 | mSENSE | <10$^{-3}$ | 320 | <10$^{-3}$ | 6.40 | −32 −76 45 |
| | | <10$^{-3}$ | 163 | <10$^{-3}$ | 5.96 | −4 −70 54 |
| | | <10$^{-3}$ | 121 | <10$^{-3}$ | 6.34 | 34 −74 39 |
| | | <10$^{-3}$ | 94 | <10$^{-3}$ | 6.83 | −38 4 24 |
| | UWR-SENSE | <10$^{-3}$ | 407 | <10$^{-3}$ | 6.59 | −32 −76 45 |
| | | <10$^{-3}$ | 164 | <10$^{-3}$ | 5.69 | −6 −70 54 |
| | | <10$^{-3}$ | 159 | <10$^{-3}$ | 5.84 | 32 −70 39 |
| | | <10$^{-3}$ | 155 | <10$^{-3}$ | 6.87 | −44 4 24 |
| | 4D-UWR-SENSE | <10$^{-3}$ | 454 | <10$^{-3}$ | 6.54 | −32 −76 45 |
| | | <10$^{-3}$ | 199 | <10$^{-3}$ | 5.43 | −6 26 21 |
| | | <10$^{-3}$ | 183 | <10$^{-3}$ | 5.89 | 32 −70 39 |
| | | <10$^{-3}$ | 170 | <10$^{-3}$ | 6.90 | −44 4 24 |
| R = 4 | mSENSE | <10$^{-3}$ | 58 | 0.028 | 5.16 | −30 −72 48 |
| | 4D-UWR-SENSE | <10$^{-3}$ | 94 | 0.003 | 5.91 | −32 −70 48 |
| | | <10$^{-3}$ | 60 | 0.044 | 4.42 | −6 −72 54 |
| | 4D-UWR-SENSE | <10$^{-3}$ | 152 | <10$^{-3}$ | 6.36 | −32 −70 48 |
| | | <10$^{-3}$ | 36 | 0.009 | 5.01 | −4 −78 48 |
| | | <10$^{-3}$ | 29 | 0.004 | 5.30 | −34 6 27 |

Figure 16:
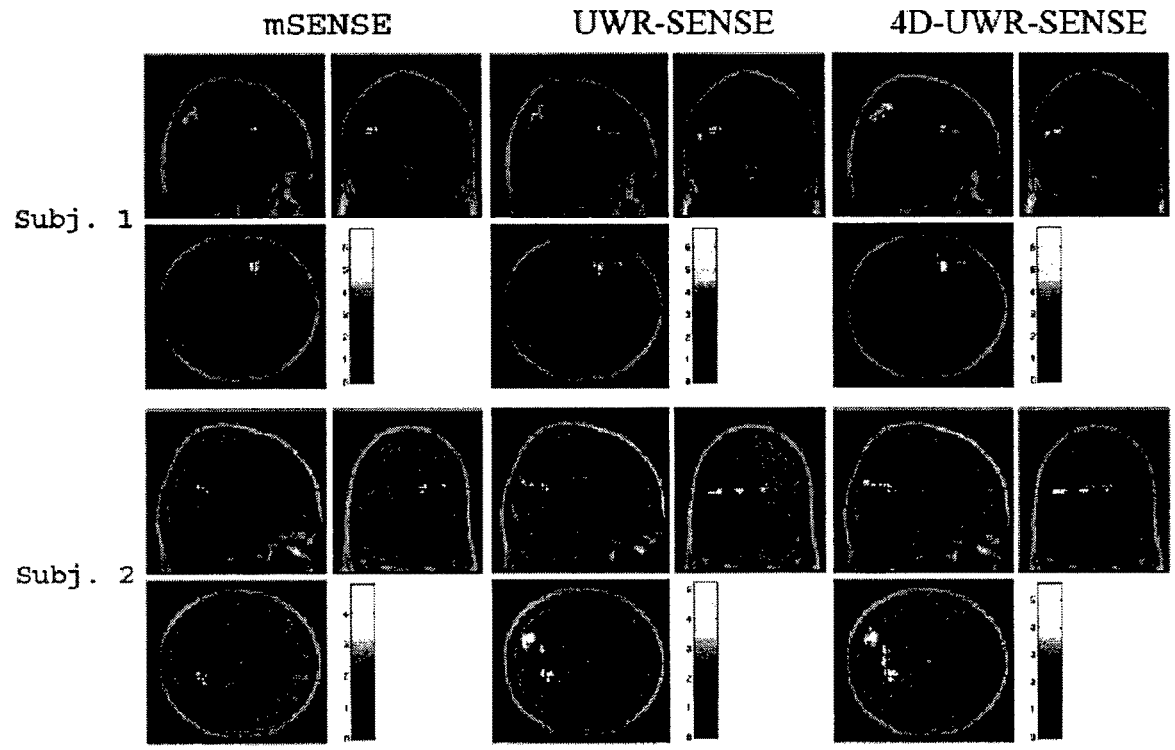
FIG. 16, subject-level student-t maps of the aC-aS contrast for two subjects, reconstructed at R=2 using the mSENSE, UWR-SENSE and 4D-UWR-SENSE methods, respectively; sagittal, coronal and axial views are displayed.

FIG. 16 illustrates between-subject variability of detected activation for the aC-aS contrast at R=2. Indeed, when comparing subject-level student-t maps reconstructed using the different pipelines (R=2), it can be observed that the mSENSE algorithm fails to detect any activation cluster in the expected regions for the second subject. In contrast, the 4D-UWR-SENSE method retrieves more coherent activity while not exactly at the same position as for the first subject.

Figure 17:
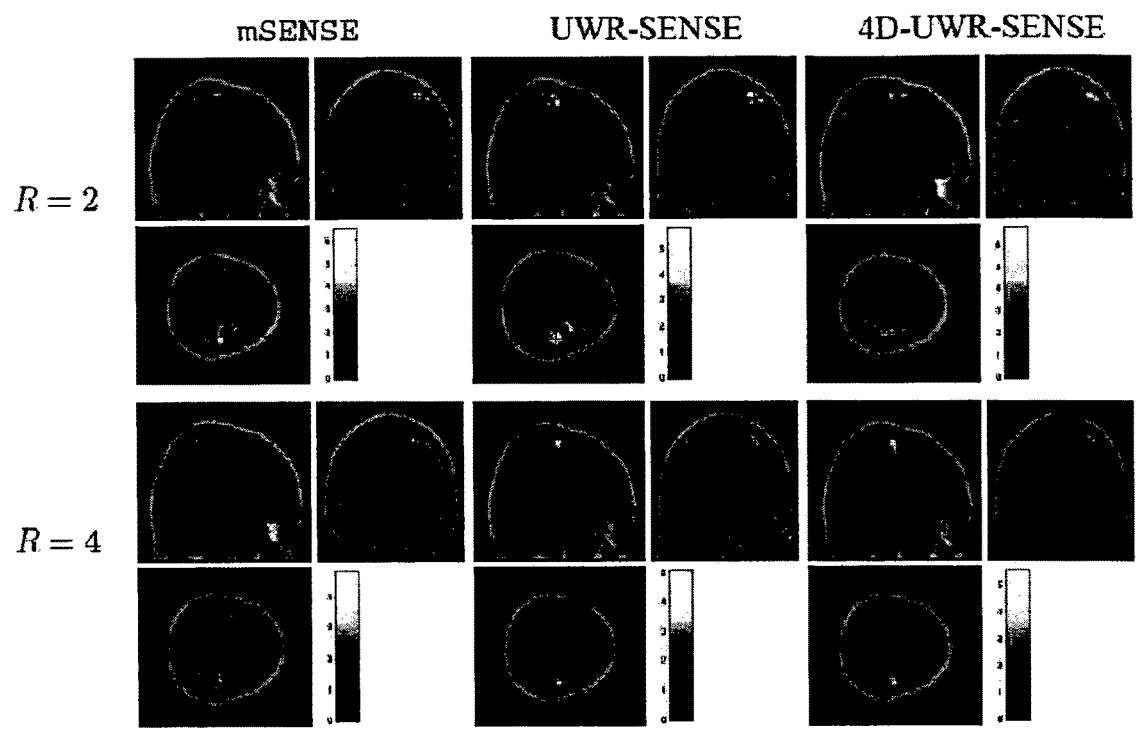
FIG. 17, subject-level student-t maps, superimposed to anatomical imaging, of the Lc-Rc contrast detected using EPI fMRI; data have been reconstructed using the mSENSE, UWR-SENSE and 4D-UWR-SENSE methods, respectively, with R=2 (top of the figure) and R=4 (bottom of the figure); sagittal, coronal and axial views are displayed.

FIG. 17 shows subject-level student-t maps superimposed to anatomical MRI for the Lc-Rc contrast. Data have been reconstructed using the mSENSE, UWR-SENSE and 4D-UWR-SENSE, respectively.

It can be seen that all reconstruction methods enable to retrieve expected activation in the right precentral gyrus. However, when looking more carefully at the statistical results (see Table 4), the UWR-SENSE and more preferentially the 4D-UWR-SENSE algorithms retrieve an additional cluster in the right middle frontal gyrus. On data acquired with R=4, the same Lc-Rc contrast elicits similar activations, i.e. in the same region. As it can be seen on the bottom of the figure, this activity is enhanced when pMRI reconstruction is performed according with the methods of the invention.

Quantitative results in Table 4 confirm numerically what can be observed in the figure: larger clusters with higher local t-scores are detected using the 4D-UWR-SENSE algorithm, both for R=2 and R=4. More precisely, table 4 shows significant statistical results at the subject-level for the Lc-Rc contrast (corrected for multiple comparisons at the significance level of $\alpha$=0.05, which means that the null hypothesis is rejected if the p-value is smaller or equal to $\alpha$).

TABLE 4

| | | cluster-level | | voxel-level | | |
|---|---|---|---|---|---|---|
| | | p-value | Size | p-value | T-score | Position |
| R = 2 | mSENSE | <10$^{-3}$ | 79 | <10$^{-3}$ | 6.49 | 38 −26 66 |
| | UWR-SENSE | <10$^{-3}$ | 144 | 0.004 | 5.82 | 40 −22 63 |
| | | 0.03 | 21 | 0.064 | 4.19 | 24 −8 63 |
| | 4D-UWR-SENSE | <10$^{-3}$ | 172 | 0.001 | 6.78 | 34 −24 69 |
| | | <10$^{-3}$ | 79 | 0.001 | 6.49 | 38 −26 66 |
| R = 4 | mSENSE | 0.006 | 21 | 0.295 | 4.82 | 34 −28 63 |
| | UWR-SENSE | <10$^{-3}$ | 33 | 0.120 | 5.06 | 40 −24 66 |
| | 4D-UWR-SENSE | <10$^{-3}$ | 51 | 0.006 | 5.57 | 40 −24 66 |

Figure 18:
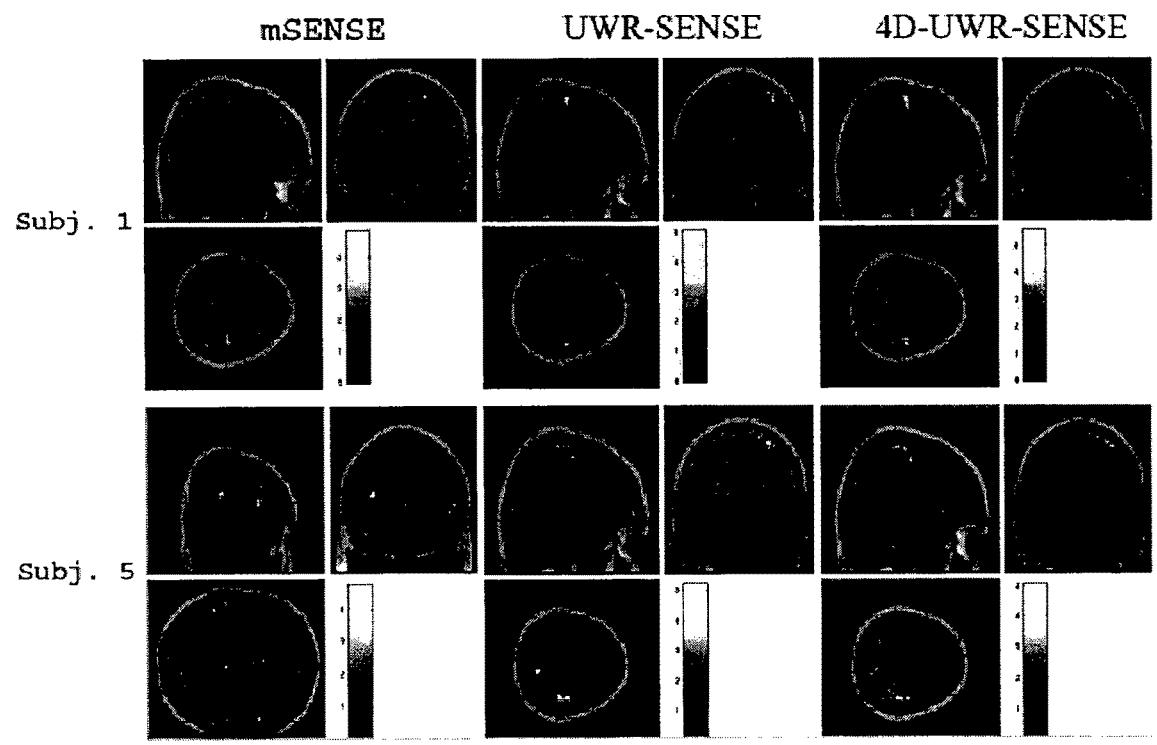
FIG. 18, subject-level student-t maps of the Lc-Rc contrast for two subjects, reconstructed at R=4 using the mSENSE, UWR-SENSE and 4D-UWR-SENSE methods, respectively; sagittal, coronal and axial views are displayed.

FIG. 18 reports on the robustness of the proposed pMRI pipeline to the between-subject variability for this motor contrast. Since sensory functions are expected to generate larger BOLD effects (higher SNR) and appears more stable, our comparison takes place at R=4. Two subject-level student-t maps reconstructed using the different pMRI algorithms are compared. For the second subject, one can observe that the mSENSE algorithm fails to detect any activation cluster in the right motor cortex. In contrast, the 4D-UWR-SENSE method retrieves more coherent activity for this second subject in the expected region.

To summarize, on these two contrasts the 4D-UWR-SENSE algorithm always outperforms the alternative reconstruction methods in terms of statistical significance (number of clusters, cluster extent, peak values, . . . ) but also in terms of robustness.

Due to between-subject anatomical and functional variability, group-level analysis is necessary in order to derive robust and reproducible conclusions at the population level. For this validation, random effect analyses (RFX) involving fifteen healthy subjects have been conducted on the contrast maps we previously investigated at the subject level. More precisely, one-sample Student-t test was performed on the subject-level contrast images (e.g., Lc-Rc, aC-aS, images) using SPM5.

Figure 19:
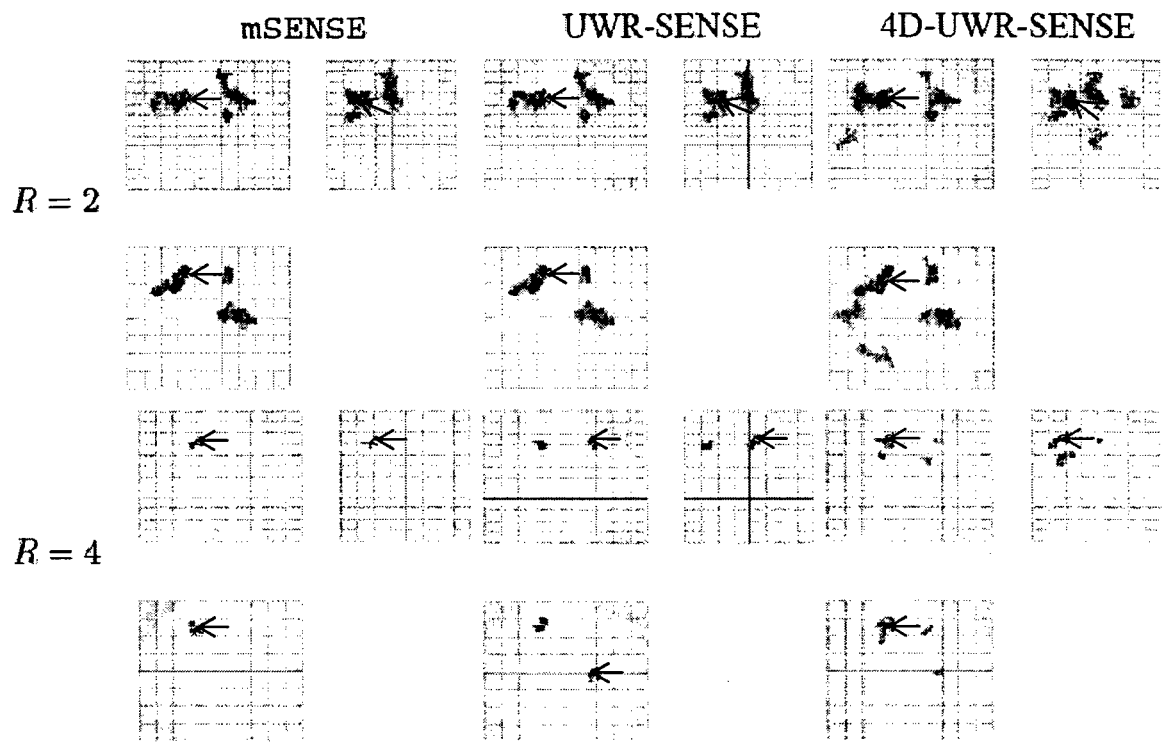
FIG. 19, group-level student-t maps for the aC-aS contrast, where data have been reconstructed using the mSENSE, UWRSENSE and 4D-UWR-SENSE for R=2 and R=4; sagittal, coronal and axial views are displayed.

FIG. 19 shows group-level student-t maps for the aC-aS contrast where data have been reconstructed using the mSENSE, UWRSENSE and 4D-UWR-SENSE for R=2 and R=4. Neurological convention has been used. Arrows indicate the global maximum activation peak.

These maps illustrate that irrespective of the reconstruction method larger and more significant activations are found on datasets acquired with R=2 given the better SNR. Second, for R=2, visual inspection confirms that only the 4D-UWR-SENSE algorithm allows to retrieve significant bilateral activations in the parietal cortices (see axial MIP slices) in addition to larger cluster extent and a gain in significance level for the stable clusters across the different reconstructors. Similar conclusions can be drawn when looking at the bottom of the figure, for R=4. Complementary results are available in Table 5 for R=2 and R=4 and numerically confirms this visual comparison:

Whatever the reconstruction method in use, the statistical performance is much more significant using R=2, especially at the cluster level since the cluster extent decreases by one order of magnitude.

Voxel and cluster-level results are enhanced using the 4D-UWR-SENSE approach instead of the mSENSE or UWR-SENSE.

TABLE 5

Significant statistical results at the group-level for the aC-aS contrast (corrected for multiple comparisons at p = 0.05).

| | | cluster-level | | voxel-level | | |
|---|---|---|---|---|---|---|
| | | p-value | Size | p-value | T-score | Position |
| R - 2 | mSENSE | <10$^{-3}$ | 361 | 0.014 | 7.68 | -6 -22 45 |
| | | <10$^{-3}$ | 331 | 0.014 | 8.23 | -40 -38 42 |
| | | <10$^{-3}$ | 70 | 0.014 | 7.84 | -44 6 27 |
| | UWR-SENSE | <10$^{-3}$ | 361 | 0.014 | 7.68 | -6 22 45 |
| | | <10$^{-3}$ | 331 | 0.014 | 7.68 | -44 -38 42 |
| | | <10$^{-3}$ | 70 | 0.014 | 7.84 | -44 6 27 |
| | 4D-UWR-SENSE | <10$^{-3}$ | 441 | <10$^{-3}$ | 9.45 | -32 -50 45 |
| | | <10$^{-3}$ | 338 | <10$^{-3}$ | 9.37 | -6 12 45 |
| | | <10$^{-3}$ | 152 | 0.010 | 7.19 | 30 -64 48 |
| R - 4 | mSENSE | 0.003 | 14 | 0.737 | 5.13 | -38 -42 51 |
| | UWR-SENSE | <10$^{-3}$ | 41 | 0.274 | 5.78 | -50 -38 -48 |
| | | <10$^{-3}$ | 32 | 0.274 | 5.91 | 2 12 54 |
| | 4D-UWR-SENSE | <10$^{-3}$ | 37 | 0.268 | 6.46 | -40 -40 54 |
| | | <10$^{-3}$ | 25 | 0.268 | 6.37 | -38 -42 36 |
| | | <10$^{-3}$ | 18 | 0.273 | 5 | -42 8 36 |

Figure 20:
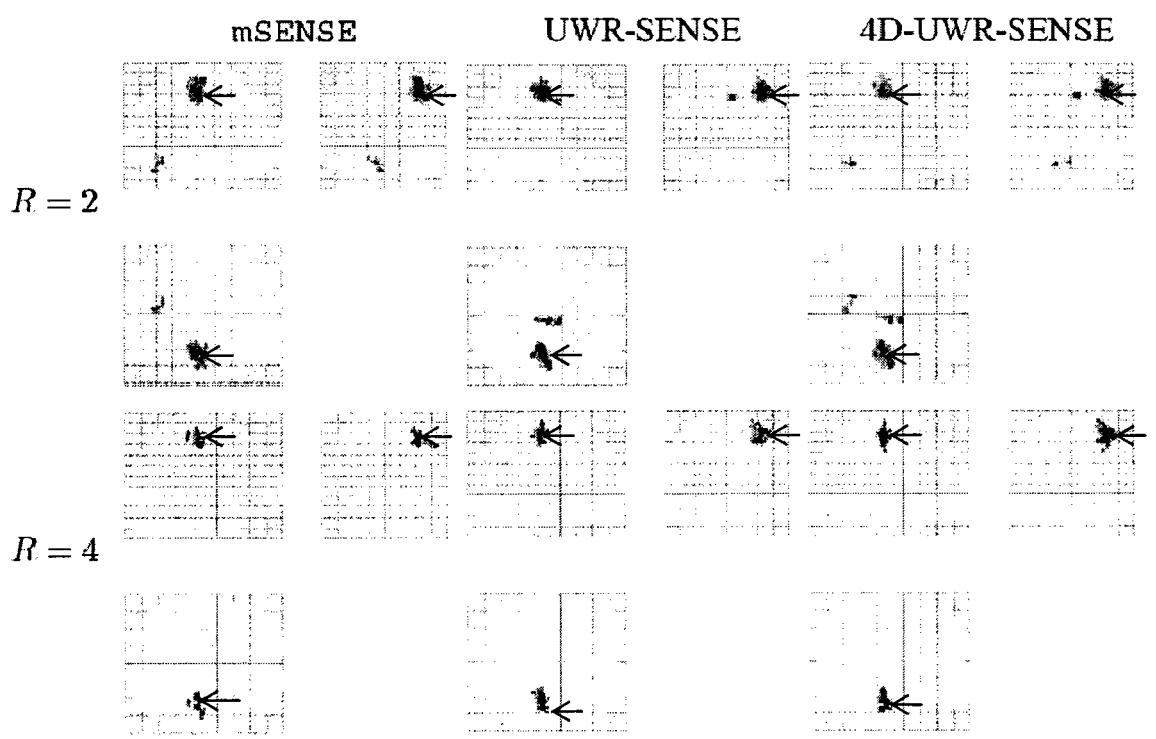
FIG. 20, group-level student-t maps for the Lc-Rc contrast, where data have been reconstructed using the mSENSE, UWRSENSE and 4D-UWR-SENSE for R=2 and R=4; sagittal, coronal and axial views are displayed.

FIG. 20 reports similar group-level MIP results for R=2 and R=4 concerning the Lc-Rc contrast. It is shown that whatever the acceleration factor R in use, our pipeline enables to detect a much more spatially extended activation area in the motor cortex. This visual inspection is quantitatively confirmed in Table 6 when comparing the detected clusters using the 4D-UWR-SENSE approach with those found by mSENSE, again irrespective of R. Finally, the 4D-UWR-SENSE algorithm outperforms the UWR-SENSE one, which corroborates the benefits of the proposed spatio-temporal regularization scheme.

TABLE 6

Significant statistical results at the group-level for the Lc-Rc contrast (corrected for multiple comparisons at p = 0.05).

| | | cluster-level | | voxel-level | | |
|---|---|---|---|---|---|---|
| | | p-value | Size | p-value | T-score | Position |
| R = 2 | mSENSE | <10$^{-3}$ | 354 | <10$^{-3}$ | 9.48 | 38 -22 54 |
| | | 0.001 | 44 | 0.665 | 6.09 | -4 -68 -24 |
| | UWR-SENSE | <10$^{-3}$ | 350 | 0.005 | 9.83 | 36 -22 57 |
| | | <10$^{-3}$ | 35 | 0.286 | 7.02 | 4 -12 51 |
| | 4D-UWR-SENSE | <10$^{-3}$ | 377 | 0.001 | 11.34 | 36 -22 57 |
| | | <10$^{-3}$ | 53 | <10$^{-3}$ | 7.50 | 8 -14 51 |
| | | <10$^{-3}$ | 47 | <10$^{-3}$ | 7.24 | -18 -54 -18 |
| R = 4 | mSENSE | <10$^{-3}$ | 38 | 0.990 | 5.97 | 32 -20 45 |
| | UWR-SENSE | <10$^{-3}$ | 163 | 0.128 | 7.51 | 46 -18 60 |
| | 4D-UWR-SENSE | <10$^{-3}$ | 180 | 0.111 | 7.61 | 46 -18 60 |

REFERENCES

[Bertsekas, 1995] Bertsekas, D. P. (1995). Nonlinear programming, Second Edition. Athena Scientific, Belmont, USA. In particular, pages 159-165.

[Block et al., 2007] Block, K. T., Uecker, M., and Frahm, J. (2007). Undersampled radial MRI with multiple coils. Iterative image reconstruction using a total variation constraint. Magnetic Resonance in Medicine, 56(7):1086-1098.

[Chaâri et al.2008]: L. Chaâri, J.-C. Pesquet, A. Benazza-Benyahia, P. Ciuciu, Autocalibrated Parallel MRI Reconstruction in the Wavelet Domain, in: IEEE International Symposium on Biomedical Imaging, Paris, France, 2008, pp. 756-759.

[Chaâri et al. 2009]: L. Chaâri, J.-C. Pesquet, Ph. Ciuciu, and A. Benazza-Benyahia An Iterative Method for Parallel MRI SENSE-based Reconstruction in the Wavelet Domain., arXiv:0909.0368v1 [math.OC]

[Chaux et al., 2007]: Chaux, C., Combettes, P., Pesquet, J.-C., and Wajs, V. (2007). A variational formulation for frame-based inverse problems. Inverse Problems, 23(4): 1495-1518.

[Combettes and Pesquet, 2008]: Combettes, P. L. and Pesquet, J.-C. (2008). A proximal decomposition method for solving convex variational inverse problems. Inverse Problems, 24(6):27.

[Daubechies et al., 2004]: I. Daubechies, M. Defrise, C. DeMol, An iterative thresholding algorithm for linear inverse problems with a sparsity constraint, Communications on Pure and Applied Mathematics 57 (11) (2004) 1413-1457.

[Dempster, 1997]: Dempster, A., Laird, A., and Rubin, D. (1977). Maximum likelihood from incomplete data via the EM algorithm (with discussion). Journal of the Royal Statistical Society, Series B, 39:1-38.

[Dobigeon et al, 2007]: Dobigeon, N. and Tourneret, J.-Y. (2007). Truncated multivariate Gaussian distribution on a simplex. Technical report, University of Toulouse.

[Donoho, 1995]: D. Donoho. De-noising by soft-thresholding. IEEE Transactions on Information Theory, 41(3): 613-627, 1995.

[Geman, 1984]: S. Geman and D. Geman, "Stochastic relaxation, Gibbs distribution and the Bayesian restoration of image," IEEE Trans. Pattern Anal. Mach. Intell., vol. 6, pp. 721-741, 1984.

[Griswold et al., 2002]: M. A. Griswold, P. M. Jakob, R. M. Heidemann, M. Nittka, V. Jellus, J. Wang, B. Kiefer, A.

Haase, Generalized autocalibrating partially parallel acquisitions GRAPPA, Magnetic Resonance in Medicine 47 (6) (2002) 1202-1210.

[Gupta et al., 1997]: Gupta, A. K. and Song, D. (1997). Journal of Statistical Planning and Inference. Volume 60, Pages 241-260.

[Hoge et al., 2005]: W. S. Hoge, D. H. Brooks, B. Madore, W. E. Kyriakos, A tour of accelerated parallel MR imaging from a linear systems perspective, Concepts in Magnetic Resonance 27A (1) (2005) 17-37.

[Pesquet-Popescu, Pesquet] Ondelettes et applications, Techniques de l'Ingénieur, traité Télécoms, TE 5 215

[Pinel et al., 2007]: P. Pinel, B. Thirion, S. Meriaux, A. Jobert, J. Serres, D. Le Bihan, J.-B. Poline, and S. Dehaene, "Fast reproducible identification and large-scale databasing of individual functional cognitive networks" BMC Neurosci., vol. 8, no. 1, pp. 91, October 2007.

[Pruessmann et al., 1999]: K. P. Pruessmann, M. Weiger, M. B. Scheidegger, P. Boesiger, SENSE: sensitivity encoding for fast MRI, Magnetic Resonance in Medicine 42 (5) (1999) 952-962.

[Raj et al., 2007]: Raj, A., Singh, G., Zabih, R., Kressler, B., Wang, Y., Schuff, N., and Weiner, M. (2007). Bayesian parallel imaging with edge-preserving priors. Magnetic Resonance in Medicine, 57(1):8-21.

[Robert, 1995]: "Simulation of truncated normal variables," *Statistics and Computing*, vol. 5, pp. 121-125,1995.

[Serra, 1982] Serra, J. (1982). Image Analysis and Mathematical Morphology. Academic Press, London.

[Sodickson et al., 1997]: Sodickson, D. K. and Manning, W. J. (1997). Simultaneous acquisition of spatial harmonics (SMASH): fast imaging with radiofrequency coil arrays. Magnetic Resonance in Medicine, 38(4):591-603.

[Ying et al., 2004]: L. Ying, D. Xu, Z.-P. Liang, On Tikhonov Regularization for image reconstruction in parallel MRI, in: IEEE Engineering in Medicine and Biology Society, San Francisco, USA, 2004, pp. 1056-1059.

The invention claimed is:

1. A method of performing parallel magnetic resonance imaging of a body in a magnetic resonance imaging system, comprising:
    acquiring a set of elementary magnetic resonance images of said body from respective radio frequency (RF) receiving antennas having known or estimated sensitivity maps and noise covariance matrices, said acquired elementary magnetic resonance images being under-sampled in k-space; and
    performing with a processor a regularized reconstruction on each acquired magnetic resonance image of said body;
    where said step of performing regularized reconstruction on a magnetic resonance image of said body is carried out in a discrete frame space by minimizing a cost function, with the cost function comprising:
    an error term, that represents a statistical likelihood of a reconstructed image, obtained from said acquired elementary magnetic resonance images; and
    a frame penalty term, representative of a deviation between an actual statistical distribution of frame coefficients of said reconstructed image of said body and an a priori distribution of said frame coefficients;
    said a priori distributions of the frame coefficients of the reconstructed image of said body being estimated on the basis of an auxiliary magnetic resonance image of said body; and
    wherein said auxiliary magnetic resonance image of said body is reconstructed by said processor from said acquired elementary magnetic resonance images, using an algorithm chosen between:
        a constrained autocalibrated 2D wavelet transform-based regularization scheme;
        an unconstrained autocalibrated 2D wavelet transform-based regularization scheme;
        an unconstrained autocalibrated 3D wavelet transform-based regularization scheme; and
        an unconstrained autocalibrated 4D wavelet transform-based regularization scheme.

2. A method according to claim 1, wherein said error term is representative of a statistical neg-log-likelihood of said reconstructed image of said body.

3. A method according to claim 1, wherein said step of performing regularized reconstruction of a magnetic resonance image of said body is carried out by maximizing, in said frame space, a full posterior distribution of a set of frame coefficients that are utilized in defining an image of the body, from said acquired elementary magnetic resonance images and said a priori distribution of the frame coefficients.

4. A method according to claim 1, wherein said auxiliary magnetic resonance image of said body is reconstructed from said acquired elementary magnetic resonance images by using a SENSitivity Encoding-SENSE-algorithm.

5. A method according to claim 4 wherein said auxiliary magnetic resonance image of said body is reconstructed from said acquired elementary magnetic resonance images by using an algorithm chosen between:
    an unregularized SENSE algorithm;
    a SENSE algorithm regularized in image space; and
    a SENSE algorithm regularized in k-space.

6. A method according to claim 1 wherein a generalized Gauss-Laplace a priori statistical distribution of said frame coefficients is assumed, and parameters of said Gauss-Laplace a priori statistical distribution are estimated on the basis of said auxiliary magnetic resonance image of said body, by using either a statistical maximum-likelihood or a posterior mean estimator.

7. A method according to claim 1, wherein said error term that represents a statistical likelihood of a reconstructed image, is a quadratic mean error term.

8. A method according to claim 1, wherein said acquired elementary magnetic resonance images of the body are three-dimensional images, and wherein said step of performing with a processor said regularized reconstruction of a magnetic resonance image is carried out in a discrete three-dimensional frame space.

9. A method according to claim 8, wherein said acquired three-dimensional elementary magnetic resonance images of the body are obtained by stacking bi-dimensional elementary magnetic resonance images of slices of the object to be imaged.

10. A method according to claim 1 wherein said step of performing with a processor, said regularized reconstruction of a magnetic resonance image is based on a redundant wavelet frame representation.

11. A method according to claim 1 wherein said step of performing regularized reconstruction of a magnetic resonance is based on a non-redundant wavelet regularization scheme.

12. A method according to claim 1 wherein said cost function also comprises at least one spatial domain penalty term chosen between:
  a total variation norm of the reconstructed image; and
  a convex constraint of the reconstructed image.

13. A method of performing dynamic parallel magnetic resonance imaging of a body, comprising:
  acquiring a set of time series of elementary magnetic resonance images of said body from respective radio frequency (RF) receiving antennas having known or estimated sensitivity maps and noise covariance matrices, said acquired elementary images being under-sampled in k-space; and performing regularized reconstruction of a time series of magnetic resonance images of said body;
  where said step of performing with a processor a regularized reconstruction on a time series of elementary magnetic resonance images of said body being carried out by minimizing a non-differentiable cost function, with said non-differentiable cost function comprising:
  an error term, that represents a statistical likelihood of each reconstructed image, given the acquired time series of corresponding acquired elementary magnetic resonance images of said body;
  an edge-preserving temporal penalty term, that is representative of a pixel-by-pixel or voxel-by-voxel difference between consecutive regularized reconstructed images occurring in the series, and
  wherein said time series of magnetic resonance image of said body is reconstructed by said processor from said acquired set of time series of elementary magnetic resonance images, using an algorithm chosen between:
  a constrained autocalibrated 2D wavelet transform-based regularization scheme;
  an unconstrained autocalibrated 2D wavelet transform-based regularization scheme;
  an unconstrained autocalibrated 3D wavelet transform-based regularization scheme; and
  an unconstrained autocalibrated 4D wavelet transform-based regularization scheme.

14. A method according to claim 13, wherein said temporal penalty term is a convex edge-preserving function.

15. A method according to claim 14, wherein said edge preserving temporal penalty term is a statistical Lp norm with p≥1 and preferably 1≤p≤1.5.

16. A method according to claim 13, wherein said edge preserving temporal penalty term is given by the sum of a first partial temporal penalty term and a second partial temporal penalty term in the non-differentiable cost function, wherein:
  the first partial temporal penalty term is representative of pixel-by-pixel or voxel-by-voxel differences between each even-numbered image of the series and a preceding odd-numbered image; and
  the second partial temporal penalty term is representative of pixel-by-pixel or voxel-by-voxel differences between each odd-numbered image of the series and a preceding even-numbered image;
  with said non-differentiable cost function being minimized by using proximity operators for said first and second partial temporal penalty terms that comprise the edge preserving temporal penalty terms of the non-differentiable cost function.

17. A method of performing dynamic parallel magnetic resonance imaging of a body according to claim 13, wherein said step of performing with said processor a regularized reconstruction of a magnetic resonance image of said body is carried out in a discrete frame space, and said cost function also comprises a frame penalty term, representative of a deviation between statistical distributions of frame coefficients obtained from each reconstructed image and said priori distributions of said coefficients; said a priori distributions of the frame coefficients of the reconstructed images being estimated from an auxiliary magnetic resonance image of said body.

18. A method according to claim 17, wherein said elementary magnetic resonance images of said body are three-dimensional images, and wherein said discrete frame space is a discrete three-dimensional frame space.

19. A method according to claim 13 further comprising a step of automatically determining a weighting parameter of said edge preserving temporal penalty term by using a statistical maximum-likelihood estimator.

20. A method according to claim 19 comprising estimating said weighting parameter of the edge preserving temporal penalty term for each pixel or voxel, or for each set of neighboring pixels or for each set of neighboring voxels, of the image to be reconstructed.

21. A method according to claim 19, wherein said edge preserving temporal penalty term is a statistical Lp norm and wherein said weighting parameter of the edge preserving temporal penalty term and the parameter p are jointly determined by using said maximum-likelihood estimator as the weighting parameter.

22. A method according to claim 21, wherein said weighting parameter of the edge preserving temporal penalty term and the parameter p are jointly determined by using said statistical maximum-likelihood estimator under the constraint p≥1.

23. A method according to claim 13 wherein said error term depends on geometrical parameters defining a rigid transformation of each of said acquired elementary magnetic resonance images of said body with respect to an additional elementary magnetic resonance image of said body taken as a reference, and wherein said step of performing with a processor a regularized reconstruction of a time series of elementary magnetic resonance images of said body is carried out by minimizing said non-differentiable cost function also with respect to said geometrical parameters.

24. A method according to claim 1, wherein said elementary images of said body are acquired by echo planar imaging.

25. A method according to claim 1, wherein said elementary images of said body are under-sampled with a reduction factor higher than or equal to 4.

26. A method according to claim 13, wherein said elementary images of said body are acquired by echo planar imaging.

27. A method according to claim 13, wherein said elementary images of said body are under-sampled with a reduction factor higher than or equal to 4.

* * * * *